United States Patent
Walker et al.

(10) Patent No.: US 12,476,560 B2
(45) Date of Patent: Nov. 18, 2025

(54) ELECTROADHESIVES SYSTEM ISOLATION IN APPAREL

(71) Applicant: NIKE, Inc., Beaverton, OR (US)

(72) Inventors: Steven H. Walker, Camas, WA (US); Daniel Stuart, Beaverton, OR (US); Eun Kyung Lee, Beaverton, OR (US); Christopher Andon, Portland, OR (US)

(73) Assignee: NIKE, Inc., Beaverton, OR (US)

( * ) Notice: Subject to any disclaimer, the term of this patent is extended or adjusted under 35 U.S.C. 154(b) by 591 days.

(21) Appl. No.: 17/536,599

(22) Filed: Nov. 29, 2021

(65) Prior Publication Data
US 2022/0209689 A1    Jun. 30, 2022

Related U.S. Application Data

(60) Provisional application No. 63/164,216, filed on Mar. 22, 2021, provisional application No. 63/132,265, filed on Dec. 30, 2020.

(51) Int. Cl.
*H05K 1/02* (2006.01)
*H02N 13/00* (2006.01)
*A41D 1/00* (2018.01)

(52) U.S. Cl.
CPC ............ *H02N 13/00* (2013.01); *A41D 1/005* (2013.01); *A41D 2400/38* (2013.01)

(58) Field of Classification Search
CPC .... H05K 1/0277; H05K 1/028; H05K 1/0281; H05K 1/0283; H05K 1/0296; H05K 1/03; A41D 1/00; A41D 1/002; A41D 1/005; H02N 12/00
See application file for complete search history.

(56) References Cited

U.S. PATENT DOCUMENTS

| | | |
|---|---|---|
| 5,315,473 A | 5/1994 | Collins et al. |
| 5,638,249 A | 6/1997 | Rubino et al. |
| 6,198,204 B1 | 3/2001 | Pottenger |
| 10,231,861 B1 | 3/2019 | Stafford |

(Continued)

FOREIGN PATENT DOCUMENTS

| | | |
|---|---|---|
| CN | 1777814 | 5/2006 |
| CN | 105591375 | 5/2016 |

(Continued)

OTHER PUBLICATIONS

U.S. Appl. No. 17/536,553, filed Nov. 29, 2021, Minimizing Bulk Charge in an Electroadhesive Actuator.

(Continued)

*Primary Examiner* — Timothy J Thompson
*Assistant Examiner* — Aditya Sharma
(74) *Attorney, Agent, or Firm* — Quinn IP Law

(57) ABSTRACT

An electrode device for an electroadhesive clutch can include a planar conductive member and a housing that encloses at least a portion of the conductive member. In an example, the housing can include a flexible polymeric substrate provided adjacent to at least a first surface of the conductive member, and a dielectric member comprising a first portion provided adjacent to an opposite second surface of the conductive member, and a second portion provided adjacent to a first side edge of the conducive member and coupled to the flexible polymeric substrate.

20 Claims, 37 Drawing Sheets

(56) References Cited

U.S. PATENT DOCUMENTS

| | | | |
|---|---|---|---|
| 10,264,830 | B2 | 4/2019 | Ichigaya |
| 10,711,848 | B2 | 7/2020 | Koenig et al. |
| 11,980,237 | B2 | 5/2024 | Walker et al. |
| 2003/0158593 | A1 | 8/2003 | Heilman et al. |
| 2008/0089002 | A1 | 4/2008 | Pelrine et al. |
| 2010/0076859 | A1 | 3/2010 | Fernandez |
| 2010/0299802 | A1 | 12/2010 | Bailey et al. |
| 2012/0089140 | A1 | 4/2012 | Dunning et al. |
| 2013/0010398 | A1 | 1/2013 | Prahlad et al. |
| 2013/0178146 | A1 | 7/2013 | Stockett |
| 2013/0276826 | A1* | 10/2013 | Koenig ............... A47L 13/40 15/1.51 |
| 2014/0259301 | A1 | 9/2014 | Berns et al. |
| 2016/0004308 | A1 | 1/2016 | Cruz-Hernandez et al. |
| 2016/0095367 | A1 | 4/2016 | Curran |
| 2018/0077976 | A1 | 3/2018 | Keller et al. |
| 2018/0100252 | A1 | 4/2018 | Blakely |
| 2018/0143687 | A1 | 5/2018 | Moessinger et al. |
| 2019/0047157 | A1 | 2/2019 | Shintake et al. |
| 2019/0085913 | A1 | 3/2019 | Koenig et al. |
| 2019/0363648 | A1 | 11/2019 | Majidi et al. |
| 2019/0384390 | A1 | 12/2019 | Cruz-Hernandez |
| 2020/0022427 | A1 | 1/2020 | Ichigaya |
| 2020/0081532 | A1 | 3/2020 | Yoon et al. |
| 2020/0245699 | A1 | 8/2020 | Berzowska et al. |
| 2020/0281304 | A1 | 9/2020 | Beers et al. |
| 2020/0309508 | A1 | 10/2020 | Kawaguchi |
| 2020/0356168 | A1 | 11/2020 | Remaley et al. |
| 2020/0371591 | A1 | 11/2020 | Remaley et al. |
| 2022/0202104 | A1 | 6/2022 | Walker et al. |
| 2022/0202108 | A1 | 6/2022 | Walker et al. |
| 2022/0202109 | A1 | 6/2022 | Walker et al. |
| 2022/0202110 | A1 | 6/2022 | Walker et al. |
| 2022/0202111 | A1 | 6/2022 | Walker et al. |
| 2022/0202121 | A1 | 6/2022 | Walker et al. |
| 2022/0209690 | A1 | 6/2022 | Walker et al. |
| 2024/0090814 | A1* | 3/2024 | Vitale, III ............... A61B 5/268 |
| 2024/0284996 | A1 | 8/2024 | Walker et al. |

FOREIGN PATENT DOCUMENTS

| | | |
|---|---|---|
| CN | 106102567 | 11/2016 |
| CN | 108255296 | 7/2018 |
| CN | 109990914 | 7/2019 |
| CN | 111211139 | 5/2020 |
| CN | 116829053 | 9/2023 |
| CN | 116868498 | 10/2023 |
| CN | 116829053 B | 1/2025 |
| EP | 1698242 | 9/2006 |
| EP | 3346370 | 7/2019 |
| JP | 2017029691 | 2/2017 |
| JP | 2017029693 | 2/2017 |
| JP | 2024506455 | 2/2024 |
| JP | 2024509493 | 3/2024 |
| KR | 20230124612 | 8/2023 |
| KR | 20230125799 | 8/2023 |
| WO | 9517258 | 6/1995 |
| WO | 2005002096 | 1/2005 |
| WO | 2018098019 | 5/2018 |
| WO | 2019222845 | 11/2019 |
| WO | 2020012219 | 1/2020 |
| WO | 2020242620 | 12/2020 |
| WO | 2022146595 | 7/2022 |
| WO | 2022146596 | 7/2022 |
| WO | 2022146597 | 7/2022 |
| WO | 2022146598 | 7/2022 |
| WO | 2022146599 | 7/2022 |
| WO | 2022146600 | 7/2022 |
| WO | 2022146601 | 7/2022 |
| WO | 2022146602 | 7/2022 |

OTHER PUBLICATIONS

U.S. Appl. No. 17/536,197, filed Nov. 29, 2021, Electroadhesive Actuators With Extended Life.

U.S. Appl. No. 17/536,568, filed Nov. 29, 2021, Apparel With Controllable Displacement System.

U.S. Appl. No. 17/670,075, filed Feb. 11, 2022, Apparel With Controllable Displacement System.

U.S. Appl. No. 17/536,576, filed Nov. 29, 2021, Electroadhesives for Apparel Fit.

U.S. Appl. No. 17/536,586, filed Nov. 29, 2021, Controllable Apparel Venting.

U.S. Appl. No. 17/670,089, filed Feb. 11, 2022, Controllable Apparel Venting.

U.S. Appl. No. 17/670,096, filed Feb. 11, 2022, Encasement for Electroadhesive Clutch.

U.S. Appl. No. 18/643,412, filed Apr. 23, 2024, Minimizing Bulk Charge in an Electroadhesive Actuator.

"International Application Serial No. PCT US2021 060950, International Search Report mailed Mar. 15, 2022", 3 pgs.

"International Application Serial No. PCT US2021 060950, Written Opinion mailed Mar. 15, 2022", 5 pgs.

"International Application Serial No. PCT US2021 060945, International Search Report mailed Mar. 18, 2022", 4 pgs.

"International Application Serial No. PCT US2021 060945, Written Opinion mailed Mar. 18, 2022", 9 pgs.

"International Application Serial No. PCT US2021 060949, International Search Report mailed Mar. 18, 2022", 3 pgs.

"International Application Serial No. PCT US2021 060949, Written Opinion mailed Mar. 18, 2022", 4 pgs.

"International Application Serial No. PCT US2021 060952, International Search Report mailed Mar. 21, 2022", 3 pgs.

"International Application Serial No. PCT US2021 060952, Written Opinion mailed Mar. 21, 2022", 5 pgs.

"International Application Serial No. PCT US2021 060943, International Search Report mailed Mar. 23, 2022", 4 pgs.

"International Application Serial No. PCT US2021 060943, Written Opinion mailed Mar. 23, 2022", 5 pgs.

"International Application Serial No. PCT US2021 060944, International Search Report mailed Mar. 23, 2022", 3 pgs.

"International Application Serial No. PCT US2021 060944, Written Opinion mailed Mar. 23, 2022", 4 pgs.

"International Application Serial No. PCT US2021 060955, International Search Report mailed Mar. 23, 2022", 3 pgs.

"International Application Serial No. PCT US2021 060955, Written Opinion mailed Mar. 23, 2022", 4 pgs.

"International Application Serial No. PCT US2021 060958, International Search Report mailed Mar. 28, 2022", 3 pgs.

"International Application Serial No. PCT US2021 060958, Written Opinion mailed Mar. 28, 2022", 5 pgs.

Hinchet, "High Force Density Textile Electrostatic Clutch", Advanced Materials Technologies, vol. 5, Issue 4, (Dec. 18, 2019), 7 pgs.

"European Application Serial No. 21916158.5, Response to Communication Pursuant to Rules 161 & 162 EPC filed Feb. 12, 2024", 11 pgs.

"European Application Serial No. 21916163.5, Response to Communication Pursuant to Rules 161 & 162 EPC filed Feb. 12, 2024", 9 pgs.

"U.S. Appl. No. 17/536,553, Response filed Oct. 25, 2023 to Non Final Office Action mailed Jul. 27, 2023", 9 pgs.

"U.S. Appl. No. 17/536,553, Notice of Allowance mailed Jan. 11, 2024", 9 pgs.

"Chinese Application Serial No. 202180093355.8, Voluntary Amendment filed Apr. 11, 2024", w English claims, 6 pgs.

"U.S. Appl. No. 17/536,610, Ex Parte Quayle Action mailed May 24, 2023", 9 pgs.

"International Application Serial No. PCT US2021 060952, International Preliminary Report on Patentability mailed Jul. 13, 2023", 7 pgs.

"International Application Serial No. PCT US2021 060943, International Preliminary Report on Patentability mailed Jul. 13, 2023", 7 pgs.

"U.S. Appl. No. 17/536,553, Non Final Office Action mailed Jul. 27, 2023", 11 pgs.

(56) References Cited

OTHER PUBLICATIONS

"Chinese Application Serial No. 202180093355.8, Office Action mailed Jun. 24, 2024", With English Machine Translation, 15 pgs.

"Chinese Application Serial No. 202180093355.8, Response filed Oct. 24, 2024 to Office Action mailed Jun. 24, 2024", w current English claims, 15 pgs.

"European Application Serial No. 21916158.5, Extended European Search Report mailed Dec. 17, 2024", 8 pgs.

"European Application Serial No. 21916163.5, Extended European Search Report mailed Jan. 24, 2025", 7 pgs.

"European Application Serial No. 21916158.5, Response filed Jun. 18, 2025 to Extended European Search Report mailed Dec. 17, 2024", w English Claims, 21 pages.

\* cited by examiner

ELECTROADHESIVES SYSTEM ISOLATION IN APPAREL

CROSS-REFERENCE TO RELATED APPLICATIONS

This application claims the benefit of priority of U.S. Patent Application Ser. No. 63/132,265, filed Dec. 30, 2020 and U.S. Patent Application Ser. No. 63/164,216, filed Mar. 22, 2021, the contents of both which are herein incorporated by reference in their entireties.

BACKGROUND

Apparel, such as bras, tops, bottoms, tights, leggings, underwear, hats or other head coverings, etc. can be constructed to provide support to a wearer during various activities. Such apparel can be configured to accommodate differences in body sizes and body types and can be configured for particular activities. Some apparel can have limited adjustments mechanisms or adaptability.

OVERVIEW

The present inventor has recognized, among other things, a need for improved fit and function of apparel, such as bras, tights, and various other garments, undergarments, or base layers (also referred to herein as support garments), hats, helmets, head coverings, footwear, and other apparel. One example includes an adaptive bra that can provide a customized fit for individual body contours and can automatically or manually adjust to different dynamic conditions (e.g., changes in activity level).

For example, an adaptive bra can variably adjust over a range of settings from maximum comfort to maximum breast support as a wearer transitions from resting to strenuous exercise. An adaptive bra can also utilize automated adjustment mechanisms coupled to movement sensors to dynamically adjust to inhibit unwanted movement of the breasts during activities, such as running as an example. Adaptive apparel, such as adaptive tights, athletic supporters, or other articles discussed below, can also provide dynamic support with the potential to enhance performance or reduce potential for injury. Adjustable compression sleeves can assist with recovery or support anatomy during certain activities. Numerous examples of the various support apparel introduced here are discussed throughout the following disclosure.

The term "support garment" as used herein is meant to encompass any number of support garments such as bras, sport bras, tank tops, camisoles with built-in support, swimming suit tops, body suits, base layers, tights, compression pants, athletic supporters, and other styles or types of support garments used to support body tissue (e.g., breast tissue) and/or other parts of the anatomy of the wearer. Support garments can also include underwear, tights, leggings, base layers (e.g., tight-fitting tops or bottoms), and sleeves, among other things. Further, the term "supportive region" as used herein is meant to encompass any type of structure that is in contact with or intended to be positioned adjacent to the wearer's breasts and/or other portions of the anatomy of the wearer, including but not limited to reproductive organs, when the support garment is worn. In example aspects, for a typical wearer, a support garment comprises a first breast contacting surface configured to contact or be positioned adjacent to, for instance, a wearer's right breast and a second breast contacting surface configured to contact or be positioned adjacent to, for instance, a wearer's left breast. In example aspects, the support garment comprises separate distinct cups (e.g., molded or unmolded) with each cup comprising a breast contacting surface and each cup configured to cover or encapsulate a separate breast, or the support garment may comprise a unitary or continuous band of material that makes contact with both of the wearer's breasts. In an example, a support garment can comprise a male cup contacting surface configured to contact or be positioned adjacent to, for instance, a wearer's lower reproductive organ. While the majority of the examples discussed herein involve adaptive bras, the principles can be applied to various other support garments including but not limited to compression tights, compression sleeves, or an athletic supporter (commonly referred to as a jockstrap or cup).

The present inventor has also recognized, among other things, a need for dynamically modifying the support provided by certain types of support apparel based on a change in activity level. The need for modifying the support stems from long-term comfort and improvements in functionality during activities. Accordingly, systems and methods discussed herein can include activity sensors, such as inertial measurement units (IMUs), global positioning sensors (GPS), or heart rate monitors, among others, in communication with a control circuit that sends commands to adaptive support apparel including an adaptive engine to facilitate automatic changes in support, such as based on changes in detected activity levels or changes in position or acceleration or deceleration. Such systems can provide a wearer all-day comfort without compromising performance. Without the systems, methods, and devices discussed herein, a wearer may otherwise need to change support apparel for different activities or struggle with multiple manual adjustments.

The activity sensors discussed herein can include any sensor that provides an indication of a level of physical activity of a user, as well as any sensor that provides an indication of a force (e.g., dynamic or static) imparted on an adaptive support garment during use. Sensors can be embedded into an adaptive support garment to provide data related to forces imparted on portions of a support structure, such as straps, laces, cables, or regions of fabric. Specific sensors, such as strain gauges or stretch capacitive sensors are discussed below.

The present inventor has recognized, among other things, that a problem to be solved includes managing or avoid bulk charge accumulation in an electrostatic or electroadhesive system. The problem can include driving such a system with relatively large-magnitude voltage signals and avoiding dielectric absorption in the electrodes or in dielectric components of the system itself. The problem can further include reducing power consumption and minimizing risk of stray electric fields or currents at or near the system. The problem can further include providing a clutch system that can be rapidly actuated such as to arrest or inhibit oscillating, quickly-changing, or repetitive body movements. The problem can include charging and discharging a clutch system over thousands or millions of cycles, such as at a rate of at least about one hundred cycles or more per minute, without clutch force or shear force degradation over time. In other words, the problem can include providing a robust clutch system that can be actuated many times in quick succession.

This section is intended to provide an overview of subject matter of the present patent application. It is not intended to provide an exclusive or exhaustive explanation of the invention. The detailed description is included to provide further information.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1A:
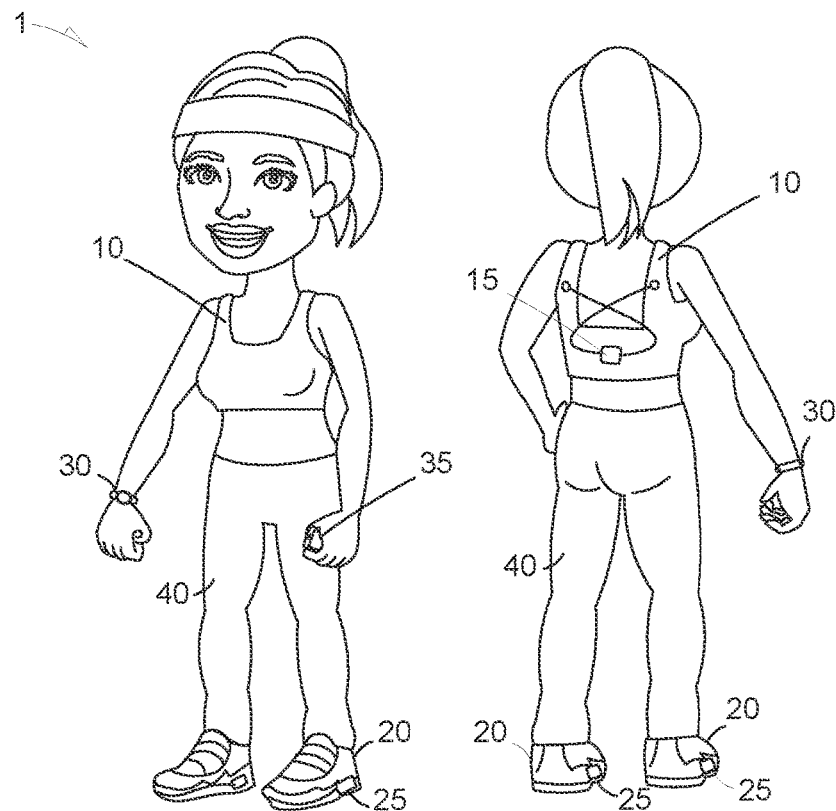
FIG. 1A illustrates generally portions of a system that can include an adaptive support garment.

The description that follows describes systems, methods, techniques, instruction sequences, and computing machine program products that illustrate example embodiments of the present subject matter. In the following description, for purposes of explanation, numerous specific details are set forth in order to provide an understanding of various embodiments of the present subject matter. It will be evident, however, that embodiments of the present subject matter may be practiced without some or other of these specific details. Examples merely typify possible variations. Unless explicitly stated otherwise, structures (e.g., structural components, such as modules, devices, systems or components thereof) are optional and can be combined or subdivided, and operations (e.g., in a procedure, algorithm, or other function) can vary in sequence or be combined or subdivided.

In an example, a solution to one or more of the technical problems discussed herein can include or use an electroadhesive device, such as can be used as a clutch. A clutch, generally, refers herein to a device that can be selectively or controllably actuated to achieve a particular one of multiple different states or configurations, including at least "on" and "off" states. For example, in an "on" state, one or more components of a clutch can maintain a particular orientation, shape, or configuration, such as relative to at least one other component of the clutch. In an "off" state, one or more components of a clutch can relax or release such as to provide a relatively compliant configuration in which the one or more components of the device can move relative to another component of the clutch.

In an example, the clutch can be coupled to or integrated with another object, such as apparel or a machine. In an example, a clutch system or clutch device can include a first electrode assembly comprising a first conductive portion that is at least partially covered by a first dielectric insulator, and a second electrode assembly comprising a second conductive portion that is at least partially covered by a second dielectric insulator. The clutch can include an electrical signal generator configured to provide first and second signals to the first and second conductive portions of the electrode assemblies, respectively, and the first and second signals can comprise respective opposite-polarity portions of an alternating current (AC) signal. The first and second electrode assemblies can be arranged in an at least partially overlapping configuration, such as at or along their respective surfaces that comprise the first and second dielectric insulators. When the AC signal is asserted and provided to the conductive portions of the electrode assemblies, relative movement between the electrode assemblies can be inhibited or arrested. When the AC signal is unasserted or removed from the conductive portions of the electrode assemblies, relative movement between the electrode assemblies can be enabled.

As a result, a technical problem that can include, among other things, managing or obviating bulk charges or dielectric absorption in an electrostatic or electroadhesive system can be addressed, such as by using an AC drive signal, or signals, instead of using a DC drive signal, which could adversely affect dielectric absorption effects and, in turn, can adversely affect performance of the clutch system.

In an example, a solution to one or more of the technical problems discussed herein can include or use an electroadhesive device, such as can include a clutch device with a planar conductive member and a housing that encloses at least a portion of the conductive member. The housing can include, among other things, a flexible polymeric substrate provided adjacent to at least a first surface of the conductive member, and a dielectric member comprising a first portion provided adjacent to an opposite second surface of the conductive member, and a second portion provided adjacent to a first side edge of the conductive member and coupled to the flexible polymeric substrate.

The technical problem that can include, among other things, inhibiting or preventing stray electric fields or stray electric currents from exiting the clutch device can be addressed at least in part using hardware such as a housing for one or more conductive members of the clutch device. The housing can include one or multiple different materials such as can have different dielectric properties and, in some examples, can partially or fully encapsulate the conductive members.

The electroadhesive device, or components thereof, can be suitable for use with textiles and other materials that can comprise an article of apparel. That is, the device, or components thereof, can be conformable with body parts such as appendages and configured to flex without breaking. For example, the device, or components thereof, can be configured to bend, mold, and/or adapt to various shapes and configurations of a user's body while the user is in motion. In some embodiments, the flexibility of the device, or a component thereof, is measured by a bend modulus or flexural modulus, which is a standardized measurement of stiffness when a force is applied to the material. As described herein, a flexible material is flexible as defined by standards ASTM D790 or ISO 178. Flexural modulus denotes, for example in units of megapascals (N/mm$^2$) an ability of a material to bend. It is a measure of a material stiffness when a force is applied perpendicular to the long edge of a sample, known as a three-point bend test. Materials which lack stiffness are characterized as being flexible. The flexural modulus is represented by the slope of the initial straight-line portion of the stress-strain curve and is calculated by dividing the change in stress by the corresponding change in strain. The ratio of stress to strain is a measure of the flexural modulus. Various components of the electroadhesive devices discussed herein can use materials such as polyethylene terephthalate or acrylonitrile butadiene with a flexural modulus of between 0.3 and 10 MPa.

Additionally, the present inventor has identified the problem of maintaining the operational integrity of the electroadhesive system especially in situations involving a damp environment. Electroadhesive systems used to arrest or inhibit oscillation of body movements can be positioned close to a wearer's body, and a protective mechanism can be provided to separate the electroadhesive system from a wearer prone to produce sweat, tears, environmental moisture such as rain, sleet, snow, or mist, and other water-based fluids.

In an example, a solution to one or more of the technical problems discussed herein can include or use an electroadhesive device, such as a clutch with one or more components disposed in a watertight encasing. Electronic devices can benefit from mechanisms to block water or moisture from entering or contacting sensitive areas or components of the electronic device. Further, a watertight encasing can be flexible to allow mobility of the electroadhesive advice and configurable to integrate with articles of apparel.

For example, the electroadhesive clutch device in a watertight encasing can be fitted to various articles of apparel including sports bras, tights, and athletic supporters that are susceptible to sweat and moisture. These articles of apparel benefit from the flexibility provided by the encasing as well as the selective mobility functionality provided by the electroadhesive clutch.

As a result, the technical problem that can include, among other things, water and moisture-susceptible electronic devices, can be addressed at least in part by encasing the electronic device within a waterproof and flexible encapsulation. The encasing can include one or multiple different materials and, in some examples, can partially or fully encapsulate conductive members of a clutch device.

The article of apparel may also include an accelerometer placed within the encasing. The accelerometer is configured to measure motion of a body to which the electroadhesive clutch device is coupled and the electrical signal generator is configured to generate a signal based on the measured motion. The accelerometer may also be configured to measure a magnitude of acceleration of at least a portion of the clutch device and the electrical signal generator is configured to generate a signal with a magnitude and/or frequency characteristic based at least in part on the magnitude of acceleration.

The present inventor has recognized that another problem to be solved includes managing the cyclic upward and downward movement of body mass while in motion. The repetitive motion can cause strain on the body resulting in damage to the body and corresponding pain. Specifically, the Ligaments of Cooper found in the breast tissue may be strained when the breast experiences a cyclic, repetitive motion without proper support. Additionally, when the Cooper's ligaments are strained or damaged or otherwise fail to support the breast tissue, sagging of the breast can develop over time.

Additionally, male reproductive organs experience a similar cyclical motion that causes damage to the organ after prolonged motion that may also cause pain. Other body parts of a person may experience similar strain, such as the feet, knees, elbows, and back.

In an example, a solution to one or more of the technical problems discussed herein can include or use an electroadhesive clutch, such as an article of apparel having a supportive region that is configured to selectively tighten and relax. The article of apparel can include, among other things, a textile layer for the supportive region, a strap encasing the electroadhesive clutch, and a signal generator to provide one or more signals to the electroadhesive clutch.

As a result, the technical problem that can include, among other things, inhibiting or preventing upward or downward movement of body mass, such as while a body is in motion, can be addressed at least in part using hardware such as an electroadhesive clutch in conjunction with an article of apparel having a supportive region that can be selectively, tightened and relaxed to provide adjustable support of the body mass.

In an example, a solution to one or more of the technical problems discussed herein can include or use an electroadhesive device in a support garment for a wearer. The support garment may include a textile layer forming a supportive region configured to adjustably inhibit displacement of a body part of the wearer positioned proximate the supportive region. The support garment may also include a hollow strap affixed to a portion of the textile layer that encases an electroadhesive clutch. The electroadhesive clutch includes a first electrode assembly, a second electrode assembly distinct from the first electrode assembly and an electrical signal generator. The electrical signal generator provides one or more signals to the first and second electrode assemblies to cause the electroadhesive clutch device to selectively adjust an amount by which the support garment allows displacement of the body part proximate the support region. The support garment may be a sports bra and the supportive region may be a cup of the sports bra. In some embodiments, the hollow strap is a first hollow strap encasing a first electroadhesive clutch and the support garment includes a second hollow strap encasing a second electroadhesive clutch. Each electroadhesive clutch is affixed to a first and second portion of the textile layer forming the supportive regions.

The support garment may also include a signal generator configured to provide one or more electrical signals to the first and/or second electroadhesive clutch. The first and second clutches selectively adjust the amount by which the support garment allows or inhibits displacement of a body part. In an example, actuation of the first and second clutches can be coordinated such that they are energized or deenergized substantially concurrently. The support garment may be an athletic supporter having a hollow strap affixed to a right side of the textile layer forming the supportive region and a second hollow strap affixed to a left side of the textile layer. Clutch electrodes, such as disposed in each of the hollow straps, can be individually controllable to selectively adjust an amount by which the support garment allows displacement of the body part. In some embodiments, the support garment may include a displacement sensor for each strap configured to measure a change in length or displacement of the strap. In some embodiments the straps are waterproof encasings.

In some embodiments the support garment includes an accelerometer configured to measure motion of the electroadhesive clutch, or of a garment or body to which the clutch is coupled, and to generate one or more signals based on the measured motion. The support garment can be configured to actuate or retain a specified position or orientation when the wearer meets or exceeds an acceleration or velocity threshold, and can be configured to relax when the wearer is below the threshold.

Another problem to be solved includes maintaining an optimal body temperature of a wearer of an article of apparel under various stress conditions including exercising, lounging, and traveling. Interchanging between various articles of apparel to adapt to specific environments can be cumbersome and wasteful. Wearers may be faced with the problem of deciding which articles of apparel to don for each activity and/or environment. A wearer wanting to go on a long run and then catch a flight thereafter may need to decide between tight fitting running apparel and comfortable loungewear.

In an example, a solution to one or more of the technical problems discussed herein can include or use an electroadhesive device in an article of apparel. The article of apparel includes a textile with an aperture coupled to an electroadhesive clutch device. That is, the clutch device or components thereof can be integrated into the article of apparel and configured to selectively allow the aperture to open and close or to maintain the aperture in a closed configuration. The article of apparel can include an electric signal generator configured to send, to the electroadhesive clutch device, one or more signals to selectively allow the aperture to open and/or close.

As a result, the technical problem that can include, among other things, heat retention or perspiration in clothing without sufficient air ventilation can be addressed such as using an article of apparel having an electroadhesive clutch device system to selectively control an aperture for providing airflow to a wearer.

The incorporation of electronics into wearable articles may present a variety of challenges. Wearable articles may be subject to getting wet from environmental conditions, sweat from wearers engaging in physical activities, and washing, among other sources of moisture. Encapsulating such electronics in a waterproof encapsulant may isolate the electronic components from moisture but may present challenges in physically integrating the electronic components into the wearable article without compromising the watertight encapsulant or damaging the electronic components.

In an example, a solution to one or more of the technical problems discussed herein can include or use an electroadhesive clutch secured to a textile. First and second electrode assemblies having first and second conductive members, respectively, are encased within an elastic encasing. The elastic encasing forms a first bond with the first conductive member at a first location of the elastic encasing and a second bond with the second conductive member proximate a second location of the elastic encasing different than the first location. The formation of the bonds between the first and second conductive members and the elastic encasing provides for the maintenance of the encasing without compromising the integrity of first and second conductive members.

Articles of apparel, such as hats, sleeves, and the like, may not be utilized in consistent situations. For instance, a hat may be worn both while engaged in vigorous activity, when a relatively tight or snug fit may be advantageous to prevent the hat from falling off of the head of the wearer, as well as in non-vigorous activity, such as walking or sitting, when comfort may be of greater desirability. Moreover, such articles of apparel may come in a "one-size-fits-all" configuration, in which a single size is adapted to fit a variety of head sizes. However, such configurations may make the hat uncomfortable, particularly for relatively large or relatively small heads.

In an example, a solution to one or more of the technical problems discussed herein can include or use a textile forming an opening configured to admit a body part of a wearer and an electroadhesive clutch secured to the textile and extending around at least a portion of the opening. The electroadhesive clutch is configured to inhibit increasing a size of the opening when one or more signals, such as first and second signals, are applied to the electrode assemblies of the clutch and the opening is enabled to increase in size when the one or more signals are not applied. Consequently, the article of apparel may be adaptable to any of a variety of use cases and a variety of different physical attributes of wearers of the article of apparel.

In an example, a solution to one or more of the technical problems discussed herein can include or use an electroadhesive device having a first electrode assembly and a second electrode assembly. The first electrode assembly includes a first conductive member and a first polymeric substrate applied to the first conductive member and having a stiffness greater than a stiffness of the first conductive member. The second electrode assembly includes a second conductive member and a second polymeric substrate applied to the second conductive member, the second polymeric substrate having a stiffness greater than a stiffness of the second conductive member, and the first and second conductive members are proximate one another with the first and second polymeric substrates distal with respect to one another.

As a result, the technical problem that can include, among other things, a tendency of the first and second conductive members to bend or fold when sliding with respect to one another can be addressed, such as by applying polymeric substrates to the first and second conductive members. The polymeric substrates may also reduce wear and tear on the first and second conductive members by preventing rubbing by the first and second conductive members on surrounding structures, such as a watertight encasing. By applying the first and second polymeric substrates such that the first and second conductive members are proximate one another, the first and second conductive members may still function as an electroadhesive device while reducing the likelihood of damage to the first and second conductive members.

An adaptive support apparel system dynamically alters the fit and support of an adaptive support garment (e.g., bra or tights) in response to activity data obtained from one or more sensors worn by the user. The adaptive support system can also include components integrated into various wearables, such as footwear, watches or support apparel. In certain examples, the adaptive support system can be controlled through a smartphone, smart watch, or similar wearable computing device that communicates wirelessly with other components of the system. In other examples, the adaptive support system is controlled with circuitry built into the components integrated into the adaptive support apparel and/or footwear. The following figures illustrate an example system and discusses at least some variations envisioned by the inventor.

Figure 1B:
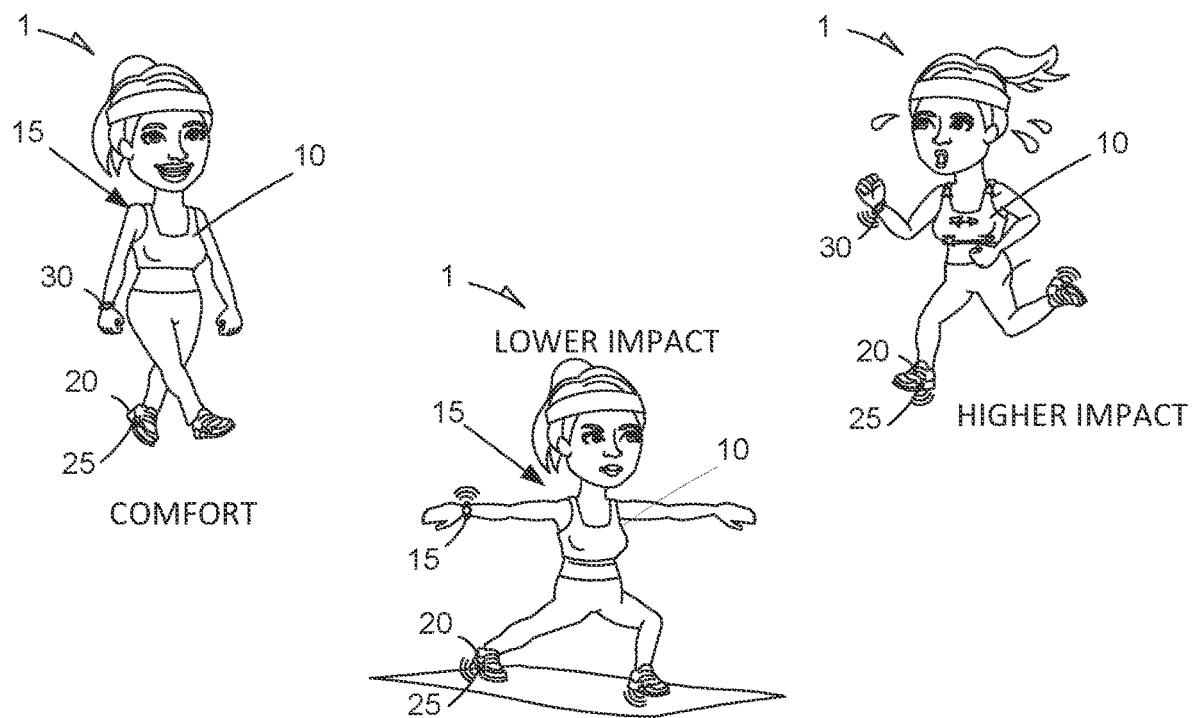
FIG. 1B illustrates generally portions of a system that can include an adaptive support garment.

FIG. 1A-1B are illustrations of a system including an adaptive support garment and associated electronics, according to some example embodiments. In this example, the adaptive support apparel system 1 includes components such as, an adaptive support garment 10, a footwear assembly 20, and a smart watch 30. Optionally, the adaptive support apparel system 1 can also communicate with a smartphone 35 or other handheld or mobile device for control or adjustment of parameters. In this example, the footwear assembly 20 includes an activity sensor 25, and the adaptive support garment 10 includes an adaptive engine 15. In this example, the adaptive engine 15 couples to a clutch system 16 (also referred to as an electroadhesive clutch 16) that controls an adaptive support structure within the adaptive support garment 10. Optionally, the system 1 can also integrate a second adaptive support garment 40, illustrated here as adaptive tights.

In this example, the footwear assembly 20 includes an activity sensor 25 that can include sensors such as an accelerometer, a gyroscope, a temperature sensor, a magnetometer, a heart rate sensor, or a global positioning sensor (GPS) to detect a change in activity level. In one example, the footwear assembly 20 includes an inertial measurement unit (IMU), which combines one or more of accelerometers, gyroscopes, or other applicable sensors to provide a specific force, orientation, or angular rate of change for a monitored body. Data from the IMU can be used to detect movements, such as foot strike or cadence among other things. In this example, the data from the activity sensor 25 is communicated to the smart watch 30 or smartphone 35 for processing to determine whether a change in adaptive support is needed based on the activity data from the activity sensor. In another example, the activity data may be sent directly to the adaptive engine 15 for processing and determination of adaptive support level needed.

Foot strike data can include a portion of a broader array of activity metrics that can be determined from sensors, such as activity sensor 25 (e.g., IMU and Force sensor combination). Step metrics can include individual steps or step count. A step can be defined for this metric based on parameters such as, minimum vertical force threshold, minimum average vertical force per step, minimum step time and maximum step time. Step metrics can also include contact time, which is calculated per foot per step using a force signal (e.g., time when vertical force >50N). Another step metric is swing time, which is calculated per foot per step using a force signal (e.g., time when vertical force <50N until that foot creates a force >50N). Step metrics also include cadence, which can be defined as the inverse of the sum of the contact and swing time for each foot using force signal. Step length is another step metric calculated using a force signal (e.g., sum of contact and swing time multiplied by average speed). Another step metric is impact, which can be calculated in at least two ways. Impact can be a peak rate of rise of the vertical ground reaction force, or an active peak of the vertical ground reaction force. Impulse is another step metric that is calculated per foot per step using a force signal (e.g., integral of the ground reaction force magnitude). Contact is another step metric derived from motion data. For example, using MU data sampled at 200 Hz to determine foot angle relative to horizontal at the time of foot contact. Contact can include rearfoot, midfoot, and forefoot angles. Any of the step metrics discussed here can be used as activity data or in addition to other activity data to assist in determining an activity level or directly to determine a target support level for an adaptive support garment.

In this example, one or each of the adaptive engine 15, smart watch 30, and smartphone 35, separately or in conjunction with one another or by accessing remote computing resources, includes a control circuit that processes the activity data and sends commands to the adaptive engine 15 to change support characteristics as needed. The adaptive engine 15 receives commands and activates a system to adjust an adaptive support structure through interactions with a clutch system 16 coupled to the adaptive engine 15.

FIG. 1B illustrates a user of an adaptive support apparel system transitioning between different activities that might require, or benefit from, various levels of support. In this example, the activity sensor 25, illustrated within the footwear assembly 20, operates to detect different activity levels ranging from a relaxed walk to moderate exertion doing yoga to more extreme impact and exertion involved in running. In this example, the activity sensor 25 transmits data to a control circuit in the smart watch 30, which is running an application that determines a current activity level based on the activity data interpreted from the sensor (s). In some examples, the smart watch 30 can also include activity sensors that also send activity data to the control circuit operating on the smart watch 30 to provide additional activity level information to inform a decision to increase or decrease the support provided by the adaptive support garment 10, such as an adaptive bra as in this example. For example, the smart watch 30 can include an integrated heart rate monitor that can be used as additional information related to activity level.

In the comfort zone, the adaptive apparel support system 1 detects low levels of physical activity that have been determined to correspond to a relaxed level of support required from an adaptive support garment. Accordingly, the control circuit commands the adaptive engine 15 to activate and adjust the adaptive support garment 10 to a comfort setting. The control application (e.g., application operating the control circuit) can include a user interface that provides a user access to different settings for the adaptive support garment. In an example, the settings can include associating different support levels with different pre-defined activity levels, such as resting=comfort support level (e.g., low level of support) and higher impact=performance support level (e.g., a high level of support). Other mappings can be created, and a user interface can be presented to allow a user to generate custom mappings. Table 1 illustrates an example mapping table for Activity Level-Support Level mapping.

TABLE 1

| Activity Level | Support Level |
|---|---|
| Resting (no exertion, no impact) | Comfort-Minimum Support |
| Walking (moderate exertion, low impact) | Recreation-Moderate Support |
| Yoga (moderate exertion & impact) | Sport-Enhanced Support |
| Running (high exertion & impact) | Performance-Superior Support |

As illustrated, a user can transition from Comfort to Lower impact by increasing exertion and/or impact detected by the activity sensors. Dynamically, upon detecting a transition the control circuit in the smart watch 30 commands the adaptive engine 15 to increase the support level provided by the adaptive support garment 10. If the user reverts to a Comfort level of activity (e.g., resting or walking), then the control circuit can command the adaptive engine 15 to relax the support level back to a comfort level of support. Alternatively, if the user increases activity by going for a run, the system can dynamically respond with the adaptive engine 15 increasing the support level to a higher impact (performance) level of support.

In certain examples, a user can select from multiple different activity related parameters (e.g., heart rate, cadence, impact, etc.) and associate different levels of each parameter with different support levels. For example, a user can create a running activity classification that uses heart rate and cadence as triggers. The running activity can then be mapped to a high support level. The support level can also be configured by associating different support structure adjustments to a particular support level, such as a clutch force or tension for a support structure.

Figure 1C:
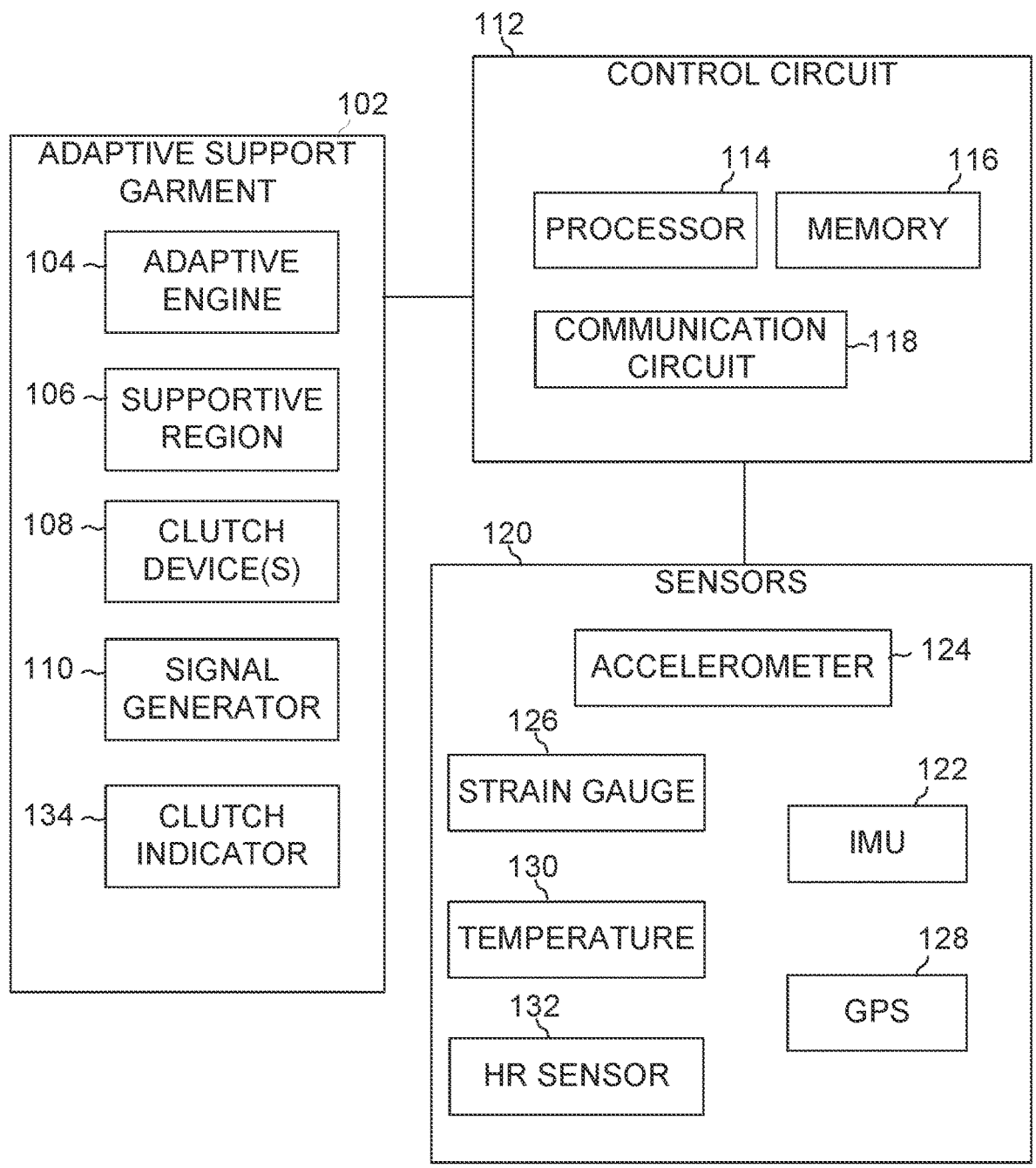
FIG. 1C illustrates generally a block diagram of some components of an adaptive support system.

FIG. 1C is a block diagram illustrating components of the adaptive support system, according to some example embodiments. Note, throughout this document the adaptive support system is also referred to as the adaptive support apparel system. In this example, the adaptive support system 1 includes components such as a control circuit 112, activity sensors 120, and an adaptive engine 104, with the adaptive engine 104 integrated within an adaptive support garment 102. The adaptive support garment 102 can include an adaptive supportive region 106. The adaptive supportive region 106 includes one or more electroadhesive clutch device(s) 108 configured to selectively become static and/or elastic and an electric signal generator 110 that can generate signals that control actuation of the clutch device(s) 108.

In an example, the adaptive support garment 102 can include or use a clutch indicator 134 to provide an indication of a state or status of the clutch device(s) 108. For example, the clutch indicator 134 can comprise a haptic feedback device; light source, or other interface means that can indicate whether the clutch device(s) 108 is engaged or disengaged, or to indicate a degree to which the clutch device(s) 108 is engaged. The clutch indicator 134 can comprise circuitry or other components configured to drive the clutch indicator 134, such as an adjustable power signal source or other signal generator.

The control circuit 112 includes a processor 114, a computer-readable memory device memory 116, and a communication circuit 118, As discussed above, in some examples the control circuit 112 can be integrated within a smart watch 30 or smartphone 35 (FIG. 1A). In those examples, the control circuit 112 is embodied within a software application running on an operating system (e.g., iOS or Android) for the smart watch 30 or smartphone 35 hardware. Accordingly, the processor 114 and memory device memory 116 would be part of the smartphone 35 or smart watch 30. In the illustrated example, the control circuit 112 is a standalone device or integrated into an adaptive support garment 102.

The processor 114 accesses instructions stored in the memory device memory 116 to process activity data received over the communication circuit 118. The activity data can also be stored on the memory device memory 116 at least during processing operations. The processor 114 also processes instructions that enable it to generate and transmit, over the communication circuit 118, commands to the adaptive engine 104. The commands communicated to the adaptive engine 104 control activation of the adaptive engine 104 to change support characteristics of an adaptive support garment.

The control circuit 112 receives activity data from activity sensors 120. In this example, activity sensors 120 can include any combination of an IMU 122, an accelerometer 124, a strain gauge 126 (e.g., a capacitance-based strain gauge configured to measure displacement information), a global positioning system (GPS 128), a temperature sensor 130, and/or a heart rate (HR sensor 132) among other sensors capable of producing data indicative of a user's activity level. The activity sensors 120 can include any combination of the listed sensors and transmits the produced activity data to the control circuit 112 over a wireless communication link, such as Bluetooth® LE (Low Energy). Additionally, as alluded to above, the components of system 1 discussed above can be distributed in any combination across devices including a smart watch, a smartphone, a footwear assembly, or an adaptive support garment (e.g., integrated into an adaptive engine).

The term "electroadhesion" generally refers herein to a coupling of physical objects using an electrostatic force. The electrostatic force between objects can be selectively controlled by a controller, or processor circuit, that can coordinate generation and provision of electrical signals to different electrodes in or on the objects to be coupled using the electrostatic force. Engagement, coupling, or adhesion between objects using electroadhesion can be controlled in terms of, for example, coupling or decoupling, or can be controlled in terms of a magnitude of a gripping force or magnitude of shear force between the objects. That is, the engagement between objects in an electroadhesive system can be controlled in binary on/off terms or in terms of a relative magnitude or degree of a force that couples the objects or resists relative motion between the objects.

In an example, electrical control of electrostatic forces can provide controlled attachment or detachment of various objects. For example, two or more object surfaces can be joined or held together using electroadhesion and can thereby affect a grip, traction, or friction between the joined surfaces due to electrostatic forces from an induced electric field. In some examples, a dielectric can be provided between the joined surfaces.

Surfaces to be joined using electroadhesion can have various surface properties or characteristics. For example, surfaces having different planar uniformity or flatness characteristics, smoothness or roughness characteristics, continuity or discontinuity characteristics, conductivity, topography, compliance or flexibility, or other characteristics, can be joined using electroadhesion. That is, electroadhesive devices and techniques discussed herein are not limited to particular material properties or surface characteristics, however, some materials can exhibit different electroadhesion characteristics than others. For example, some materials can be better configured for repetitive electroadhesive coupling and decoupling, and some materials can be better configured for relative motion between the different materials.

In some examples, an electroadhesive system or electroadhesion device can include at least one compliant or conformable electroadhesive surface that is flexible in one or more dimensions. Owing at least in part to the compliance of a first component of an electroadhesive system, for example, the first component may join or mate more effectively with a second component, such as can be or can include a different or less conformable surface of another device.

For example, a first electroadhesive surface can include a compliant surface portion that is configured to facilitate electroadhesive attraction substantially independently of surface roughness of a second electroadhesive surface. That is, the first electroadhesive surface can be configured to conform to discontinuities or other imperfections of a second surface to which the first electroadhesive surface is to mate. In an example, an electroadhesive surface can be configured to conform to microscopic, mesoscopic, and/or macroscopic surface features. Under the influence of an appropriate electrical stimulus, the first electroadhesive surface can be attracted to the second electroadhesive surface, and the first electroadhesive surface can be caused to at least partially conform to the second surface by deforming or flexing locally. In some examples, multiple different modes of adhesion between primary and secondary devices or surfaces can be provided to further enhance mating between the surfaces.

In an example, an electroadhesive system can include at least a primary device having one or multiple electrodes. The primary device can be configured to adhere, or "clutch," to or with a secondary device or target. The secondary device can similarly have one or multiple electrodes. The various device electrodes can be electrically stimulated to induce an electrostatic attraction with respect to another electrode or device, such as when an appropriate voltage or current signal is applied to one or both devices. In some examples, polarization of an electrode on a surface of the primary device can induce a corresponding polarization in the target device and can thereby cause the primary and secondary devices to adhere.

In an example, a controllable electroadhesive clutch system can include or use electroadhesive films that are lightweight and can generally use relatively low-power electrical signals to form bonds with other surfaces and substrates, such as with other films. Many of the examples herein include or use electroadhesive clutch devices that comprise one or multiple pairs of films that can be electrically charged to yield a force that can join the films together. Other electroadhesive materials can include materials other than films, or electroadhesive materials of different types (e.g., films, fabrics, liquids, plastics, etc.) can similarly be used to provide the same or similar results.

Figure 2A:
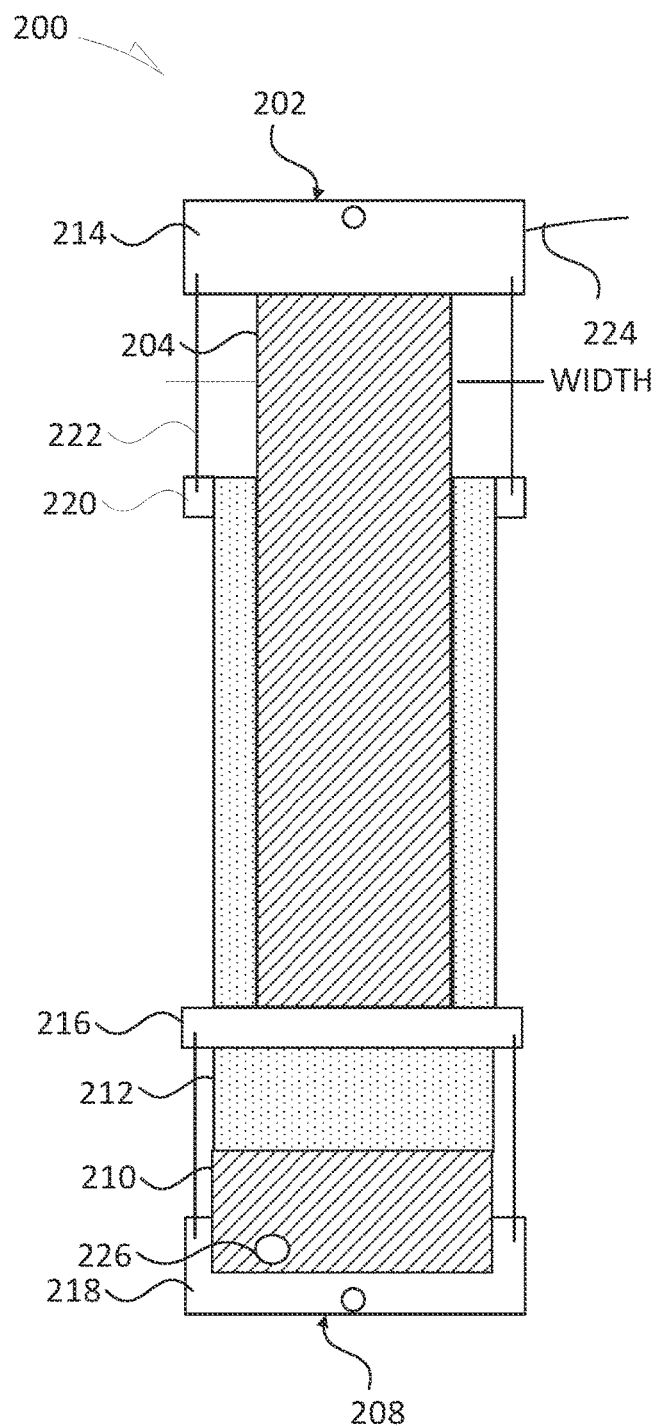
FIG. 2A illustrates generally a top schematic view of an electroadhesive first clutch system.
Figure 2B:
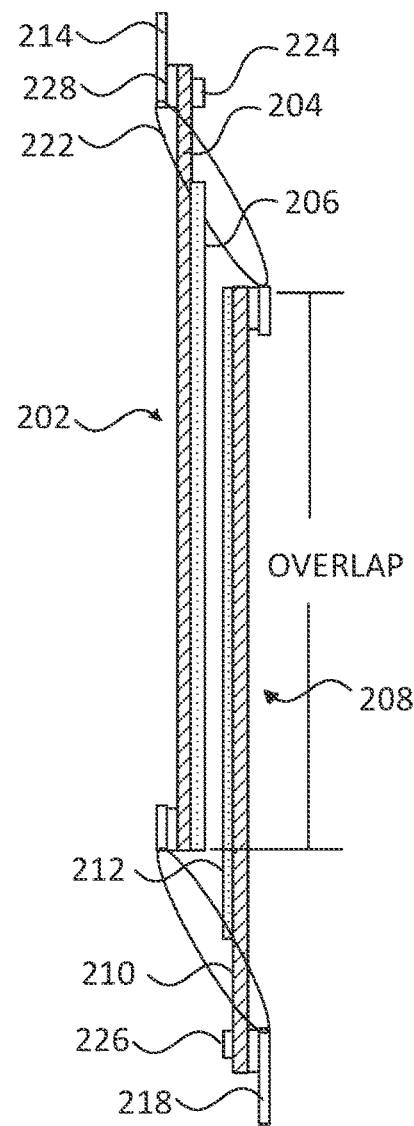
FIG. 2B illustrates generally a side view of the electroadhesive first clutch system.

FIG. 2A illustrates generally a top schematic view of an electroadhesive first clutch system 200. FIG. 2B illustrates generally a side view of the electroadhesive first clutch system 200. The side view of FIG. 2B is a partially exploded view to better illustrate the various components and features of the first clutch system 200. The example of the first clutch system 200 includes a first electrode assembly 202 that can be selectively and controllably coupled to, or decoupled from, a second electrode assembly 208 using electrostatic force. In FIG. 2B, the first electrode assembly 202 is illustrated as near to, but decoupled from, the second electrode assembly 208. That is, in FIG. 2B, the illustration shows the electrode assemblies detached from each other and, for example, not under the influence of an electrostatic attractive force.

The first electrode assembly 202 includes an electrode with a first conductive surface 204 and the second electrode assembly 208 includes an electrode with a second conductive surface 210. The conductive surfaces can have respective portions that can be positioned at least partially adjacent to each other. In the example of the first clutch system 200, the respective surface portions are illustrated as planar surfaces, however, other surface shapes or characteristics (e.g., rounded surfaces, angled surfaces, etc.) can similarly be used.

In an example, an electrical signal, or multiple electrical signals, can be applied to the first conductive surface 204 and the second conductive surface 210 of the respective electrodes to thereby induce an electrostatic force that can join the surfaces, and therefore the first electrode assembly 202 and the second electrode assembly 208, together. The strength of the force that joins the assemblies can depend upon, among other things, a surface area of the adjacent conductive surfaces, a magnitude of the electric signal or signals applied to the first conductive surface 204 and the second conductive surface 210, a distance between the surfaces, and a permittivity of any dielectric member or gap between the conductive surfaces.

The example of the first clutch system 200 includes a dielectric layer between the first conductive surface 204 and the second conductive surface 210. In the example of the first clutch system 200, each of the conductive surfaces is coated or covered at least partially with a dielectric insulator. In the first clutch system 200, a first dielectric layer 206 can be provided along a portion of the first conductive surface 204 that is or, in some orientation can be, adjacent to the second electrode assembly 208. A second dielectric layer 212 can be provided along a portion of the second conductive surface 210 that is or, in some orientation can be, adjacent to the first electrode assembly 202.

In other examples, one of the conductive surfaces includes or uses a dielectric insulator and the other does not.

The dielectric insulator can be applied or deposited homogeneously or can be deposited in a pattern or quasi-randomly (e.g., with a particular coverage per unit area) to thereby effect different adhesion characteristics of the first clutch system 200. In other examples, an airgap can be provided between the conductive surfaces and can comprise a dielectric insulator. Various spacers can be used to control a uniformity or non-uniformity of the airgap between the conductive surfaces of the first clutch system 200. Similarly, spacers can be used to control a compressive force on a dielectric member that can be provided between the conductive surfaces.

In the example of the first clutch system 200, the first electrode assembly 202 includes a first support 214 and a second support 216 at opposite length-wise ends of the first conductive surface 204. The supports can be configured to maintain the first conductive surface 204 in a generally planar configuration, however, differently shaped or differently configured supports can similarly be used, such as depending on the particular geometry or application of the clutch system. Similarly, the second electrode assembly 208 includes a third support 218 and a fourth support 220 at opposite length-wise ends of the second conductive surface 210. In an example, the supports comprise carbon fiber, aluminum, or other material.

In an example, one or more of the supports can comprise conductive or non-conductive portions. In an example, the first support 214 is coupled to a first lead 224 or electrical terminal. The first support 214 can include a conductive portion, or can provide a substrate for a conductor, that can receive an electrical signal from the first lead 224 and provide it to the first conductive surface 204. Similarly, the third support 218 can be coupled to a second lead 226 or electrical terminal. The third support 218 can include a conductive portion, or can provide a substrate for a conductor, that can receive an electrical signal from the second lead 226 and provide it to the second conductive surface 210. In an example, the various supports can be coupled to their respective conductive surfaces using an insulator, and the electrical leads can be coupled to the conductive surfaces, such as with or without any intervening conductors, materials, or signal busses. For example, the first support 214 can be coupled to an insulator 228 and the insulator 228 can be coupled to the first conductive surface 204, to thereby electrically decouple the first conductive surface 204 from the first support 214. In some examples, electrically decoupling or isolating a conductive surface from its support or supports can help concentrate available electrical energy in the conductive surface rather than distribute it over a larger area, such as can include the support. In an example, the insulator 228 can be an adhesive component or layer that couples the supports to their respective conductive surfaces.

The example of the first clutch system 200 includes an alignment device 222. The alignment device 222 can be configured to couple the electrode assemblies together, such as to maintain a specified orientation or alignment of the first electrode assembly 202 and the second electrode assembly 208. In some examples, the alignment device 222 can comprise a spring, an elastic member, or other extensible and retractable component that can be configured to bias the first electrode assembly 202 and the second electrode assembly 208 toward a particular orientation. In the example of the first clutch system 200, the alignment device 222 can bias the respective surface portions of the first electrode assembly 202 and the second electrode assembly 208 into a substantially adjacent and at least partially overlapping orientation. As used herein, substantially adjacent can mean coupled, or can mean nearby but uncoupled or decoupled, or can mean partially coupled, or can mean sufficiently near that an electrostatic force can be developed between the surfaces, such as with or without physical contact between the surfaces or between one or more dielectric layers provided between the surfaces. Multiple instances of the alignment device 222, or multiple, differently-oriented alignment devices can be used together, such as to help avoid buckling or warping of conductive portions of the electrode assemblies.

In an example, the conductive portion of the first conductive surface 204 or the second conductive surface 210 can comprise a conductive material that is printed, deposited or sputtered onto a flexible or compliant substrate. For example, the conductive portion can include a Mylar substrate that is coated or sputtered with aluminum. In an example, one or both of the electrode assemblies in the first clutch system 200 can include an insulating dielectric layer, such as a ceramic-polymer composite, provided on an aluminum-sputtered hi-axially oriented polyethylene terephthalate film, or BOPET film.

In an example, the dielectric layer, such as the first dielectric layer 206 or the second dielectric layer 212, and/or other insulating or partially-insulating dielectric portions can be printed, deposited, sputtered, or otherwise applied to the film or other substrate. For example, the dielectric can include a substantially non-electrically-conductive printable dielectric ink or similar material, or the conductive portion can comprise an electrically-conductive printable ink or similar material. In an example, the dielectric can comprise a flexible or physically compliant material.

In an example, an aluminum-covered film can provide the conductive surface for an electrode assembly, and the polymer portion can provide a backing to the aluminum and can help reinforce the film to withstand force from the supports, such as when the electrode assemblies are under a physical strain or load. A thickness of the conductive surface, or assembly, can be changed by using different films, different amounts of polymer per unit area, or different amounts of conductive material.

The sizes and shapes of the first electrode assembly 202 and the second electrode assembly 208 can be adjusted to accommodate various applications. In the example of the first clutch system 200, the first electrode assembly 202 is illustrated with a first conductive surface 204 that has a lesser width than the second conductive surface 210 of the second electrode assembly 208, In some examples, differences in width can be useful to prevent shorts or other electrical coupling about edges of the electrodes.

In operation, an electric signal such as an alternating current (AC) signal or direct current (DC) signal can be applied to the electrodes using the first lead 224 and the second lead 226. In response to the applied signal, opposite charges can accumulate on the first conductive surface 204 and the second conductive surface 210 and, in turn, an electrostatic force (e.g., an attraction or repulsion force) can develop at an interface between substantially adjacent portions of the surfaces, such as at or along an overlapping length portion of the surfaces. In the case of an attractive force, the first conductive surface 204 and the second conductive surface 210, and therefore the first electrode assembly 202 and the second electrode assembly 208, can adhere or join. The resulting electrostatic adhesion, and friction at the interface between the adjacent surfaces, can prevent relative motion and resist shear forces. That is, when the first clutch system 200 is actuated and an electrostatic attractive force exists between the first conductive surface 204 and the second conductive surface 210, any shear stress applied (e.g., a force applied parallel to the surfaces, such as to displace one of the surfaces relative to the other) can be resisted.

When the electric signal is removed or turned off, then the first conductive surface 204 and the second conductive surface 210 can be discharged and any electrostatic attraction at the interface of the surfaces can dissipate. That is, the first conductive surface 204 and the second conductive surface 210 can be disengaged and can slide relatively freely with respect to each other, such as within any bounds established by the alignment device 222 or by any other displacement limiters.

The present inventor has recognized that a force between the conductive surfaces of the first clutch system 200 can be expressed as a function of various geometric parameters and the electric constant $\varepsilon_0$. For example, under theoretical conditions where the conductive surfaces are infinitely large, each plate can produce an electric field of magnitude $E=\sigma/2\varepsilon_0 = Q/2A\varepsilon_0$, where the surface charge density on the surfaces is $\pm\sigma$ and $\sigma=Q/A$. Since both surfaces equally contribute to the resulting field, an electric field between the surfaces is $E_{total}=Q/A\varepsilon_0$ and the potential difference $V=E_{total}d$ where d is the distance between the surfaces. The present inventor has further recognized that, since the surfaces can be oppositely charged, an attractive force $F_{attractive}$ between the surfaces is equal to the electric field produced by one of the plates multiplied by the charge on the other. That is, $$F_{attractive} = Q\frac{Q}{2 \cdot A \cdot \varepsilon_0} = \frac{\varepsilon_0 \cdot A \cdot V^2}{2 \cdot d^2}$$

The equation for modeling the attractive force can be applied to determine a shear force, or holding force or clutching force, for the first clutch system 200. For example, $$F_{shear} = \frac{\mu \cdot \varepsilon \cdot \varepsilon_0 \cdot A \cdot V^2}{2 \cdot d^2},$$

where $\mu$ is the coefficient of friction between the surfaces, $\varepsilon$ is the relative permittivity of the dielectric between the surfaces, $\varepsilon_0$ is the electric constant, A is an area of the interface between the surfaces (e.g., the area of the overlapping portion), V is the voltage applied, and d is a thickness of the dielectric between the surfaces or a separation distance between the surfaces. In an example, a maximum shear force, $F_{shear}$, can be represented as a function of a constant and the normal force, $F_N$, between the surfaces in the absence of an applied voltage, or $F_{shear}=kF_N$.

Based at least in part on the theoretical or ideal equations for the forces in the first clutch system 200, the present inventor has recognized that the shear force between the surfaces is a function of the square of the voltage applied, and therefore a polarity of the voltage is effectively inconsequential. Accordingly, the present inventor has recognized that an AC drive signal can be used and, in turn, undesirable dielectric absorption in the electroadhesion system can be minimized.

Figure 2C:
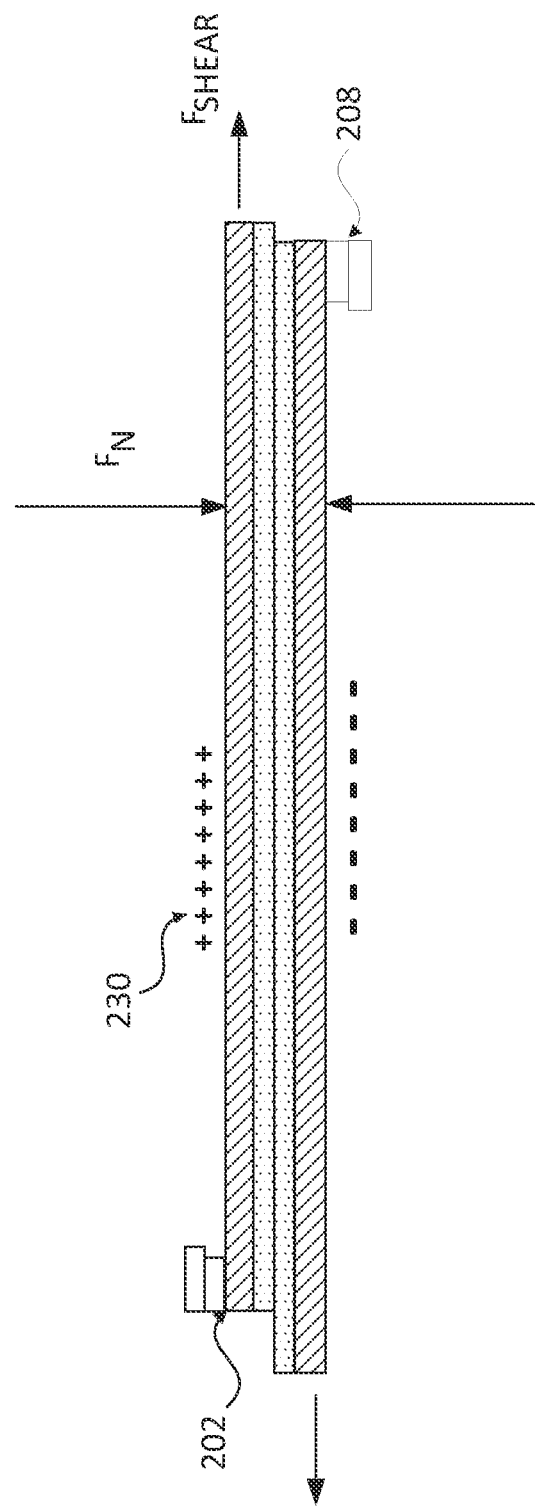
FIG. 2C illustrates generally an example of a portion of the first clutch system.

FIG. 2C illustrates generally an example of a portion of the first clutch system 200. In FIG. 2C, the first electrode assembly 202 is adjacent to the second electrode assembly 208 and a voltage signal is applied to each of the electrode assemblies. In the illustration, the "+" symbols represent a positive voltage signal applied to the first conductive surface 204 of the first electrode assembly 202 and the "−" symbols represent a negative voltage signal applied to the second conductive surface 210 of the second electrode assembly 208. As a result of the opposite-polarity signals applied, an electric field 230 is generated. In the illustrated example, the first electrode assembly 202 includes a positively charged portion that attracts a negatively, charged portion of the second electrode assembly 208. The electric field 230 causes an electrostatic force to bring the electrode assemblies together and resist a shear force, $F_{shear}$. The maximum shear force, $F_{shear}$, that the first clutch system 200 can withstand is given by the equation above, and is a function of the area about which the electric field 230 exists, the square of the voltage applied, and characteristics of the dielectric between the conductive portions of the assemblies, among other things.

In an example, multiple instances of the first clutch system 200 can be used together to provide enhanced clutching. For example, multiple instances can be provided in parallel or in series. Generally, the applications discussed herein are presented with reference to a single instance of the first clutch system 200, however, multiple instances can generally be used depending on size constraints, power constraints, and/or on performance objectives.

Figure 3:
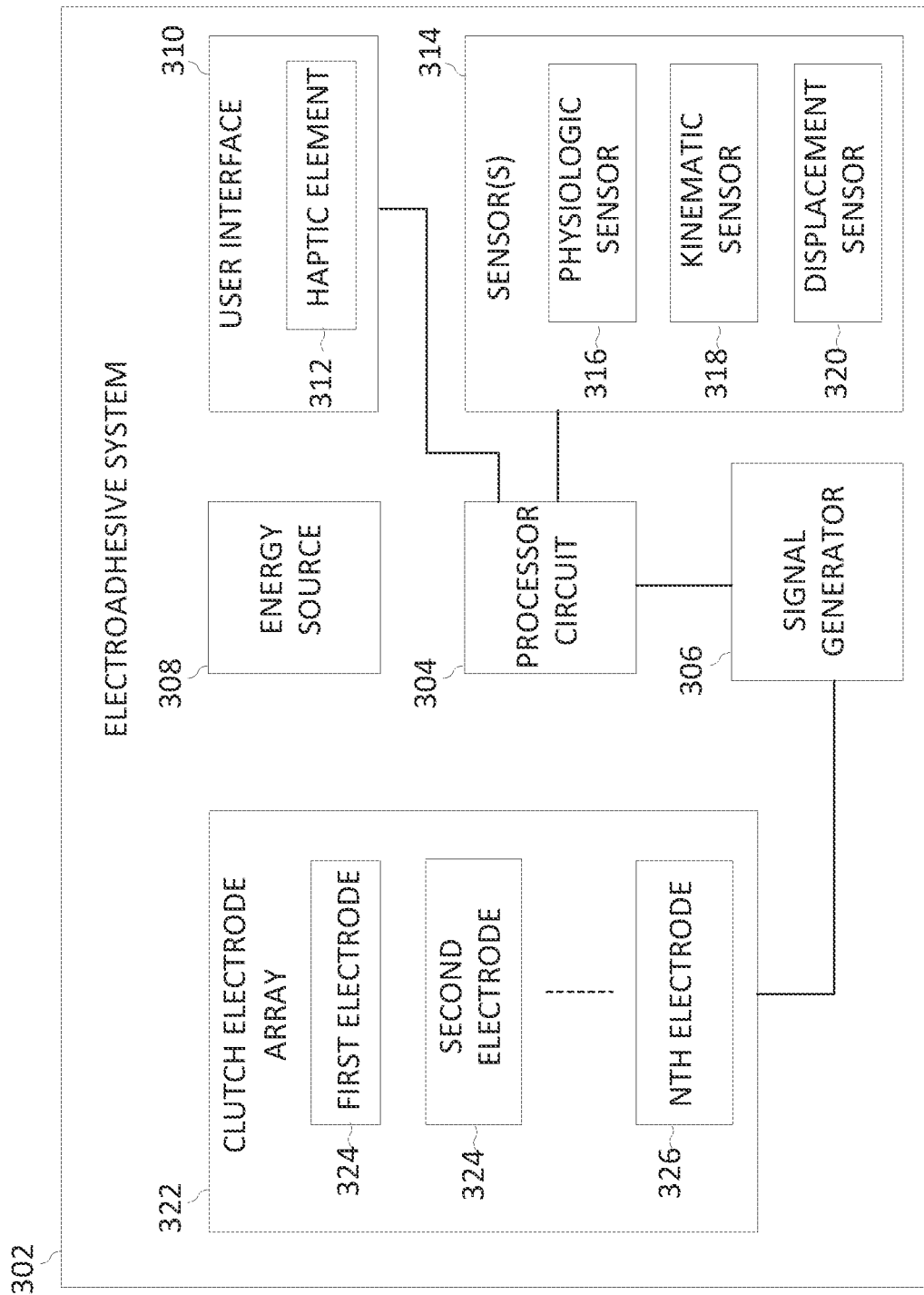
FIG. 3 illustrates generally an example of an electroadhesive system such as can include or comprise the first clutch system.

FIG. 3 illustrates generally an example of an electroadhesive system 302 such as can include or comprise the first clutch system 200. The electroadhesive system 302 can include a processor circuit 304, a signal generator 306, and a clutch electrode array 322. In an example, the electroadhesive system 302 can include an energy source 308, a user interface 310, and sensor(s) 314. In an example, one or more components of the electroadhesive system 302 can include or comprise components of the adaptive support system 100 from the example of FIG. 1C.

In the example of FIG. 3, one or more components of the electroadhesive system 302 can receive power from the energy source 308. The energy source 308 can include a battery or other source of AC or DC electrical energy. In an example, the energy source 308 includes power harvesting circuitry such as can be used to harvest power from, e.g., kinematic sources, RF or other electromagnetic sources, or elsewhere.

The processor circuit 304 can include a general-purpose or purpose-built processor as discussed elsewhere herein. The processor circuit 304 can be configured to receive information from one or more of the signal generator 306, the energy source 308, the user interface 310, the sensor(s) 314, or the clutch electrode array 322, and in response, control one or more operations of the electroadhesive system 302.

The signal generator 306 can include an electrical signal generator that is configured to provide DC or AC signals to the clutch electrode array 322. In an example, the signal generator 306 is configured to generate electric signals having characteristics that are specified by the processor circuit 304. For example, the signal generator 306 can be configured to generate electric signals having specified magnitude, frequency, pulse width, pulse or waveform morphology, or other characteristics according to instructions received from the processor circuit 304.

The clutch electrode array 322 can be configured to receive electric signals from the signal generator 306 and provide the signals to one or more electrodes, such as can comprise portions of a clutch system or clutch device. In an example, the clutch electrode array 322 includes a first electrode 324, a second electrode 326, or other electrodes, such as including an nth electrode 328. The different electrodes in the clutch electrode array 322 can be separately addressable and can receive respective different signals from the signal generator 306. In an example, each of the electrodes in the clutch electrode array 322 can comprise a portion of an electrode assembly. For example, the first electrode 324 can include or comprise the first conductive surface 204 of the first electrode assembly 202 from the example of FIG. 2A, and the second electrode 326 can include or comprise the second conductive surface 210 of the second electrode assembly 208 from the example of FIG. 2A.

In an example, the user interface 310 can include various systems or devices or modules that can be configured to provide information to, or receive information from, a user. The user can include a human operator, or an ancillary device, or other controller for the electroadhesive system 302. In an example, the user interface 310 is configured to receive instructions or information from the user about a desired behavior or operating characteristic of the electroadhesive system 302, such as can include a clutch force, clutch sensitivity, power consumption characteristic, or other information. The user interface 310 can be configured to provide feedback or other information to the user about the same or other characteristics of the system. For example, the user interface 310 can be configured to receive a user-specified indication of a clutch force to provide, and the user interface 310 can be configured to report to the same or a different user an indication of an actual clutch force applied or provided or available in the system.

In an example, the user interface 310 can include a haptic element 312. The haptic element 312 can be configured to produce or provide a haptic sensation to communicate information to the user. The information can include, for example, a clutch status indication, a clutch force indication, or other information about the electroadhesive system 302.

In an example, the electroadhesive system 302 can include or use one or more sensor(s) 314. The processor circuit 304 can receive sensor signal information from one or more of the sensor(s) 314 and, in response, control a clutching behavior or other action of the electroadhesive system 302. Various types of sensors can be used, including a physiologic sensor 316, a kinematic sensor 318, or a displacement sensor 320. In an example, the physiologic sensor 316 is configured to sense physiologic information about a user of the electroadhesive system 302. For example, the physiologic sensor 316 can include one or more of a heart rate sensor, an oxygen saturation level sensor, an ECG sensor, a pulse sensor, an acoustic sensor, an ectodermal or galvanic skin response sensor, muscle oxygen sensor, or other sensor configured to measure physiologic information about the user.

In an example, the kinematic sensor 318 can include a single-axis or multiple-axis accelerometer, gyroscope, strain sensor, inertial measurement unit (IMU) sensor, or other sensor configured to provide information about kinematics or movement of the electroadhesive system 302, or of a component of the electroadhesive system 302, or of a body or object to which the electroadhesive system 302 is coupled or configured to influence. In an example, multiple instances of the kinematic sensor 318 can be provided, such as at different locations around a body, such as to monitor motion (e.g., absolute or relative) of different segments or portions of the body. In an example, information from the kinematic sensor 318 can be used to determine an activity level, a posture, a position, or other characteristic of a body.

In an example, the displacement sensor 320 can include a device configured to measure a distance or displacement information. For example, the displacement sensor 320 can be configured to measure a relative position of different portions of the first clutch system 200. For example, the displacement sensor 320 can be configured to measure or provide information about an overlapping portion of the first electrode assembly 202 and the second electrode assembly 208, or information about an extension characteristic of the alignment device 222, or other information about an orientation or position of components of the electroadhesive system 302.

The sensor(s) 314 can include other sensors not specifically enumerated here, such as environmental sensors, global positioning system (GPS) sensors, light sensors, proximity sensors, or other sensors.

Figure 4:
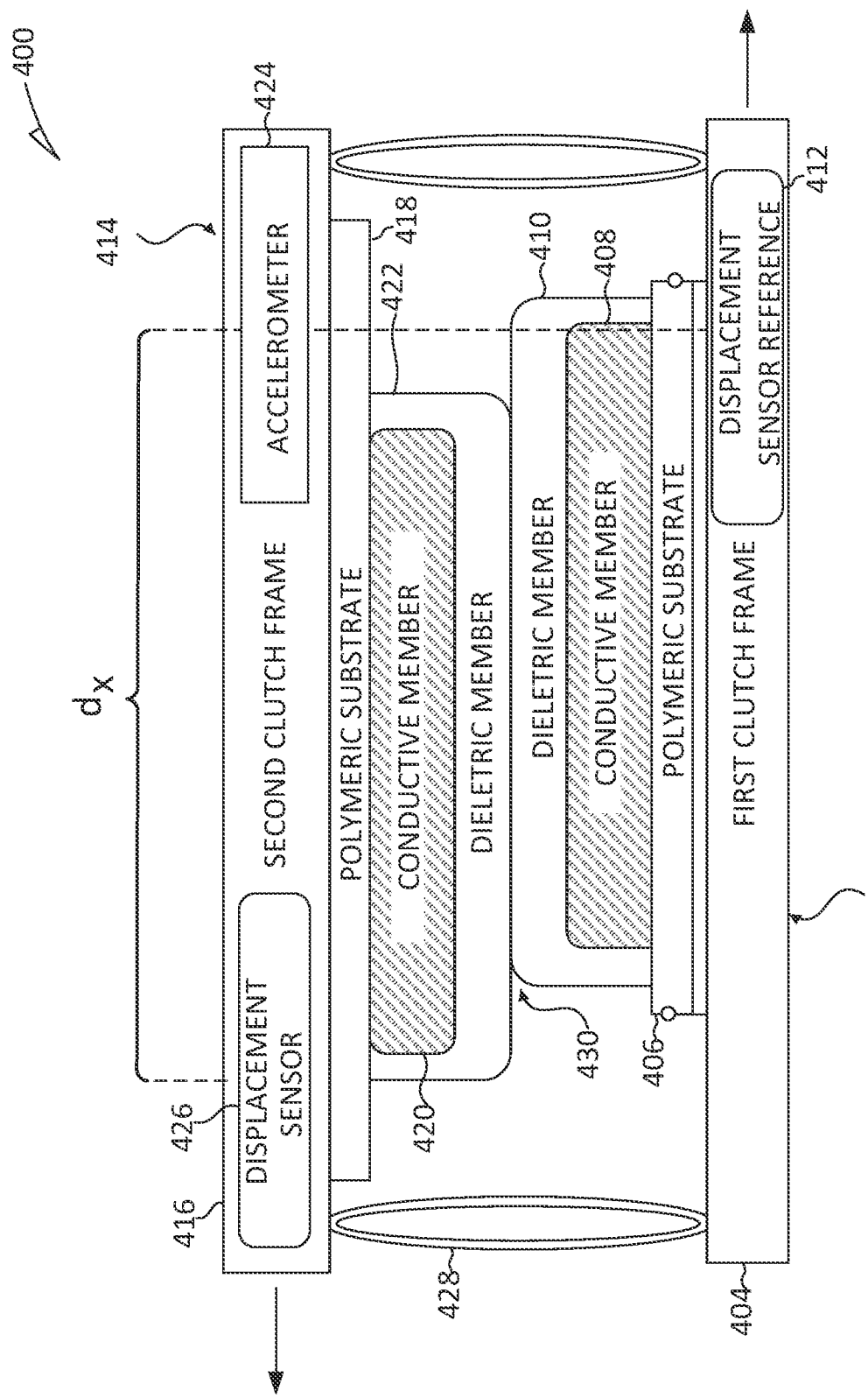
FIG. 4 illustrates generally an example of a second clutch system.

FIG. 4 illustrates generally an example of a second clutch system 400. The second clutch system 400 can include or use components of the first clutch system 200 and/or of the electroadhesive system 302. For example, the second clutch system 400 can include a reference electrode assembly 402, such as can correspond to one of the first electrode assembly 202 and the second electrode assembly 208 from the example of the first clutch system 200, and the second clutch system 400 can include a movable electrode assembly 414, such as can correspond to the other one of the first electrode assembly 202 and the second electrode assembly 208.

The reference electrode assembly 402 can include a first clutch frame 404 that anchors or references at least one electrode of the second clutch system 400 relative to the other. The movable electrode assembly 414 can include a second clutch frame 416 that is coupled to a different electrode of the second clutch system 400. In the example of FIG. 4, the reference electrode assembly 402 includes a first polymeric substrate 406 coupled to the first clutch frame 404, a first conductive member 408 coupled to the first polymeric substrate 406, and a first dielectric member 410 coupled to the first conductive member 408. The movable electrode assembly 414 similarly includes a second polymeric substrate 418, a second conductive member 420, and a second dielectric member 422.

In various examples, the first and second polymeric substrates 406, 408 are configured to provide stiffness to prevent or decrease the likelihood of the first and second electrode assemblies 202, 208 buckling or folding in use but to also be pliant so that the first clutch system 200 is useful in wearable articles as disclosed herein. In various examples, the first and second polymeric substrates 406, 418 are or include a polyolefin foam. In various examples, the polyolefin foam is applied to the respective first and second conductive members 408, 420 using an adhesive layer between the first and second conductive member 408, 420 and the polyolefin foam, in which case the adhesive layer may be understood be a part of the first and second polymeric substrates 406, 418. In various examples, the polymeric substrate has a thickness of approximately 0.25 millimeters, though greater or lesser thicknesses are contemplated as appropriate. In various examples, the first and second polymeric substrates 406, 418 are formed of 5703LE pressure sensitive adhesive foam tape.

Various components of the reference electrode assembly 402 or the movable electrode assembly 414 can comprise or correspond to components of the first electrode assembly 202 or the second electrode assembly 208 from the example of FIG. 2A, FIG. 2B, or FIG. 2C. For example, the first polymeric substrate 406 can correspond to the first support 214 or the second support 216, or the second polymeric substrate 418 can correspond to the third support 218 or fourth support 220. The first conductive member 408 can correspond to the first conductive surface 204, or the second conductive member 420 can correspond to the second conductive surface 210. The first dielectric member 410 can correspond to the first dielectric layer 206, or the second dielectric member 422 can correspond to the second dielectric layer 212. The example of the second clutch system 400 includes multiple instances of an elastic aligner 428, such as can correspond to the alignment device 222 of the first clutch system 200, and so on. As similarly explained above in the discussion of the first clutch system 200, the elastic aligner 428 can be provided to arrange or maintain the reference electrode assembly 402 and the movable electrode assembly 414 in positions such that an electric field can be generated between the first conductive member 408 and the second conductive member 420 to thereby induce an electrostatic force to hold the electrode assemblies together.

In use, the second clutch system 400 includes the first dielectric member 410 of the reference electrode assembly 402 arranged substantially adjacent to the second dielectric member 422 of the movable electrode assembly 414 at or along an interface 430. When the electrode assemblies are arranged in this manner, an electric field can be induced between the first conductive member 408 and the second conductive member 420 that, in turn, can cause an electrostatic force to join the reference electrode assembly 402 and the movable electrode assembly 414 together at the interface 430. In the absence of the electric field, the movable electrode assembly 414 can be configured to move relative to the reference electrode assembly 402. In an example, the movable electrode assembly 414 can move in a plane, such as parallel to a plane of the reference electrode assembly 402.

The example of FIG. 4 includes a first displacement sensor 426, such as can include or correspond to the displacement sensor 320 from the example of FIG. 3. The first displacement sensor 426 can be coupled to the second clutch frame 416 and can move with the second clutch frame 416. The first displacement sensor 426 can be configured to measure a distance $d_x$, such as along a particular axis, between the sensor and a reference point. The reference point can be provided by, for example, a displacement sensor reference element 412, such as can be disposed on or coupled to the first clutch frame 404, or can be provided elsewhere in the second clutch system 400. In an example, the first displacement sensor 426 can be configured to measure displacement or position information in more than one dimension, or along multiple axes. For example, the first displacement sensor 426 can be configured to measure a position of the sensor relative to the displacement sensor reference element 412 in x, y, and/or z directions.

The example of FIG. 4 includes an accelerometer 424, such as can include or correspond to the kinematic sensor 318 from the example of FIG. 3. The accelerometer 424 can be configured to measure acceleration of the second clutch frame 416 of the movable electrode assembly 414. As explained elsewhere herein, information from the accelerometer 424 can be used to determine or control actuation of the second clutch system 400 or to control a clutch force to be applied by the second clutch system 400.

In practice, when the first conductive member 408 and the second conductive member 420 are coupled to electric terminals and driven by electric signals, such as from the signal generator 306, the assembly forms a capacitor that can be charged and discharged. When a voltage between the terminals is applied, the capacitor charges and generates an attractive electrostatic force. The attractive force drives the conductive members together and thereby increases friction and inhibits any relative movement. When the voltage is removed or reduced, the electrostatic attractive force is removed or reduced, and the conductive members are effectively released and allowed to slide more freely relative to each other.

Figure 5:
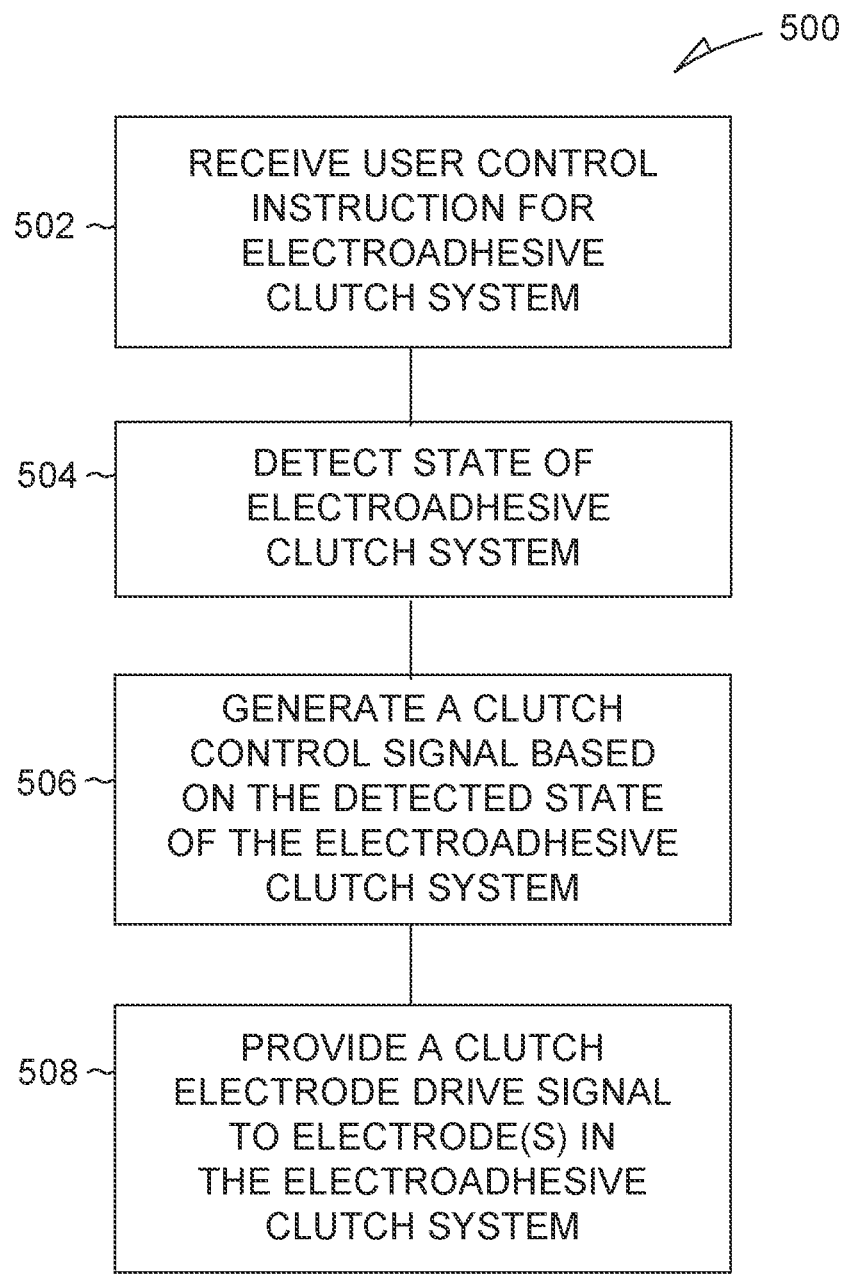
FIG. 5 illustrates generally an example of a first clutch control method.

FIG. 5 illustrates generally an example of a first clutch control method 500. The first clutch control method 500 can include or use various elements of the first clutch system 200, the electroadhesive system 302, or the second clutch system 400, or other systems or devices discussed herein.

At block 502, the first clutch control method 500 can include receiving a user control instruction for an electroadhesive clutch system. In an example, block 502 can include receiving a control instruction from a user using the user interface 310. In an example, block 502 can include receiving a control instruction from a user using one or more of the sensor(s) 314. For example, the user control instruction can include a user instruction to enable or disable a clutch system, or to control a degree or magnitude with which to operate the system. That is, the user control instruction can indicate an amount (e.g., a relative or absolute amount) of a clutching force, or shear resistance force, that the system is to provide.

At block 504, the first clutch control method 500 can include detecting or determining a state of an electroadhesive clutch system. In an example, block 504 can include using one or more of the sensor(s) 314 to determine a status, a position, or other state of the clutch system. In an example, block 504 can include determining a relative position of electrodes in the clutch system, such as using the displacement sensor 320, and providing information about the relative position to the processor circuit 304. In an example, block 504 can include determining an acceleration of the clutch system, or an acceleration of a body to which the clutch system is coupled, or acceleration of a body that the clutch system is configured to control, and providing acceleration information to the processor circuit 304.

In an example, block 504 can include measuring one or more properties of the electroadhesive system 302 or of components thereof. In an example, block 504 can include applying a filter (e.g., a smoothing filter or noise-reducing filter) or otherwise processing the measured properties to determine a location, orientation, configuration, or other information about the components of the electroadhesive system 302 or of the system itself. In an example, block 504 can include determining an alignment, a location, and/or an orientation of one or more electrode assembly components.

At block 506, the first clutch control method 500 can include generating a clutch control signal based on the detected state of the electroadhesive system from block 504. For example, block 506 can include using the processor circuit 304 to process information from the user interface 310 or from the sensor(s) 314, or from other sources, to generate a signal that can control clutching of the system. In an example, block 506 can include generating a binary on/off indication for the clutch system, or block 506 can include generating a signal that indicates a magnitude of clutching force for the system to provide. For example, block 506 can include generating different control signals corresponding to different amounts of clutching force to provide.

At block 508, the first clutch control method 500 can include providing a clutch electrode drive signal to electrodes in the electroadhesive clutch system. For example, block 508 can include using the signal generator 306 to provide DC or AC signals to the clutch electrode array 322. In an example, block 508 includes providing different electric signals to different electrodes in the clutch electrode array 322. In an example, block 508 includes providing opposite-polarity components of the same AC signal to respective different electrodes in a clutch system to thereby induce an electrostatic force between electrodes and produce a clutching force.

In an example, block 506 and/or block 508 can include using the processor circuit 304, or using another local or remote controller, to perform various calculations regarding the detected state, to use calibration information, to use information about previously-detected or stored states, to use previously-defined control parameters, or to use other information to control various aspects of the electroadhesive system 302. Results of the calculations can cause the electroadhesive system 302 to implement one of a variety of different responses or controls, such as according to an application or control algorithm. In an example, the processor circuit 304 or other controller can include state machines, feedback loops, feed-forward controllers, look-up tables (LUTs), proportional-integral-derivative (PID) controllers, parametric controllers, model-based controllers, kinematic model-based controllers, or state-space controllers, among others. Various parameters of the controller can be trained or optimized. In an example, the various parameters or algorithms can include or use machine learning or deep learning to better understand and respond to inputs, such as using information from multiple different users. In an example, a controller for the electroadhesive system 302 can be configured to improve, adapt, or otherwise reconfigure to improve or update behavior or performance of the system, such as based on patterns of use, properties (including degradation or wear-and-tear) of the system itself or components thereof, or other information.

In an example, a model-based controller for an electroadhesive clutch system can facilitate adaptation of the system to different users, such as can have different body types, or can facilitate adaptation of the system in different environments or under different conditions, such as with or without training data or a training period. For example, control model parameters can be specified or set using a priori information about a user or use case. In an example, the model can be updated based on detected changes or properties of the system or the user. For example, model parameters can be updated depending on, e.g., a shape or weight of body segments of the wearer, or a compliance of the system or the user body. In an example, a change or deviation from a model parameter can indicate a change in a component of the clutch system or a change in the user. For example, a parameter change can indicate failure or wear of a component of the system, and the user can be notified (e.g., using the user interface 310). Additionally or alternatively, the notification can be provided to a remote operator or system, such as a manufacturer or vendor who can automatically provide a replacement, thereby enhancing the user experience. In an example, a change in a model parameter can indicate a change in user gait or posture, such as can indicate injury or fatigue. The user can be notified or cautioned of such change using the user interface 310.

Figure 6:
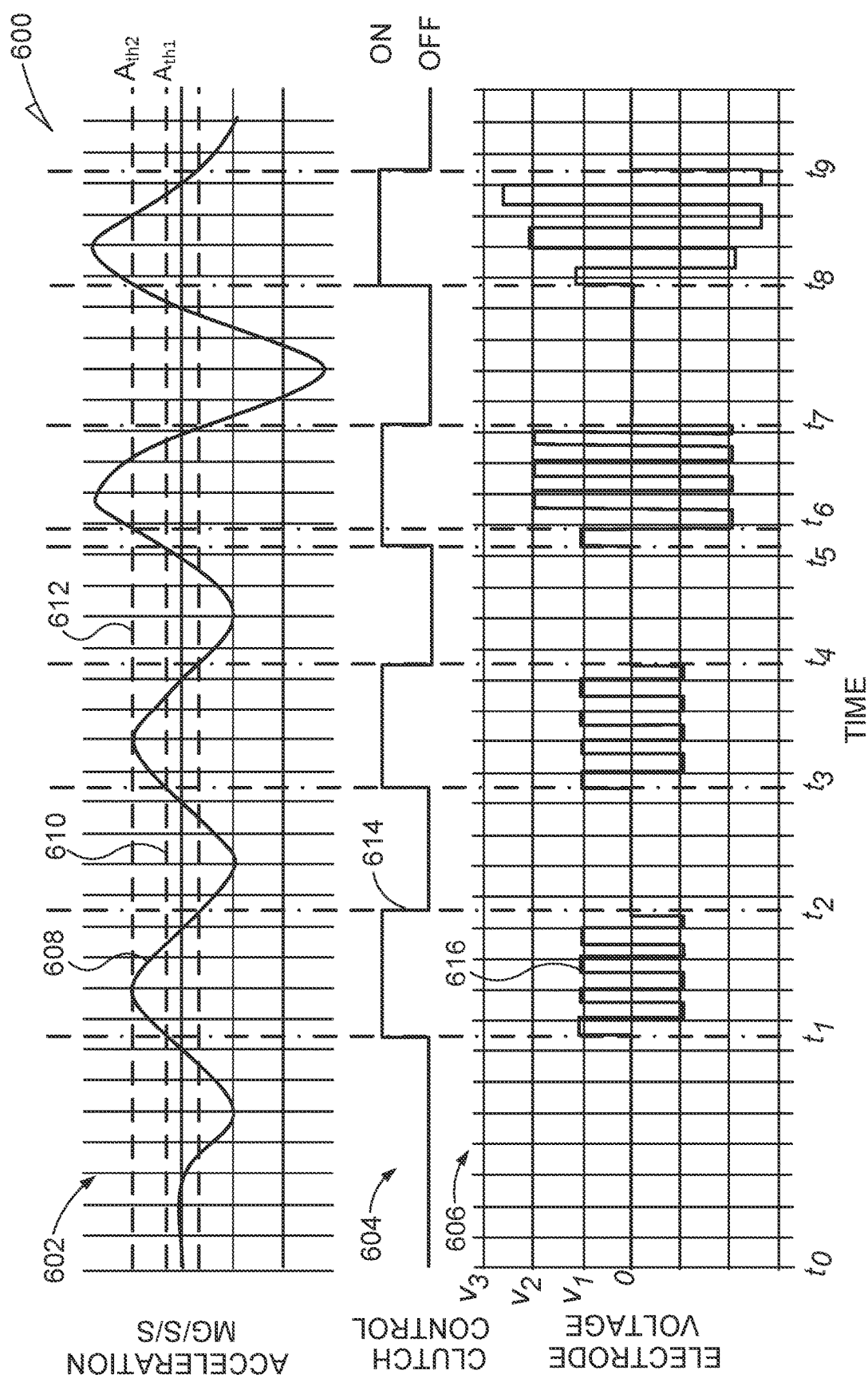
FIG. 6 illustrates generally an example of several charts showing graphically a control example for a clutch system.

FIG. 6 illustrates generally an example of several charts 600 showing graphically a control example for a clutch system. The charts 600 include an acceleration signal chart 602, a clutch signal chart 604, and a voltage signal chart 606. The charts 600 include a common time axis to illustrate generally an example of how acceleration information, clutch control, and electrode drive voltage signals can correspond.

The example of the acceleration signal chart 602 includes an acceleration signal 608, such as can be received or derived from the kinematic sensor 318 from the example of the electroadhesive system 302. The acceleration signal 608 can indicate a magnitude of an acceleration of a body, of the electroadhesive system 302, or of a component of the electroadhesive system 302. For example, the acceleration signal 608 can indicate an acceleration of a particular electrode, or electrode assembly, of a clutch system, such as described herein in the example of FIG. 4. In the example of FIG. 6, the acceleration signal 608 is illustrated generally as an oscillating signal with a moderately constant frequency and varying magnitude. In the example, a first or earlier portion of the acceleration signal 608 includes an oscillating acceleration-indicating signal having a first acceleration magnitude characteristic, and a second or later portion of the acceleration signal 608 indicates a greater second acceleration magnitude characteristic.

The acceleration signal chart 602 includes a first acceleration magnitude threshold 610 having a fixed magnitude Ath1, and a second acceleration threshold magnitude 612 having a fixed magnitude Ath2. The acceleration thresholds represent magnitude thresholds that, if exceeded, indicate a control state, or a change in a control state, for the electroadhesive system 302. For example, if the acceleration signal 608 indicates an acceleration magnitude that is less than the first acceleration magnitude threshold 610, then the system can have a first control state, and if the acceleration signal 608 indicates an acceleration magnitude that is greater than first acceleration magnitude threshold 610 and less than the second acceleration threshold magnitude 612, then the system can have a second control state; and if the acceleration signal 608 indicates an acceleration magnitude that is greater than the second acceleration threshold magnitude 612, then the system can have a third control state. Although the example of FIG. 6 illustrates the magnitude threshold conditions as fixed or static values, other magnitude threshold conditions can be used, such as based on a morphology of the acceleration signal 608; or based on absolute or relative changes in the acceleration signal 608. Fewer or greater than two threshold conditions can similarly be used; two threshold conditions are used in the example of FIG. 6 for illustrative purposes.

The example of FIG. 6 indicates that the various control states can be specified or determined based on acceleration magnitude thresholds of the acceleration signal 608. Other acceleration-based changes or triggers can similarly be used. For example, a frequency of the acceleration signal 608 can be used to trigger a change in a control state, or a change in frequency of the acceleration signal 608 can be used.

The example of the clutch signal chart 604 includes a clutch control signal 614. In the example of FIG. 6, the clutch control signal 614 is a binary signal that indicates whether a control signal for an electroadhesive clutch is on or off. In the on state, the clutch control signal 614 can indicate that an electric signal is provided to one or more electrodes in the clutch system, and in the off state, the clutch control signal 614 can indicate that the electric signal is removed or changed to a different value. In an example; when the clutch control signal 614 is high or on, the processor circuit 304 can be configured to provide a first control signal to the signal generator 306 and, in response, the signal generator 306 can provide an electric signal to one or more electrodes in the clutch electrode array 322. When the clutch control signal 614 is low or off, the processor circuit 304 can be configured to provide a second control signal to the signal generator 306 and, in response, the signal generator 306 can change a value of the electric signal provided to the one or more electrodes in the clutch electrode array 322 or the signal generator 306 can stop providing the electric signal. In an example, when the clutch control signal 614 is low or off, one or more of the electrodes in the clutch electrode array 322 can be coupled to ground or to a reference voltage source.

In an example, the clutch control signal 614 can be a multiple-valued signal having more than two states or values. That is, the clutch control signal 614 can have states or values that indicate different levels of clutch control to be provided by the system. For example, in a first state, the clutch control signal 614 can indicate zero clutching or no electric signal provided to electrodes in the clutch electrode array 322. In a different second state, the clutch control signal 614 can indicate moderate clutching or an intermediate magnitude electric signal provided to electrodes in the clutch electrode array 322. In a different third state, the clutch control signal 614 can indicate high clutching or a high magnitude electric signal provided to electrodes in the clutch electrode array 322, to thereby induce a greater electric field and greater electrostatic force than in the second state. More states with corresponding different clutch forces can similarly be used.

The example of the voltage signal chart 606 includes a clutch voltage signal 616. In the example of FIG. 6, the clutch voltage signal 616 represents a portion of a first AC signal that can be provided to one or multiple electrodes in the clutch electrode array 322, such as using the signal generator 306. For example, the clutch voltage signal 616 can represent a first AC signal that can be provided to the first electrode 324, and a complementary, inverse-polarity second AC signal can be provided to the second electrode 326, such as substantially concurrently. When the AC signals are provided, an electrostatic force can be induced between the first electrode 324 and the second electrode 326 to thereby provide a clutch force to hold the electrodes together. A magnitude of the AC signals can influence a magnitude of the resulting clutch force. For example, an increase in voltage magnitude of the AC signals can cause a corresponding increase in the clutch force, while a decrease in voltage magnitude can cause a corresponding decrease in the clutch force. In an example, a duty cycle of the AC signals can influence a magnitude of the resulting clutch force. For example, an increase in an on-time duration (e.g., providing the AC signals) can cause a corresponding increase in the clutch force, while a decrease in the on-time duration can cause a corresponding decrease in the clutch force.

For example, during a first clutch period between $t_1$ and $t_2$, the clutch voltage signal 616 can comprise an AC signal having a first AC signal magnitude $v_1$. During a subsequent second clutch period between $t_3$ and $t_4$, the clutch voltage signal 616 can comprise an AC signal having the same first AC signal magnitude $v_1$. In an example, the AC signal magnitude can be based on a magnitude of the acceleration signal 608 during the same clutch period, or can be based on a relationship between a magnitude of the acceleration signal 608 and one or more acceleration magnitude thresholds. In other words, in the example of FIG. 6, the magnitude of the clutch voltage signal 616 can depend on or can be based in part on a relationship between a magnitude of the acceleration signal 608 and the first acceleration magnitude threshold 610 and the second acceleration threshold magnitude 612. Since the acceleration signal 608 does not exceed the second acceleration threshold magnitude 612 during the first and second clutch periods, the magnitude of the clutch voltage signal 616 can be set to $v_1$.

The example of FIG. 6 includes examples of a third clutch period between $t_5$ and $t_6$, a fourth clutch period between $t_6$ and $t_7$, and a fifth clutch period between $t_8$ and $t_9$. In the example of the third clutch period, the acceleration signal 608 exceeds the first acceleration magnitude threshold 610 at time $t_5$ to thereby trigger a change in the state of the clutch control signal 614 from off to on. Since the acceleration signal 608 exceeds the first acceleration magnitude threshold 610 but not the second acceleration threshold magnitude 612 during the third clutch period, a magnitude of the clutch voltage signal 616 can be set to or maintained at the first AC signal magnitude $v_1$. In the example, the acceleration signal 608 can exceed the second acceleration threshold magnitude 612 at time $t_6$ and, in response, the magnitude of the clutch voltage signal 616 can change from the first AC signal magnitude $v_1$ to a second AC signal magnitude $v_2$. That is, a magnitude of the voltage signal provided to one or more electrodes in the clutch system can increase in response to information about a corresponding increase in acceleration. In the example of FIG. 6, the clutch voltage signal 616 exhibits a stepwise change from the third clutch period to the fourth clutch period, such as due to changes in the acceleration signal 608 over the same time interval corresponding to the third and fourth clutch periods.

In an example, the clutch voltage signal 616 can be controlled or can change in other than a stepwise manner. For example, a magnitude of the clutch voltage signal 616 can depend more directly or analogously from a magnitude of the acceleration signal 608. That is, since the acceleration signal 608 can indicate or can be a surrogate for a clutch force demand (e.g., due to motion or a change in motion of a body or other object), the processor circuit 304 and the signal generator 306 can change a magnitude of one or more drive signals for clutch electrodes in the clutch electrode array 322 depending on a magnitude of the acceleration signal 608. In the example of FIG. 6, the fifth clutch period shows an example of a clutch voltage signal 616 having a magnitude envelope or morphology characteristic that generally corresponds to an envelope or morphology characteristic of the acceleration signal 608 at the corresponding time. In other words, a magnitude of the clutch voltage signal 616 can increase in correspondence with an increase in a magnitude of the acceleration signal 608. In the example of FIG. 6, the magnitude of the clutch voltage signal 616 increases to about a third AC signal magnitude $v_3$, such as can correspond to a peak value of a magnitude of the acceleration signal 608. In an example, changes in magnitude of the clutch voltage signal 616 can track changes in the acceleration signal 608 more or less immediately, or changes in magnitude of the clutch voltage signal 616 can be a function of a change in the acceleration signal 608. For example, change magnitude information from the acceleration signal 608 can be smoothed and the smoothed information can be used to control the magnitude of the clutch voltage signal 616.

In an example, a frequency of the clutch voltage signal 616 can be fixed or dynamic. For example, a frequency of the clutch voltage signal 616 can depend on, among other things, a magnitude of the acceleration signal 608, a frequency of the clutch control signal 614, a power or battery status of the clutch system, a user preference, or other frequency control indicator. In the example of FIG. 6, the frequency of the clutch voltage signal 616 is substantially the same in the first, second, third, and fourth clutch periods, and the frequency of the clutch voltage signal 616 is reduced in the fifth clutch period. Other clutch voltage signal 616 frequencies or frequency changes can similarly be used, such as depending on a desired behavior or power consumption characteristic of the clutch system.

The present inventor has recognized, among other things, that a problem to be solved includes rapidly actuating the clutch system between on and off states. For example, the problem can include cycling the clutch system between on and off (e.g., powered and unpowered) states at a rate of at least about 60 Hz, or 120 Hz, or a greater rate. That is, the problem can include providing an effective clutch that can change between an electrostatically-active or gripping state, and an electrostatically-inactive or relaxed state, such as multiple times per second. The problem can include managing dielectric absorption in an electroadhesive system, such as in the first clutch system 200, the electroadhesive system 302, or the second clutch system 400, among others, such as can develop in capacitive, or capacitor-like, components of the system. The phenomenon of dielectric absorption can be understood in practice to represent an undesired accumulation of charge on or between electrodes in the system. Dielectric absorption in a clutch system can arise particularly when relatively high voltage stimulus signals are applied to clutch electrodes for a relatively long period of time.

For example, the first clutch system 200 can include the first electrode assembly 202 and the second electrode assembly 208 in a configuration that can be susceptible to dielectric absorption. The first conductive surface 204 and the second conductive surface 210 can act like plates of a capacitor, and capacitors are understood to exhibit effects of dielectric absorption. If the clutch system is charged, for example to actuate the clutch, then discharged and open-circuited, a voltage can develop between the conductive surfaces due to dielectric absorption. That is, even without reconnecting the first conductive surface 204 and the second conductive surface 210 to a voltage source such as the signal generator 306, the "capacitor" comprising the first conductive surface 204 and the second conductive surface 210 can exhibit a voltage memory due to the influence of a voltage stimulus or actuation signal on the dielectric molecular dipoles that comprise the different assemblies. In other words, the clutch system can be susceptible to dielectric absorption or residual voltage effects that can compromise an efficacy of the system, and can compromise a rate at which the system can cycle between on and off states. For example, if a residual voltage exists between the first conductive surface 204 and the second conductive surface 210, then the clutch can be prevented from completely disengaging between clutch cycles, or the system or components thereof can be inadvertently or intermediately actuated, such as at an intermediate clutching position that can be detrimental or adverse to a desired behavior of the system and therefore can be detrimental to a user experience.

The present inventor has recognized that a solution to the rapid actuation problem can include addressing dielectric absorption in the clutch system. The solution can include, for example, actuating the system using a voltage stimulus signal with a polarity that varies over time, that is, using an alternating current (AC) signal, such as the clutch voltage signal 616 in the example of FIG. 6. The present inventor has recognized that the shear force, $F_{shear}$, of the clutch system is a function of the applied voltage squared, and the shear force is therefore independent of a polarity of the applied drive voltage. In other words, the present inventor has recognized that stimulating a clutch system using the AC clutch voltage signal 616 can be beneficial relative to DC drive signals because the AC signal can help reduce bulk charge, or effects of dielectric absorption, without adversely affecting the maximum shear force.

Electric drive signals for an electroadhesive clutch system can range from a few volts to hundreds of volts. Various mechanical features can be used to help physically isolate electrodes of a clutch system and thereby prevent electrical contact between an electrode and another object. For example, the mechanical features can help prevent contact between two or more active electrodes that could cause a short circuit, or can be used to help prevent contact between an electrode and other sensitive objects or surfaces, such as body tissues.

Figure 7A:
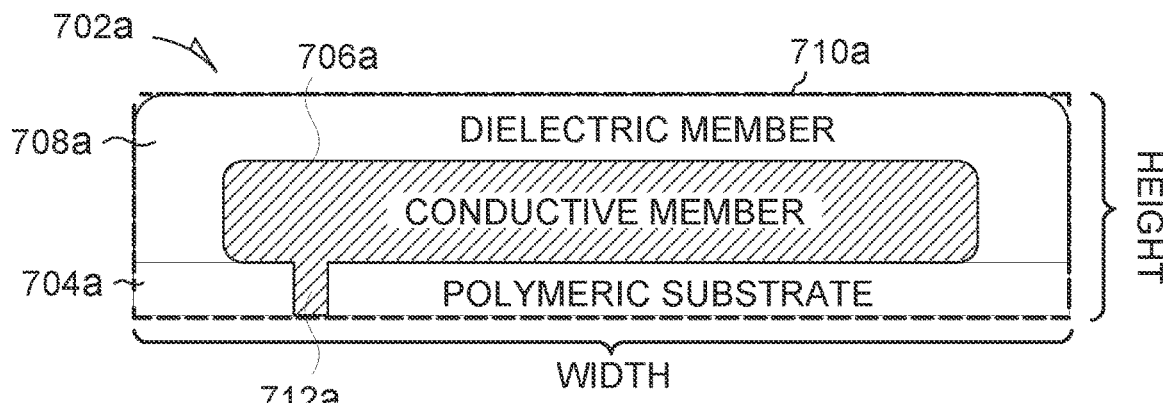
FIG. 7A, FIG. 7B, and FIG. 7C illustrate generally examples of cross-section views of different electrode assemblies for a clutch system.
Figure 7B:
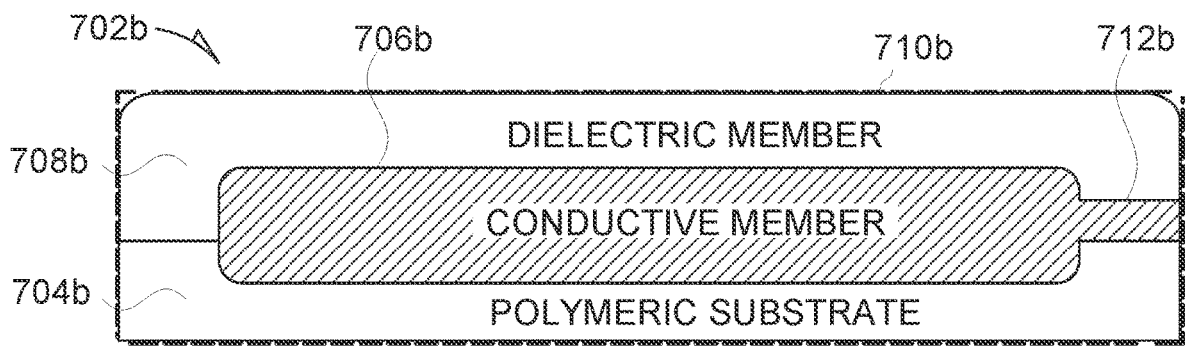
Figure 7C:
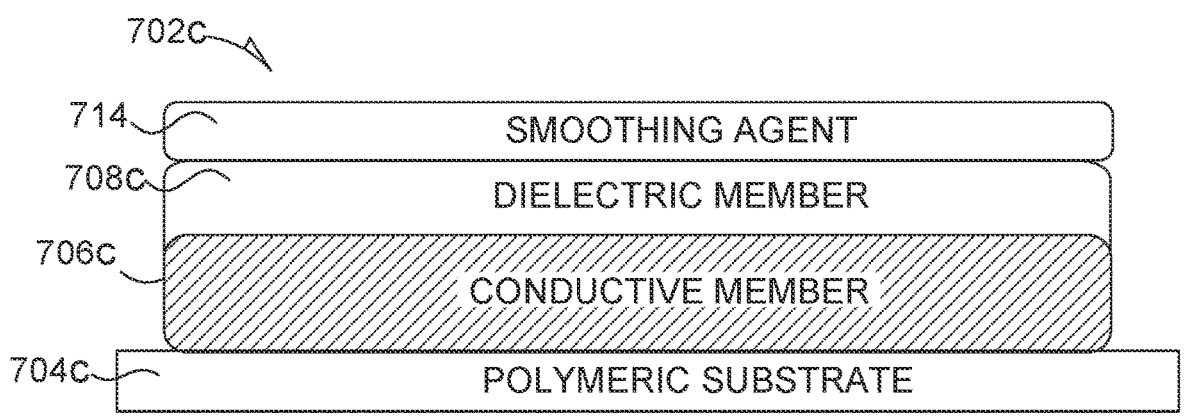

FIG. 7A, FIG. 7B, and FIG. 7C illustrate generally examples of cross-section views of different electrode assemblies for a clutch system, and the electrode assemblies can include various isolation features. For example, FIG. 7A includes a cross-section view of a first example assembly 702a. The first example assembly 702a can comprise or correspond to one or more of the other electrode assemblies discussed herein. In the example of FIG. 7A, the first example assembly 702a includes a first conductive member 706a that is enclosed by a first electrode housing 710a. In an example, the first electrode housing 710a hermetically seals the first conductive member 706a and insulates it from the environment.

The first electrode housing 710a can comprise at least a first polymeric substrate 704a and a first dielectric member 708a. In the example of FIG. 7A, a bottom surface of the first conductive member 706a is coupled to a top surface of the first polymeric substrate 704a. The first conductive member 706a can be deposited or otherwise attached to the first polymeric substrate 704a, such as along their respective adjoining or adjacent surfaces. In the example of FIG. 7A, the first dielectric member 708a can be coupled about other sides or surfaces of the first conductive member 706a. For example, the first dielectric member 708a can be provided about or can be coupled to top and side surfaces of the first dielectric member 708a, and the first dielectric member 708a can be coupled to the first polymeric substrate 704a to thereby enclose the first conductive member 706a between the first dielectric member 708a and the first polymeric substrate 704a.

The first example assembly 702a includes a first conductive lead 712a extending through the first polymeric substrate 704a to provide an electrical signal communication path between the first conductive member 706a and an access terminal in the first electrode housing 710a. In an example, the resulting signal communication path can be used to couple the first conductive member 706a to the signal generator 306.

FIG. 7B includes a cross-section view of a second example assembly 702b. The second example assembly 702b can comprise or correspond to one or more of the other electrode assemblies discussed herein. In the example of FIG. 7B, the second example assembly 702b includes a second conductive member 706b that is enclosed by a second electrode housing 710b. In an example, the second electrode housing 710b hermetically seals the second conductive member 706b and insulates it from the environment.

The second electrode housing 710b can comprise at least a second polymeric substrate 704h and a second dielectric member 708b. In the example of FIG. 7B, at least a portion of side and bottom surfaces of the second conductive member 706b can be coupled to or embedded in the second polymeric substrate 704h. In the example of FIG. 7B, the second dielectric member 708b can be coupled about other sides or surfaces of the second conductive member 706b. For example, the second dielectric member 708b can be provided about or can be coupled to a top surface of the second dielectric member 708b and can be coupled about all or portion of the side surfaces of the second dielectric member 708b. The dielectric member and the polymeric substrate can be coupled to thereby enclose the second conductive member 706b between the second dielectric member 708b and the second polymeric substrate 704b.

The second example assembly 702b includes a second conductive lead 712b extending away from the second conductive member 706b and to or through the second electrode housing 710b. In the example of FIG. 7B, the second conductive lead 712b is disposed on or between the second polymeric substrate 704h and/or the second dielectric member 708b to provide an electrical signal communication path between the second conductive member 706b and an access terminal in the second electrode housing 710b. Other conductive lead configurations or attachments can similarly be used to provide electrical communication between, for example, the signal generator 306, and a conductive member of an electrode assembly in a clutch system.

FIG. 7C includes a cross-section view of a third example assembly 702c. The third example assembly 702c can comprise or correspond to one or more of the other electrode assemblies discussed herein. In the example of FIG. 7C, the third example assembly 702c can comprise at least a third conductive member 706c coupled between a third polymeric substrate 704c and a third dielectric member 708c. In the example of FIG. 7C, a bottom surface of the third conductive member 706c is coupled to a top surface of the third polymeric substrate 704c. The third conductive member 706c can be deposited or otherwise attached to the third polymeric substrate 704c, such as along their respective adjoining or adjacent surfaces. In the example of FIG. 7C, the third dielectric member 708c can be coupled to an opposite second side of the third conductive member 706c, such as without being coupled to or along side surfaces of the third conductive member 706c. Sides of the third conductive member 706c can be uncovered or exposed, such as to facilitate coupling with external circuitry such as the signal generator 306.

The example of FIG. 7C comprises a smoothing agent 714 that is provided on or coupled to the third dielectric member 708c. The smoothing agent 714 can comprise a material that is configured to smooth or fill any irregularities in a surface of the third dielectric member 708c to thereby provide a surface with a low coefficient of friction. In an example, a clutch system can include a pair of electrode assemblies and at least one of the assemblies can comprise the smoothing agent. When the assemblies are provided adjacent to each other, in a surface-to-surface manner, and subjected to the repetitive stress of the surfaces sliding or moving relative to each other, the smoothing agent can help facilitate longer system life and reduce wear and tear on the electrode assembly or assemblies. In an example, the smoothing agent 714 can include an ink-based, polymer-based, or other printable material that can be deposited in a relatively thin layer on the third dielectric member 708c. In an example, the smoothing agent 714 can have a similar dielectric permittivity characteristic as the third dielectric member 708c.

In an example, a meniscus of the smoothing agent 714 can reduce a surface energy characteristic of the dielectric member 708c, and the meniscus can help initiate electroadhesion.

The smoothing agent 714 can help fill in pores or voids (e.g., defects) in the dielectric member 708c which can short through the lower permittivity air. In an example, the smoothing agent 714 can include polydimethylsiloxane (PDMS) or other silicon hydraulic oil or grease.

In the examples of the first example assembly 702a, the second example assembly 702b, or the third example assembly 702c, the respective dielectric or polymeric materials can be preexisting materials or sub-assemblies, or they can comprise materials that are printed, deposited, or otherwise formed at a point of assembly of an electrode assembly. For example, an electrode assembly can comprise a film-based polymeric substrate upon which the conductive member can be printed or deposited. The dielectric member can comprise a dielectric material that can be deposited or printed, or over-printed, on top of the conductive member and polymeric substrate. By over-printing, the dielectric material can be joined to the polymeric substrate, or other interposing material, such as illustrated in the examples of FIG. 7A and FIG. 7B. In an example, the dielectric material or the smoothing agent 714 can comprise a printed material that is deposited in multiple passes or layers to help maximize uniformity of coverage. In some examples, the smoothing agent 714 or the dielectric material can be printed or deposited in a patterned or irregular manner to provide different friction characteristics or clutch behavior.

In an example clutch system, electrode assemblies in a particular pair of electrode assemblies can be similarly or differently configured. For example, height, length or width characteristics of the assemblies, or of components of the assemblies, can be similar or different. In an example, different electrode assemblies in the same pair can have different length or width characteristics, such as to facilitate or accommodate a relatively wider range of relative motion (e.g., in multiple directions, such as along different axes) between the assemblies. Providing some clearance or room for lateral movement of one assembly relative to another can help reduce repetitive wear that can form grooves or depressions in the assembly surfaces.

Figures 8A, 8B:
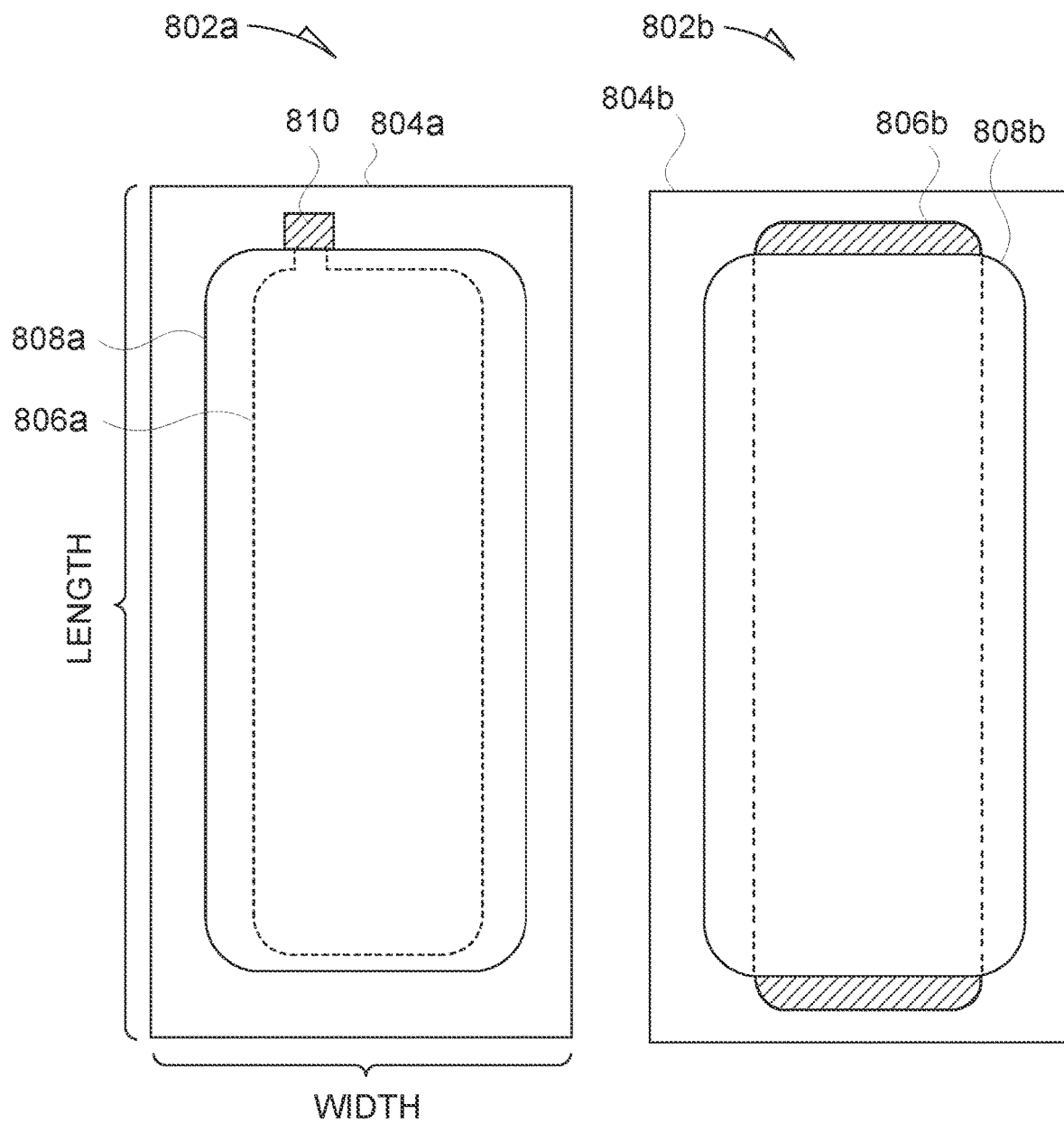
FIG. 8A and FIG. 8B illustrate generally examples of top views of different electrode assemblies for a clutch system.

FIG. 8A and FIG. 8B illustrate generally examples of top views of different electrode assemblies for a clutch system, and the electrode assemblies can include various isolation features or components that can help minimize or prevent contact between conductive portions and other objects. For example, FIG. 8A includes a top view of a fourth example assembly 802a. The fourth example assembly 802a can comprise or correspond to one or more of the other electrode assemblies discussed herein. In the example of FIG. 8A, the fourth example assembly 802a includes a fourth conductive member 806a that is at least partially enclosed by a housing that comprises a fourth polymeric substrate 804a and a fourth dielectric member 808a. In the example of FIG. 8A, the fourth dielectric member 808a is deposited over top and side surfaces of the fourth conductive member 806a, such as similarly illustrated in the cross-section view examples of FIG. 7A and FIG. 7B. The example of FIG. 8A includes a third conductive lead 810 that provides an electrical signal path between a drive signal source, such as the signal generator 306, and the fourth conductive member 806a.

FIG. 8B includes a top view of a fifth example assembly 802b. The fifth example assembly 802b can comprise or correspond to one or more of the other electrode assemblies discussed herein. In the example of FIG. 8B, the fifth example assembly 802b includes a fifth conductive member 806b that is partially enclosed by a housing that comprises a fifth polymeric substrate 804b and a fifth dielectric member 808b. In the example of FIG. 8B, the fifth dielectric member 808b is deposited over top and lengthwise side surfaces of the fifth conductive member 806b. Widthwise side surfaces of the fifth conductive member 806b can be exposed or uncovered by the fifth dielectric member 808b. The examples of FIG. 8A and FIG. 8B illustrate generally that side surfaces can be partially or entirely covered or encapsulated by the substrate and dielectric media and other permutations and configurations than those that are illustrated can similarly be used.

FIG. 9A, FIG. 9B, FIG. 9C, and FIG. 9D illustrate generally top views of examples of various electrode assembly components or assemblies. As similarly explained elsewhere herein, when conductive components of different electrode assemblies are provided adjacent to each other in a clutch system, an electrostatic force can be developed to hold the assemblies together. A magnitude of the force can depend on the electric signal that is used to drive the electrode assemblies, and can depend on a configuration of the conductive components themselves. That is, the present inventor has recognized that a magnitude of a clutch force in a clutch system can be controlled at least in part by a geometry or shape of a conductor which, in turn, can influence a distribution density of an electric field about the conductor when it receives an electric signal, such as from the signal generator 306.

Figure 9A:
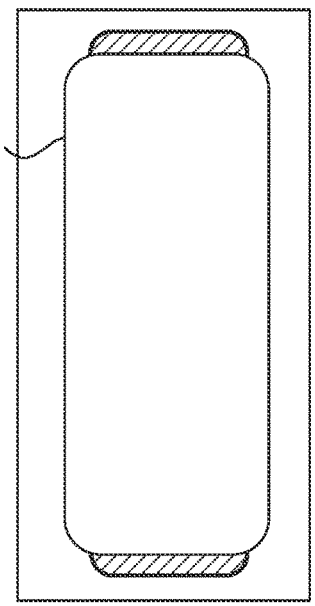
FIG. 9A, FIG. 9B, FIG. 9C, and FIG. 9D illustrate generally top views of examples of various electrode assembly components or assemblies.

For example, FIG. 9A illustrates generally an example of a sixth example assembly 902a that includes a substrate component, a conductive member, and a dielectric component, such as similarly illustrated in the example of FIG. 8B. In the example of FIG. 9A, the dielectric component includes a dielectric gradient member 904. The dielectric gradient member 904 can comprise a dielectric material that is deposited unevenly or irregularly about a top surface of the conductive member. In an example, the gradient can represent a variable thickness of the dielectric gradient member 904 or can represent a variable permittivity characteristic of the dielectric component. The variable thickness or permittivity characteristic of the dielectric gradient member 904 can influence a behavior or power consumption of a clutch system that comprises the sixth example assembly 902a.

Figure 9B:
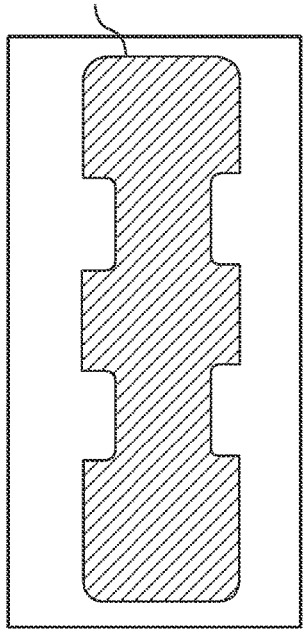

FIG. 9B illustrates generally an example of a seventh example assembly 902b that includes a substrate component and a conductive member. A dielectric component can optionally be included in an electrode assembly that includes the seventh example assembly 902b, but such dielectric is omitted from the illustration. The seventh example assembly 902b includes an irregular conductive member 906. That is, the irregular conductive member 906 can include a conductive member that is similar to one or more of the other conductive members or components discussed elsewhere herein, however, the irregular conductive member 906 includes side edge features, surface features, or other features that are irregular in shape. In the example of FIG. 9B, notches are carved out of the lengthwise side surfaces of the conductive member.

When the irregular conductive member 906 receives a drive signal, such as from the signal generator 306, the irregular conductive member 906 can provide an electric field about its surface area. Since the surface area is irregular, the resulting electric field can be non-uniform. As a result, a behavior of a clutch system that comprises the seventh example assembly 902b can be different than the behavior of a system with more uniform conductive members.

In some examples, the seventh example assembly 902b can be used where a clutch system features different, discrete "stops" or clutch positions. The positions can correspond to particular electrode orientations. For example, a clutch system can be configured to stop where relatively wider portions of respective adjacent conductive members overlap in different electrode assemblies, such as because a greater magnitude of an electric field can be generated between such areas due to their relatively larger surface areas. Narrower portions can exhibit smaller fields and can encourage the assembly to "slip" or move into one of the discrete positions.

Figure 9C:
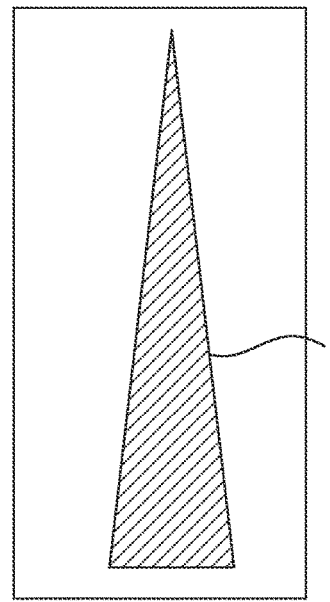

FIG. 9C illustrates generally an example of an eighth example assembly 902c that includes a substrate component and a conductive member. A dielectric component can optionally be included in an electrode assembly that includes the eighth example assembly 902c, but such dielectric is omitted from the illustration. The eighth example assembly 902c includes a tapered conductive member 908. In the example, the tapered conductive member 908 has a greater conductive surface area characteristic, per substrate unit area, near a first side of the eighth example assembly 902c and a lesser conductive surface area characteristic, per substrate unit area, near an opposite second side of the eighth example assembly 902c. Similarly to the example of FIG. 9B, clutching behavior of a clutch system that comprises the eighth example assembly 902c can be influenced or changed by the shape and orientation of the tapered conductive member 908.

Figure 9D:
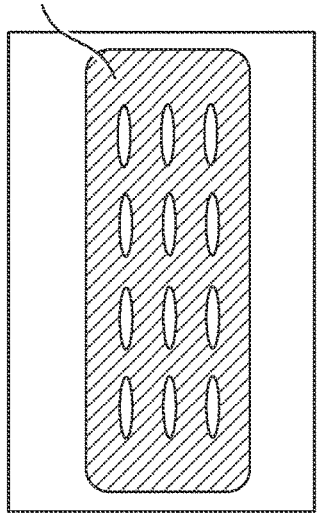

FIG. 9D illustrates generally an example of a ninth example assembly 902d that includes a substrate component and a conductive member. A dielectric component can optionally be included in an electrode assembly that includes the ninth example assembly 902d, but such dielectric is omitted from the illustration. The ninth example assembly 902d includes a perforated conductive member 910. The perforated conductive member 910 can be configured with various sizes, shapes, or orientations of perforations or through-holes that, in turn, can influence an electric field when the example assembly is driven with an electric signal. In an example, perforations can be distributed regularly or irregularly to thereby provide different electric fields.

In an example, a clutch system can comprise electrodes or conductive members or conductors that are similarly or dissimilarly configured. For example, the seventh example assembly 902b can be provided as a first electrode assembly in a clutch system opposite the eighth example assembly 902c. In another example, two separate instances of the seventh example assembly 902b can be provided in a clutch system. In another example, the sixth example assembly 902a can be provided as a first electrode assembly in a clutch system opposite the ninth example assembly 902d. Other combinations and permutations of different electrode conductor types, shapes, sizes, and orientations can similarly be used to provide different types of clutching behavior and different amounts of clutch force.

Figure 10A:
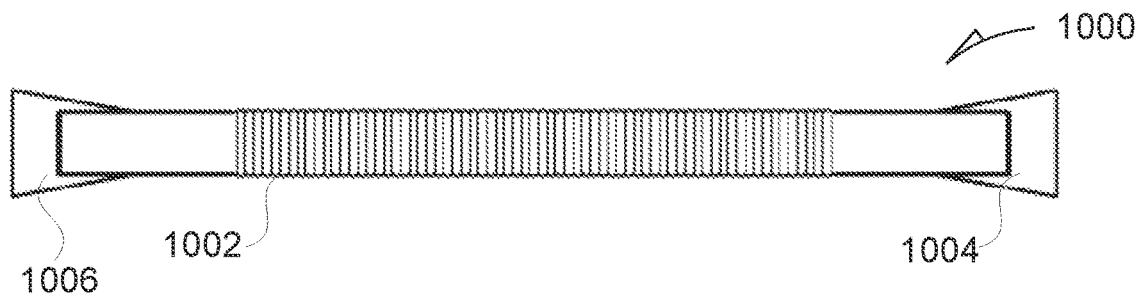
FIG. 10A, FIG. 10B, and FIG. 10C include views of an encapsulant example for an electroadhesive clutch device.

FIG. 10A includes a first view of an encapsulant example 1000 for an electroadhesive clutch device such as for use with an article of apparel. The encapsulant example 1000 can be made of a flexible or compliant material and can form a protective enclosure for electrodes or electrode assemblies that comprise a clutch device. Other components or devices of a clutch system, such as an electrical signal generator, accelerometer, or other device, can be provided inside the enclosure.

In FIG. 10A, the encapsulant example 1000 comprises an elongate sleeve, or hollow tube 1008, in which electrodes of a clutch device can be provided. The electrodes can be configured to slide laterally relative to each other when the clutch device is disengaged, and the tube or sleeve can be configured to correspondingly expand or contract such that the electrodes are retained therein. In an example, the encapsulant example 1000 includes a first end 1004 and a second end 1006. The encapsulant example 1000 can be attached to a textile or an article of apparel at each of the first end 1004 and the second end 1006. One or both of the first or second ends may help form a watertight seal to protect the contents within the hollow tube 1008 (shown in FIG. 10C). The tube 1008, or elongate flexible encasing, can be made of an elastic material and may also include a ribbed texture. The ribbed texture is comprised of a rubberized material. The encasing may include a water-repellant finish on an outer-facing surface of the encasing.

In an example, a first electrode assembly of an electroadhesive clutch can be fixed to a first end of the elongate flexible encasing and a second electrode assembly of the electroadhesive clutch can be fixed to a second end of the elongate flexible encasing. A central or middle section of the elongate flexible encasing is configured to move relative to the first and second electrode assemblies. The elongate flexible encasing can form an airtight fit around the first and second electrode assemblies.

In an example, the flexible encasing is made of a thermoplastic polyurethane coated stretch knit material. The flexible encasing can be made of polyurethane-coated 4-way stretch material such as spandex, such as made of tricot polyester (e.g., 85% polyester, 15% spandex blend). The flexible encasing can be substantially windproof and waterproof and can be made of a stretchable fabric such as a thin neoprene material with a black polyurethane coating.

In another example, the encasing is made to be watertight, water-resistant, water-repellant, or any variation thereof. The encasing can be made to conform to various standards related to water ingress. For example, the encasing can conform to consumer electronics water ingress standards as described by the Ingress Protection Code (IPC), such as at IPX2, IPX7, IPX8 or other suitable water ingress protection levels. The IPC test IPX2 involves dripping water when tilted up to 15° and states that vertically dripping water shall have no harmful effect when the enclosure is tilted at an angle up to 15° from its normal position. The test duration is 10 minutes and involves a water volume equivalent to 3 mm rainfall per minute.

The IPC test IPX7 involves immersion up to 1 meter, and states that ingress of water in harmful quantity shall not be possible when the enclosure is immersed in water under defined conditions of pressure and time (e.g., up to 1 meter of submersion). The test duration is 30 minutes, and immersion at a depth of at most 1 m measured at the bottom of the device, and at least 15 cm measured at the top of the device.

The IPC test IPX8 involves immersion beyond 1 meter, for example, at 3-5 ATM, such as can be substantially equivalent to 30 m or 50 m of water depth. This test helps determine whether equipment is suitable for continuous immersion in water under conditions specified by a manufacturer.

The International Electrotechnical Commission (IEC) standard 60529 (or, equivalently, the European standard EN 60529) classifies and rates the degree of protection provided by mechanical casings and electrical enclosures against intrusion, dust, accidental contact, and water. Other standards to which or with which water ingress may be measured or evaluated may include IEC standard 60529, MIL-STD-810, and/or DIN 40050-9.

In an example, an electroadhesive device that includes the encasing can be made to drape with a similar or same property of drape as a fabric to which the encasing is applied. Drape refers generally to a fabric shape or profile when held at an edge, or refers to a way in which a fabric covers an object when used as a tablecloth or a skirt, often referred to in the latter cases as the fabric formability, as may result from the subject material's response to gravity under its own weight. An electroadhesive device (e.g., an electroadhesive clutch and encasing) can, in an example, have substantially the same drape property as a fabric with which the device is used. For example, the electroadhesive device components and encasing can be made corresponding to the drape coefficient of fabrics or other textiles with which they are used, as can be determined using the techniques described in ISO standard 9073-9:2008 regarding determination of drape coefficients.

Figure 10B:
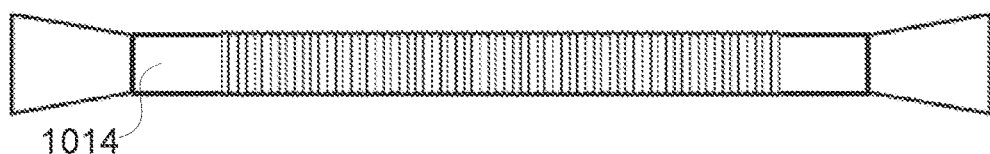

FIG. 10B includes a second view of the encapsulant example 1000 from a rear side of the device. In some examples, the body of the encapsulant example 1000 may include ribbing 1002 or other suitable texture for visual conformity with the article of apparel. The ribbing 1002 may also serve as a functional mechanism to provide a friction hold between the encapsulant example 1000 and a textile of the article of apparel. The ribbing 1002 may be made of rubber, silicone, or other compliant material with a relatively high coefficient of friction. Further, all or a portion of an outer surface 1014 of the encapsulant example 1000, such as including the portion with the ribbing 1002, may be coated in a water-proof or water-repellant finish. The ribbing 1002 may be located on a body of the encapsulant example 1000, on one side of the encapsulant example 1000, on both sides of the encapsulant example 1000, or any other suitable combination.

For example, the ribbing material can be created by bonding a four-way stretch material (e.g., Spandex or other suitable material) to an elastic banding material. The elastic banding material can be bonded to the encasing (e.g., to the encapsulant example 1000) with a heat activated film (e.g., NASA-T by Sampo Corp.). By way of the bonding, the encasing gathers and forms a ribbed pattern.

Figure 10C:
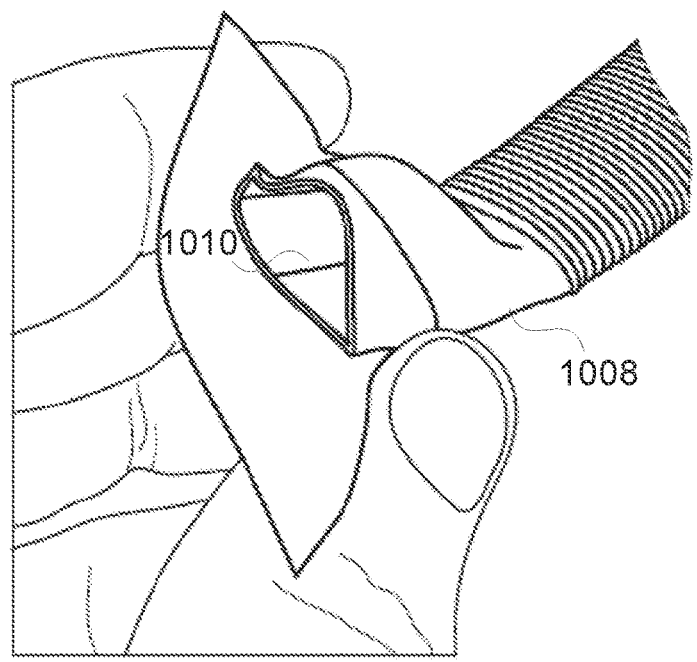

FIG. 10C illustrates a third and side-end view of the encapsulant example 1000. The first and second electrode assemblies may be inserted into the encapsulant example 1000 at an opening 1010. That is, the electrode assemblies can be introduced into the encapsulant example 1000 such that they can be encapsulated laterally within or inside of the hollow tube 1008. Other components such as the signal generator 110, the accelerometer 124, or sensors 120 can additionally or alternatively be inserted and encapsulated within encapsulant example 1000. The encapsulant example 1000 may form an airtight fit or hermetic seal around the first and second electrode assemblies along with any other components that are also enclosed. The encapsulant can be configured to stretch in lateral and/or longitudinal directions.

In an example, the encapsulant or housing helps bias the enclosed first and second electrode assemblies toward each other to encourage the assemblies to remain in close contact while still maintaining sufficient spacing such that the assemblies can move or slide laterally relative to each other.

In an example, the hollow tube 1008 can comprise a transparent or translucent material. In this example, the electrodes of a clutch device disposed inside of the tube can be visible to a user. In an example, the tube can be fluid-filled (e.g., using a translucent oil or other fluid). The tube can optionally be illuminated, such as with an illumination intensity or color that indicates a clutching status of a clutch device, or a magnitude of a clutch force provided by a clutch device, such as can be enclosed in the tube. In an example, the tube itself or a material inside of the tube can be electroluminescent, that is, configured to emit light in response to an electrical signal or an electric field (e.g., from the clutch device or from another source).

Figure 10D:
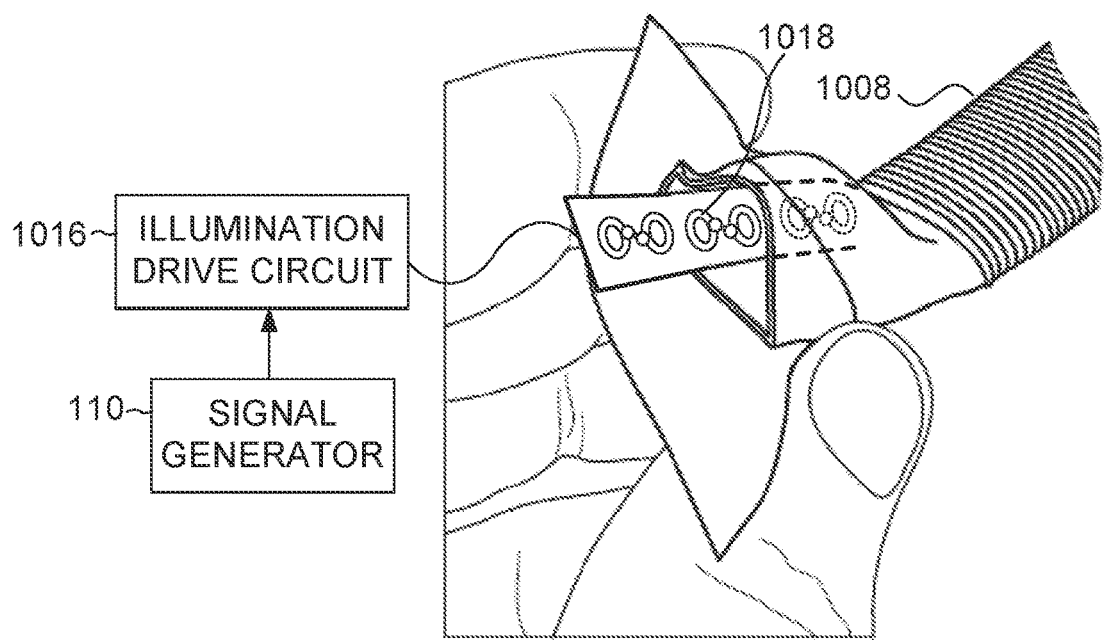
FIG. 10D illustrates an aspect of a tube with a clutch activity indicator.

FIG. 10D illustrates generally an example of the hollow tube 1008 of the encapsulant example 1000 with a clutch indicator 134 that can provide information about clutch activity for a clutch device that is in, near, or coupled to the tube. In the example of FIG. 10D, the clutch indicator 134 includes one or multiple light sources, such as light-emitting diodes or LEDs, embodied as an LED circuit 1018. The LED circuit 1018 can be coupled to the hollow tube 1008, such as inside or outside of the tube. The tube can optionally comprise a transparent or translucent material. The LED circuit 1018 can comprise one or multiple LED devices, such as can be distributed or positioned along a length of the hollow tube 1008. The LED devices that comprise the LED circuit 1018 can be configured to emit the same or different wavelengths or colors of light, or each device can be configured to emit light at multiple different wavelengths or colors.

The LED circuit 1018 can be coupled to an illumination drive circuit 1016 that is configured to provide power signals to the one or more LED devices that comprise the LED circuit 1018. The illumination drive circuit 1016 can receive illumination instructions from, for example, the signal generator 110. In an example, the illumination drive circuit 1016 can control a brightness or color of light emitted by the LED circuit 1018 based on clutch drive signal characteristics as provided by the signal generator 110. For example, when a relatively large magnitude clutch drive signal (e.g., corresponding to strong actuation of a clutch device that is disposed in the hollow tube 1008) is provided by the signal generator 110 to the clutch device(s) 108, then the illumination drive circuit 1016 can provide a relatively large power signal to the LED circuit 1018 to thereby brightly illuminate the LED devices that comprise the LED circuit 1018. When a lower magnitude clutch drive signal (e.g., corresponding to weak or no actuation of a clutch device that is disposed in the hollow tube 1008) is provided by the signal generator 110 to the clutch device(s) 108, then the illumination drive circuit 1016 can provide a relatively low power signal to the LEI) circuit 1018 to thereby weakly illuminate the LED devices. Similarly, the illumination drive circuit 1016 can be used to control the LED circuit 1018 to emit different colors of light depending on the characteristics of one or more signals from the signal generator 110, or based on information from one or more of the other sensors 120 in the adaptive support system 100. The clutch indicator 134, such as comprising the LED circuit 1018, can thus provide visual feedback to a user, or wearer of the adaptive support system 100, about a behavior or status of the system. The feedback can be used, for example, to provide validation that the system is functioning, or to help train the user, such as to train a user to use a different gait or cadence.

Although LED devices are mentioned, other sources of illumination can similarly be used in or with the hollow tube 1008. For example, liquid crystals, electroluminescent or phosphorescent materials, lamps, or other sources can similarly be used. In an example, the hollow tube 1008 can comprise or can be filled with a fluid, and the fluid can be illuminated. The fluid can optionally comprise a liquid and, in an example, a clutch device can be immersed in the liquid. In an example, the liquid can have a viscosity or other characteristic that helps enhance longevity of the clutch device, such as over many thousands of clutch actuation cycles.

Figure 10E:
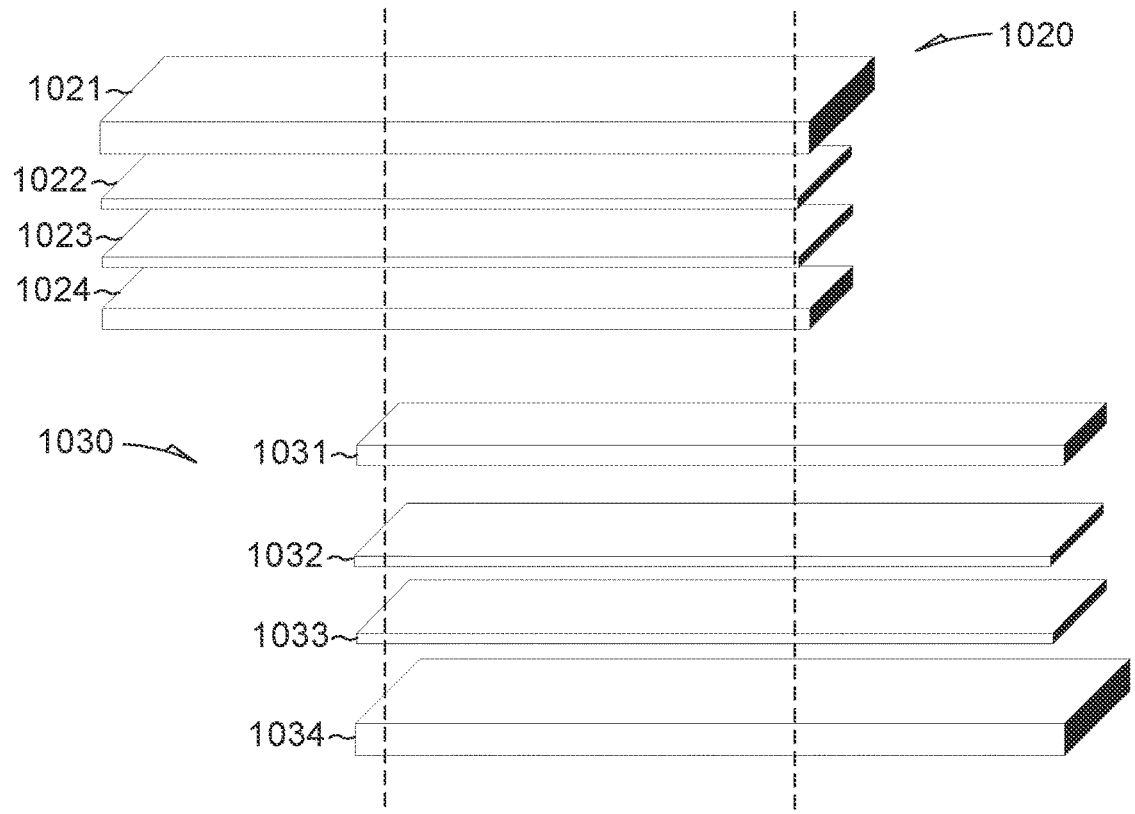
FIG. 10E illustrates generally an example of an electroluminescent display.

FIG. 10E illustrates generally an example of a pair of electrode assemblies that can comprise an electroluminescent display electroadhesive clutch, or ELD EAC. The example can include a first ELD electrode assembly 1020 and a second ELD electrode assembly 1030. In the example of FIG. 10E, each of the ELD assemblies is illustrated in an exploded view to better illustrate the several layers. In use, the first and second ELD electrodes assemblies 1020 and 1030 can be provided in an at least partially overlapping manner, as similarly illustrated in the example of the electroadhesive first clutch system 200. During use, an overlapping region, as indicated by the portion between the dashed lines in FIG. 10E, can emit light. In an example, one or both of the electrode assemblies can be configured to emit light.

The example of the first ELD electrode assembly 1020 can include a film substrate 1021, a conductive layer 1022, a phosphor layer 1023, and a dielectric layer 1024. The example of the second ELD electrode assembly 1030 can include a film substrate 1034, a conductive layer 1033, a phosphor layer 1032, and a dielectric layer 1031. In an example, the film substrates 1021 and 1034 can include a PETE film, such as can be a clear polymer film, such as can have a thickness of about 50 micrometers. The phosphor layers 1023 and 1032 can include an electroluminescent material that can be configured to emit light, such as white light or colored light. In an example, the phosphor layer can include DuPont 8150L/8152B material. Each of the phosphor layers can be deposited or printed and can have a thickness of about 5000 angstroms. In an example, the conductive layer 1022 of the first ELD electrode assembly 1020 can comprise an aluminum coating or other conductive material, such as can have a thickness of about 5000 angstroms. In an example, the conductive layer 1033 of the second ELD electrode assembly 1030 can comprise an indium tin oxide (ITO) material or a conductive polymer, such as poly(3,4-ethylenedioxythiophene) (PEDOT). The conductive layer can thus comprise a substantially translucent material, and in some examples can have a thickness of about 2000 angstroms. Providing at least one of the conductive layers with a translucent or transparent material helps maximize an amount of light that can be emitted from the system. In other examples, the conductive layers can be perforated or otherwise irregularly shaped such that at least one of the conductive layers does not block light emitted from the phosphor layers. In the example of FIG. 10E, the dielectric layers 1024 and 1031 can comprise a dielectric ink, such as DuPont LuxPrint 8153. The dielectric layers 1024 and 1031 can have a thickness of about 32 micrometers. The various thickness information is provided for example only and other dimensions can similarly be used.

Figure 11:
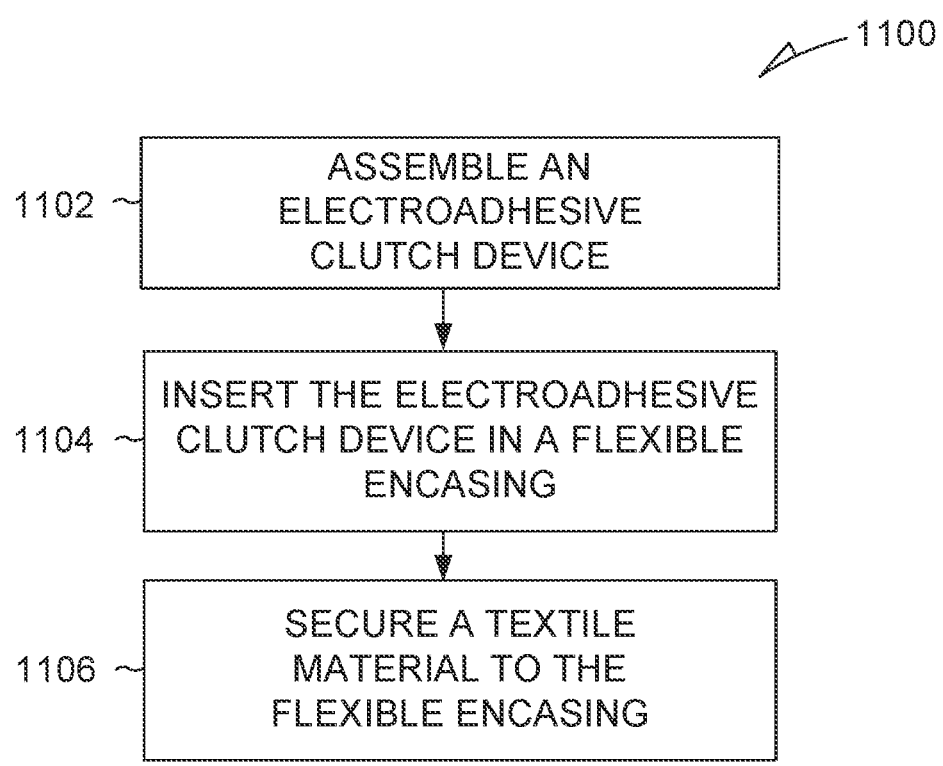
FIG. 11 illustrates generally an example of an encasing method.

FIG. 11 illustrates generally an example of assembling an electroadhesive system for an article of apparel via an encasing method 1100. The encasing method 1100 can include or use various elements of the first clutch system 200, the electroadhesive system 302, or the second clutch system 400, or other systems or devices discussed herein.

At block 1102, the encasing method 1100 can include assembling an electroadhesive clutch device for an electroadhesive clutch system. In an example, block 1102 can include assembling an elongate flexible encasing forming a watertight enclosure to receive first and second electrode assemblies of the clutch device. Block 1102 can also include assembling or providing an electrical signal generator to provide first and second drive signals to the first and second electrode assemblies to actuate the clutch system.

In an example, an accelerometer can be placed within the encasing. The accelerometer can be configured to measure motion of a body to which the electroadhesive clutch device is coupled, and an electrical signal generator configured to drive the electrode assemblies can be configured to generate drive signals based on the measured motion from the accelerometer. When the encasing accelerates at a high rate, the accelerometer measures the rate and the measured rate information may be sent to a processor to determine if the rate meets a specified threshold indicating that the electroadhesive clutch is to be energized. In accordance with a determination that the rate meets the threshold, the processor then may send the electrical signal generator an instruction to provide one or more signals to the electrode assemblies of the electroadhesive clutch device.

At block 1104, the assembled electroadhesive clutch device can be inserted into the flexible encasing, and the encasing can provide a watertight enclosure around the first and second electrode assemblies. The electrical signal generator may also be inserted into the flexible encasing along with the first and second electrode assemblies, or signal leads can be coupled at or through a portion of the flexible encasing. In an example, the encasing can attach to a textile material of an article of apparel at at least a first end of the encasing. The encasing allows the article of apparel to selectively be static (i.e., clutch) or be flexible.

In an example, the first electrode assembly of the electroadhesive clutch within the encasing may be substantially fixed relative to a first end of the encasing. The second electrode assembly of the electroadhesive clutch may be fixed relative to a second end of the encasing and a middle section of the encasing may be configured to move relative to the first and second electrode assemblies.

At block 1106, the electroadhesive clutch in the flexible encasing can be secured to a textile material. For example, the flexible encasing can include a first strap of a two strap system for a sports bra. The flexible encasing can be sewn, attached, embedded, or otherwise affixed to a strap of the sports bra.

In an example, the electrical signal generator can provide a signal to the electroadhesive device. Continuing in the example given with reference to block 1106, the sports bra may be worn by a wearer for running. The sports bra straps include the flexible encasing that houses the electroadhesive clutch device. The accelerometer 424 may measure the acceleration of the wearer and when the acceleration meets a threshold condition, the electrical signal generator can provide signals to the electroadhesive device to turn it on, thereby causing overlapping portions of the first and second electrode assemblies to become static or fixed with respect to each other. This static positioning or locking function of the sports bra can support the wearers body from accelerating and decelerating at painful or damaging speeds.

In an example, an accelerometer may be configured to measure a magnitude of acceleration of at least a portion of the electroadhesive device, or a body portion to which the electroadhesive device is coupled. The electrical signal generator such as signal generator 306 can be configured to generate a signal with a magnitude and/or frequency characteristic based at least in part on the magnitude of acceleration.

In an example, an effective elasticity or compliance of a textile or wearable article can be adjusted using a clutch system and based on information about motion of a body. For example, if a wearer of the article accelerates at a high rate (such as while running), then the measured acceleration of the wearer can be used to cause the clutch system, such as in or integrated with the article of apparel, to stiffen (e.g., remain or become static) by applying one or more particular signals to an electroadhesive clutch device. The article of apparel's stiffness or static-ness allows the article to support the wearer while the wearer experiences the motion.

Figure 12A:
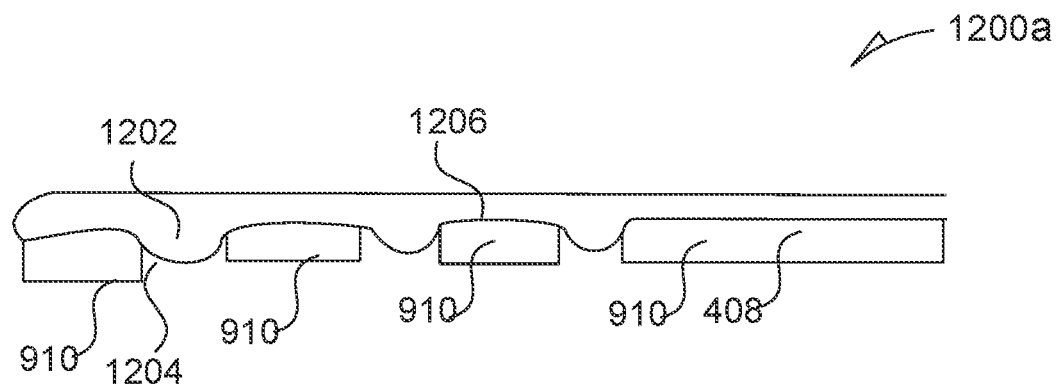
FIG. 12A and FIG. 12B include simplified side profile examples of a bonded interface between a conductive member and an encapsulant for a clutch device.
Figure 12B:
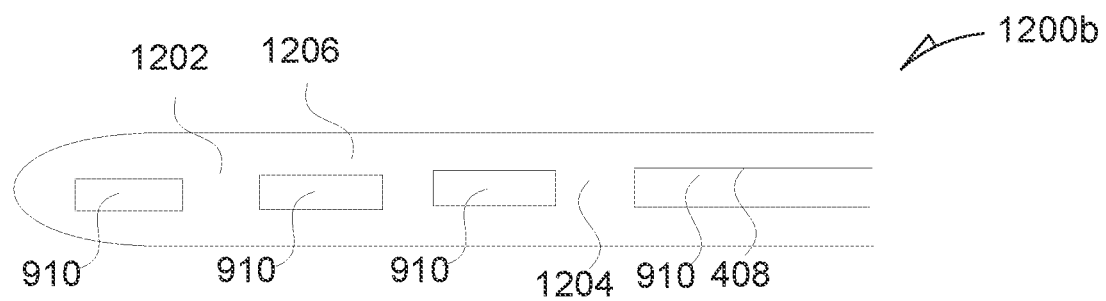

FIG. 12A and FIG. 12B include simplified side profile examples 1200*a*, 1200*b*, respectively, of a thermally bonded interface between a portion of a clutch device (e.g., the first conductive member 408) and an encapsulant example 1202. It is noted and emphasized that the examples 1200*a*, 1200*b* are simplified for the purposes of illustration and that any and all components of the first clutch system 200, the second clutch system 400, or any clutch system disclosed herein may be similarly incorporated. However, to provide clarity of the bonding between the first conductive member 408 and the encapsulant example 1202, other components are omitted. The examples 1200*a* and 1200*b* differ in that in example 1200*a* the encapsulant example 1202 is provided on a first major surface of the first conductive member 408 (e.g., exclusively on the first major surface) while in example 1200*b* the encapsulant example 1202 surrounds the first conductive member 408 and is in contact with the first major surface as well as the opposing second major surface.

The examples 1200*a*, 1200*b* are presented with respect to the perforated conductive member 910. However, it is to be recognized and understood that any specific implementation of the first conductive member 408, including but not limited to all of the examples of FIG. 9A-FIG. 9D, are contemplated, and that the principles described with respect to the perforated conductive member 910 may be applied to any first conductive member 408. Moreover, while the first conductive member 408 is presented for the purposes of the examples 1200*a*, 1200*b*, it is to be recognized and understood that the same principles apply to the second conductive member 420 and to any conductive member of any system or apparatus described herein.

In the examples 1200*a*, 1200*b*, the encapsulant example 1202 has been bonded to the first conductive member 408 though any suitable mechanism, such as hot melt, radio frequency or ultrasonic welding, or any other technique known in the art. The heating of the encapsulant example 1202 has caused the encapsulant example 1202 to flow into holes or openings, such as an opening 1204, such as can be formed in any one or more of the first conductive member 408, the dielectric member 410, the polymeric substrate, or other component. While the presence of the holes may promote bonding and a secure and resilient interface between the first conductive member 408 and the encapsulant example 1202, examples of the first conductive member 408 without holes may still provide bonding between the first conductive member 408 and the encapsulant example 1202. In some examples, a portion of an electrode assembly to be bonded does not include through-holes and instead includes a roughened or uneven surface configured to enhance an adhesive-based coupling with an adjoining member.

Heating or otherwise imparting energy to the first conductive member 408 and/or the encapsulant example 1202 may cause the materials of the first conductive member 408 and/or the encapsulant example 1202 to melt and flow together, creating bonding regions 1206. The bonding regions 1206 are regions in which the molecules of the conductive member 408 or 910 and encapsulant example 1202 intermingle or mix. The bond forms in the bonding regions 1206 following cooling of the conductive member 408 or 910 and the encapsulant example 1202, tending to secure the encapsulant example 1202 to the conductive member and vice versa.

The materials of the first conductive member 408 and the encapsulant example 1202 may be selected to be compatible with heating both materials so that strong bonds can form in the bonding regions 1206 such as without damaging or destroying the underlying integrity of the first conductive member 408 and encapsulant example 1202. In an example, the first conductive member 408 proximate the bonding regions 1206 is comprised of Mylar. In an example, the encapsulant example 1202 is formed of a knit textile with elastomeric fibers that has a melting temperature less than the glass transition temperature of the Mylar.

A discussed in detail herein, the first conductive member 408 and the second conductive member 420 are configured to slide laterally with respect to one another. Consequently, the examples 1200a, 1200b illustrate the first conductive member 408 bonded to the encapsulant example 1202 at or proximate a first end of the encapsulant example 1202. In such an example, the second conductive member 420 may be bonded to the encapsulant example 1202 at or proximate a second end of the encapsulant example 1202 opposite the first end. As a result, the first and second conductive members 408, 420 are adapted to slide laterally along the inside of a middle portion of a housing that includes the encapsulant example 1202 when movement of the conductive members is not inhibited by the operation of the clutch 200, as described in detail herein.

The resultant bonded article including the first conductive member 408 and a housing that includes or comprises the encapsulant example 1202 may be incorporated into wearable articles or apparel as disclosed herein by securing the encapsulant example 1202 to the wearable article. In various examples, the encapsulant example 1202 may be sewn, fastened, bonded, or otherwise secured to the wearable article without such mechanisms passing through a conductive member of a clutch, such as the first conductive member 408. Doing so may contribute to maintaining the structural integrity of the conductive member(s) of the clutch as well was maintaining the watertight nature of the encapsulant example 1202. However, it is to be recognized and understood the fastening techniques that contact the first conductive member 408, such as sewing and the like, may be utilized without compromising the ability of a conductive member of a clutch to function or without compromising the durability of the clutch device or system.

Figure 12C:
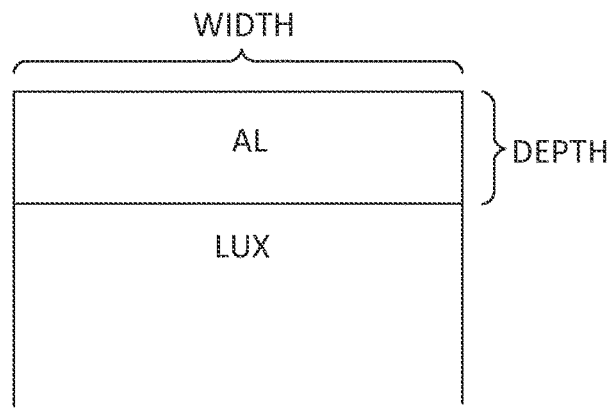
FIGS. 12C-12K illustrate generally an example of a method for interfacing an electrode assembly with a substrate.
Figure 12D:
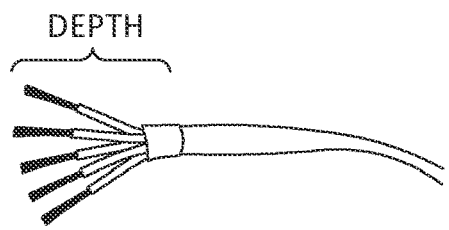
Figure 12E:
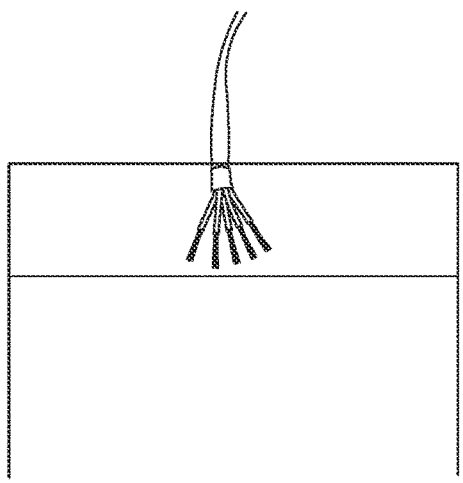

FIGS. 12C-12K illustrate generally an example of a method for attaching an electrode of a clutch device with a substrate or other conductor, such as can be used to couple the electrode with a power source or controller, First, a heat-activated film (e.g., NASA-T by Sampo Corp.), such as having about 200 um thickness, can be cut to match an exposed conductive portion of an electrode (e.g., comprising aluminum; labeled "AL" in FIG. 12C), optionally with an overhang portion of a particular depth or width (see FIG. 12C). A dielectric-coated portion of the electrode (e.g., coated with a dielectric ink such as DuPont LuxPrint 8153) can be adjacent to the exposed conductive portion of the electrode. Next, ends of a multiple-wire conductor (e.g., 28 AWG) can be splayed or fanned (FIG. 12D). The ends can be cut to a length that is approximately the same as the depth of the exposed portion of the conductor. The fanned wires can then be placed onto the exposed conductive portion (e.g., the portion labeled "AL" in the example of FIG. 12C) and optionally centered. Insulation of the wires can be provided at or adjacent to an edge of the mylar (see FIG. 12E) such as to minimize thickness or bulk of the assembly.

Figure 12F:
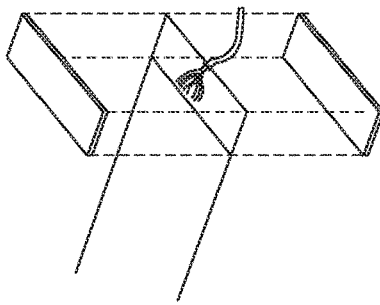
Figure 12G:
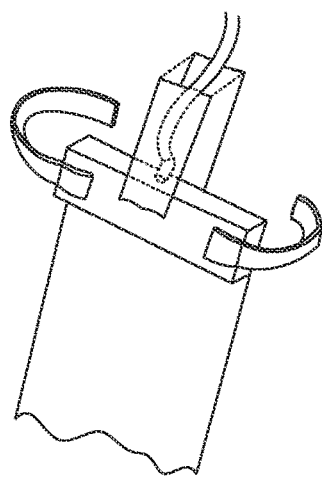

Next, a liner or backing can be removed from one side of each of two strips of the heat-activated film. The strips can be used to attach the multiple-wire conductor and mylar by sandwiching the conductor and mylar therebetween (see FIG. 12F, showing the strips spaced apart from the conductor/mylar assembly, such as before attachment). Next, strips of a masking agent or protective material, such as masking tape or other non-permanent adhesive material, can be applied to edges of the film and to both sides of the conductor to temporarily hold the assembly in place for further processing (see FIG. 12G showing strips of tape in position on the assembly).

Figure 12H:
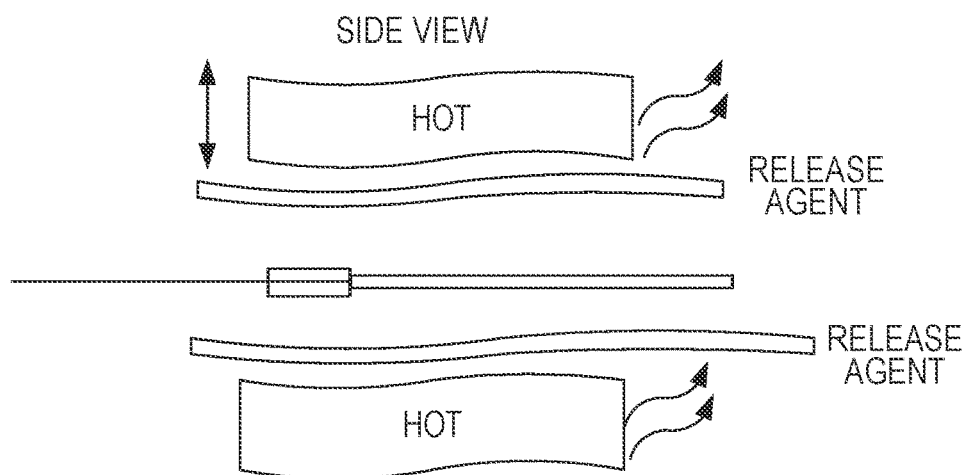
Figure 12I:
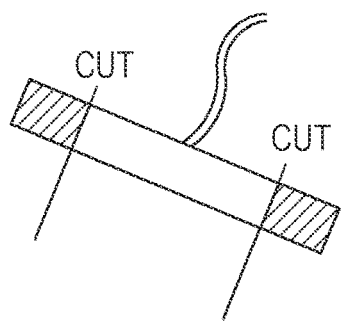

Next, the assembly can be aligned or adjusted to be just inside of an edge of opposite plates of a dual-sided heat press. In the example of FIG. 12H, the plates of a heat press are illustrated as the blocks labeled "HOT." Each side of a platen of the press can be covered with a release agent (e.g., parchment paper or similar). The conductor can be threaded between the release agent and not touching the platen, and the dielectric (e.g., ink-coated) portion of the electrode assembly can optionally be provided outside of the platen area. Next, the press can be used to tack the film and conductor in place, for example, such that the wires in the conductor are in electrical contact with the conductive portion of the electrode. The press can be adjusted or optimized to ensure optimal bonding (e.g., set to heat at about 190 degrees F., for about 6 seconds, at about 6 PSI pressure). Following a press cycle, the masking agent and release agent can be removed or cut (FIG. 12I).

Figure 12J:
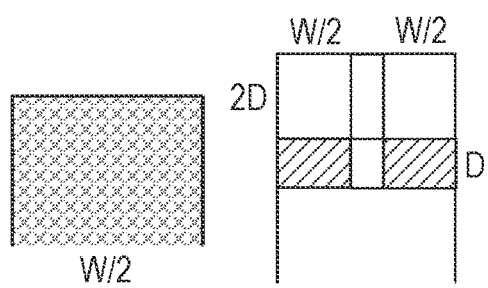
Figure 12K:
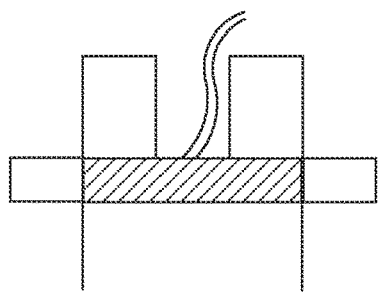

Next, a polymeric webbing (e.g., stretchable or non-stretchable), such as having a uniform weave or comprising a non-woven material, can be provided. The webbing can have a width of about W/2, or half of the width of the electrode assembly. In an example, the webbing can be cut to a length of about 6 D such that folded-over portions can have a width of about 3 D (FIG. 12J). Next, tape or other adhesive can be used to hold the webbing in place against the mylar, with the wire portion provided between the two webs (FIG. 12K). Next, the assembly can be aligned in the heat press with release agents and heated again (e.g., as at about 240 degrees F. for about 11 seconds at about 6 PSI). Following the heat press, the assembly can be removed, the tape or other release agents can be removed, and the assembly can be trimmed to desired dimensions or to remove any excess material. Next, a sensor can optionally be attached, and can optionally be heat-pressed to secure it to the assembly. Other means for coupling the sensor can be used. The sensor can comprise, for example, a stretch sensor or other sensor configured to measure a displacement of the electrode assembly or of the webbing. Another sensor or another portion of the same sensor can be similarly attached to an oppositely-oriented electrode to provide a complete electrode assembly for a clutch.

Figure 13A:
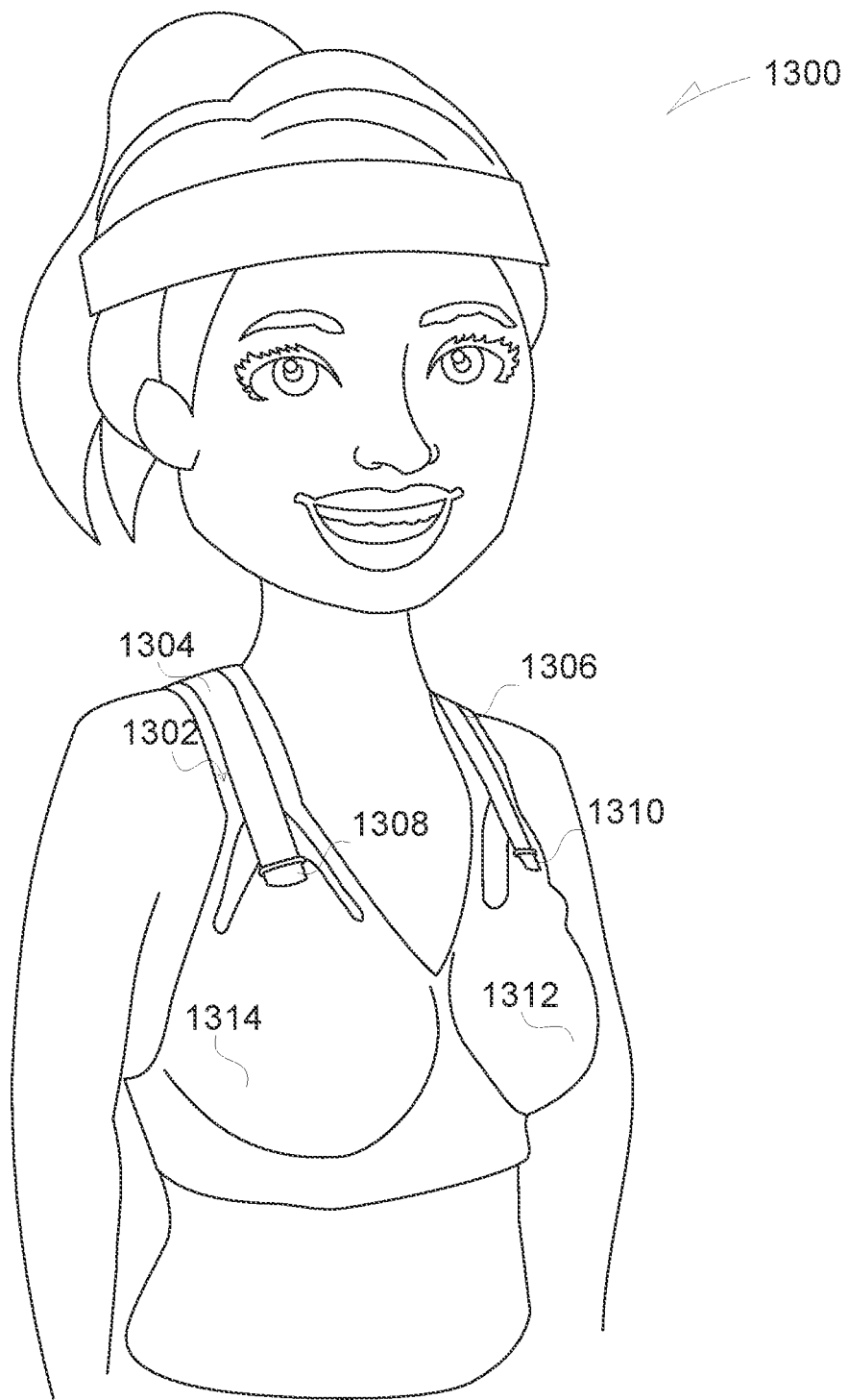
FIG. 13A and FIG. 13B illustrate generally views of an apparel example.

FIG. 13A illustrates generally an apparel example 1300. A female front view of support garment 1302 is shown having a left front view of left encasing 1304, a right front view of right encasing 1306, a left fixing point 1308, a right fixing point 1310, a right cup 1312, and a left cup 1314.

The apparel example 1300 is an example of a support garment for a wearer having a textile layer forming a supportive region configured to adjustably inhibit displacement of a body part of the wearer positioned proximate the supportive region. The apparel example 1300 may also include a hollow strap affixed to a portion of the textile layer. The hollow strap encases an electroadhesive clutch device having a first electrode assembly and a second electrode assembly. The first and second electrode assemblies are at least partially overlapping and configured to slide laterally relative to the other. The apparel example 1300 may also include an electrical signal generator such as the signal generator 110 to provide one or more signals to the first and second electrode assemblies, and the electroadhesive clutch device can be configured to selectively adjust an amount by which the apparel example 1300 allows displacement of the body part proximate the supportive region.

The apparel example 1300 is of a sports bra and the supportive region is a right cup 1312 and a left cup 1314 of the sports bra. The hollow strap referred to as a left and right encasing are shown in FIG. 13A as a front view of left encasing 1304 and a front view of right encasing 1306. Each of the hollow straps are individually addressable or controllable by a controller (e.g., by the control circuit 112) to selectively adjust an absolute or relative amount by which the support garment allows displacement of the body part. For example, if a wearer has a larger left breast, the left encasing 1304 may provide a different level of support than the right encasing 1306 provides for the right breast.

Figure 13B:
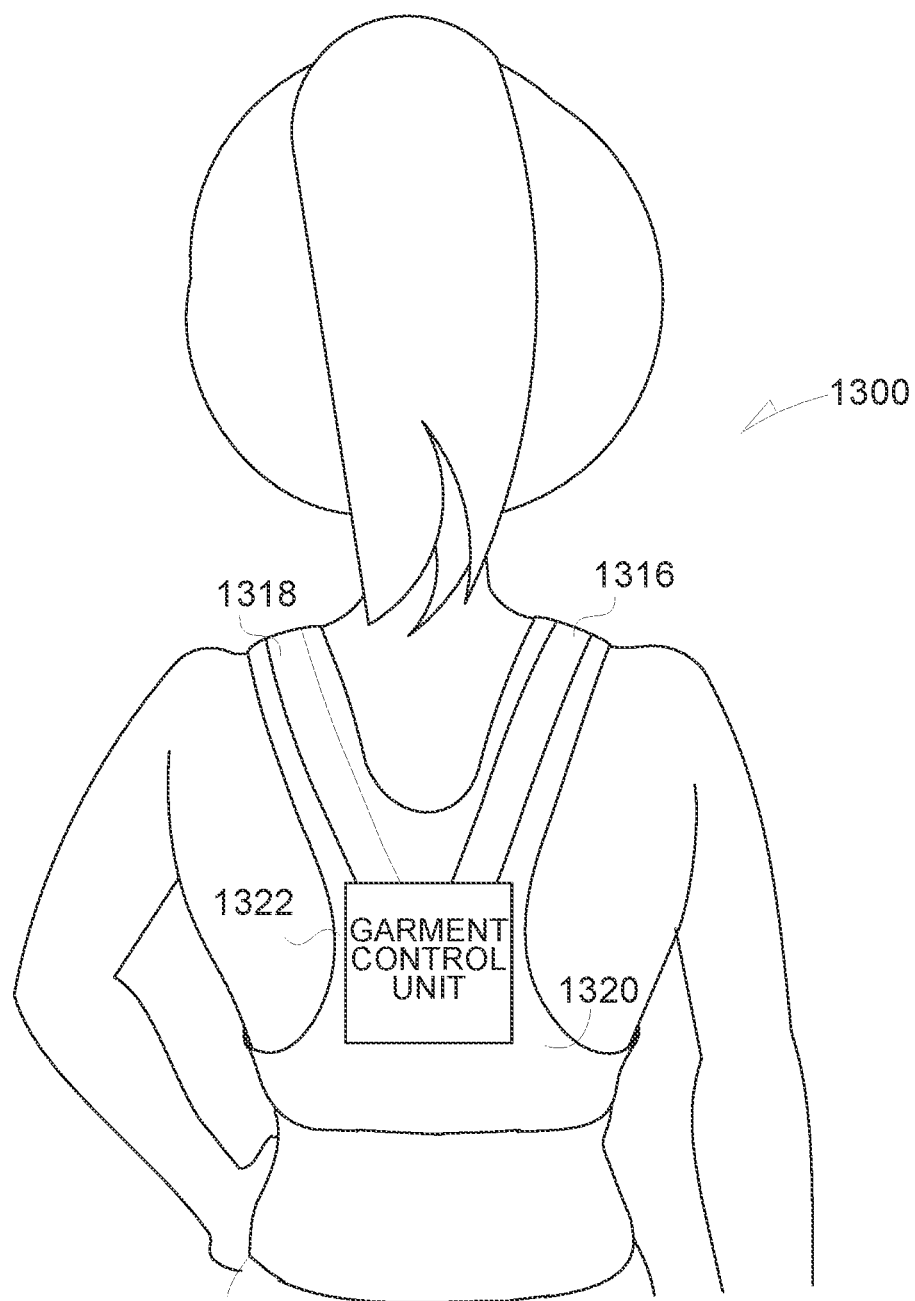

FIG. 13B illustrates a back view of the apparel example 1300. A back view of support garment 1320 shows a back view of left encasing 1316 and back view of right encasing 1318. The support garment may include a garment control unit 1322 embedded within or coupled to the support garment. The garment control unit 1322 can include a system or processor configured to control actuation of a clutch.

The support garment may also include a signal generator configured to provide one or more electrical signals to the first and second electrode assemblies. The signal generator may be affixed to the apparel example 1300 such as within the garment control unit 1322. Alternatively and/or additionally, the signal generator may be embedded within the encasings with the first and second electrode assemblies.

The support garment is configured to inhibit displacement of the wearer's body part when the wearer or the wearer's body part is measured at an acceleration rate higher than a threshold. The support garment is configured to relax or allow the support garment to flex.

In some embodiments, the support garment is an athletic supporter having a right hollow strap (e.g., flexible encasing for an electroadhesive clutch device) affixed to a right side of the textile layer forming the supportive region and a left hollow strap affixed to a left side of the textile layer forming the supportive region. Both the left and right hollow straps work in tandem to selectively inhibit or allow displacement of a corresponding body part of the wearer.

Although the embodiment shown includes a female support garment, other garments are contemplated herein including joint braces (e.g., knee braces), athletic supporters, athletic girdles, shin guards, football pads, weightlifting support straps, sneakers for various sports (e.g., golfing, mountain biking, skiing, mountaineering), and other suitable garments having a supportive feature for the wearer. Additionally, further garments including undergarments, vests, socks, sleeves, protective gear (e.g., helmets, pads, shields) have also been contemplated and are within the scope of the solutions discussed herein.

In some embodiments, the electroadhesive clutch device can comprise a portion of a modular apparel system. For example, a support garment (or other garment or article of apparel) can be configured to optionally include or use an electroadhesive clutch device, or other type of clutch device, or one or more other systems or devices. In an example, the clutch device can include a modular attachment mechanism provided at or on front, side, or rear portions of the garment. For example, the device can be configured to attach at a front portion of the support garment, for example between the breasts, or can be configured to attach at or on a rear portion of the support garment, for example between the shoulder blades. The modular nature of the system may provide different levels or types of control or support for a user (e.g., as described with respect to FIG. 13A-13B) such as without requiring an active device to be integrated with the garment (e.g., sewn in or otherwise permanently affixed, such as at a point of manufacture). In an example, a garment with support for modular attachment of a clutch may also include one or more straps, or hollow conduits through which a strap can be threaded, to selectively couple the garment to provide the functionalities as described, such as with respect to FIG. 13A-13B. In some embodiments, the support garment can include a male athletic supporter that is configured to include or use a modular clutch device.

Figure 13C:
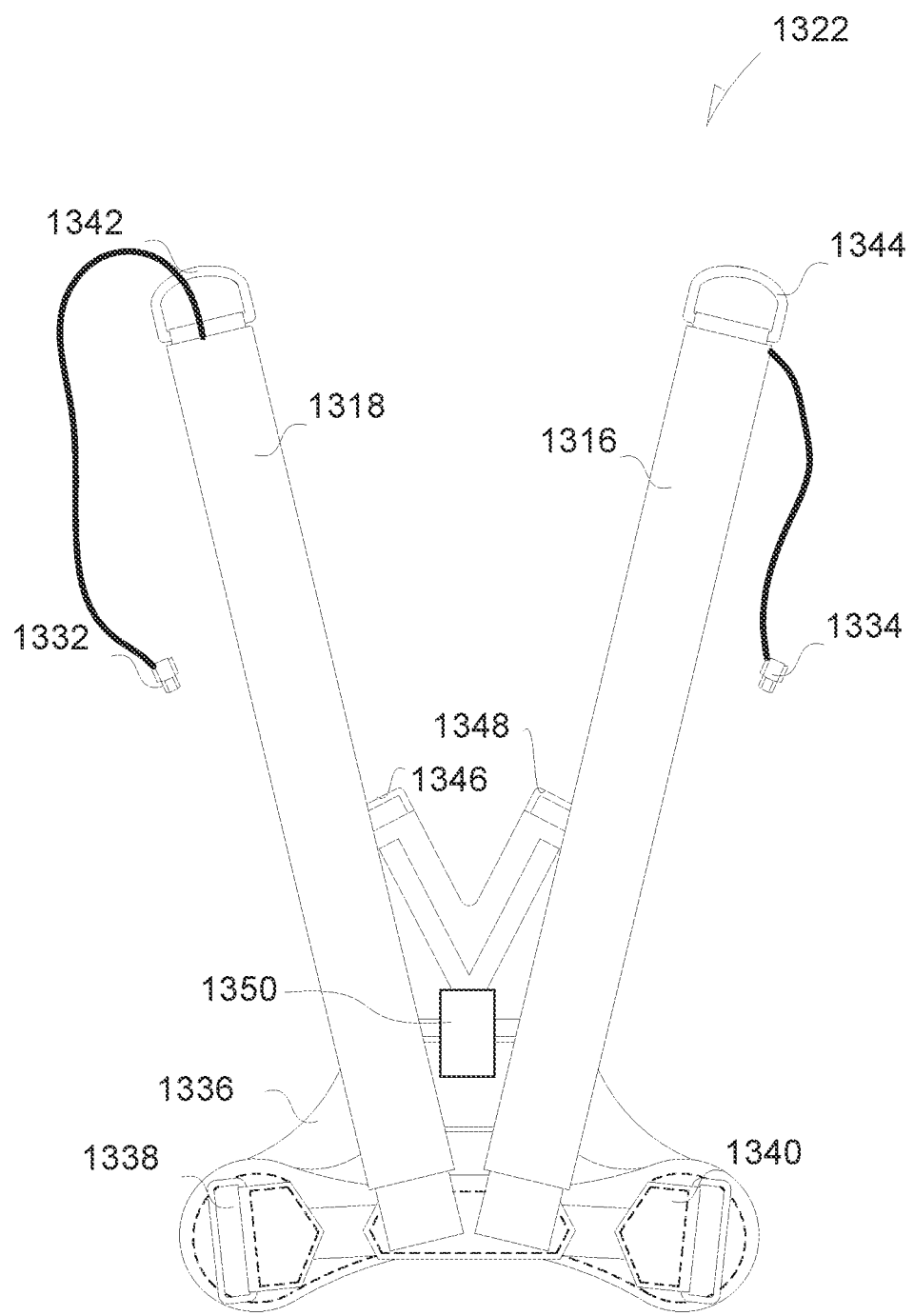
FIG. 13C illustrates generally an example of a garment control unit.

FIG. 13C illustrates an example of the garment control unit 1322. The example shows a back view of a left encasing 1316 and a back view of a right encasing 1318. The garment control unit 1322 can be a modular device configured for attachment to the support garment 1302 and may include the electroadhesive clutch device. The electroadhesive clutch device may be provided within the right encasing 1318, the left encasing 1316, and/or positioned adjacent to a control unit base 1336.

The garment control unit 1322 can include left and right straps 1324 and 1326, such as can include an adjusting strap, an electroadhesive clutch device, or one or more sensors. The straps 1324 and 1326 can be physically coupled to the base 1336 and can be attached to the support garment 1320 by various attachment mechanisms 1338, 1340, 1342, 1344, 1346, and 1348. The attachment mechanisms can include O-rings, D-rings, hook and loop fasteners, zippers, snaps, sewing, or any other type of suitable attachment mechanism for coupling the garment control unit 1322 to a portion of a support garment. In an example, the garment control unit 1322 is coupled to the support garment and/or a sub-component attached to the support garment through a right connector 1332 and/or left connector 1334. The right and left connectors 1332 and 1334 may be used to attach additional modular units including sensors such as an accelerometer, gyroscope, GPS, heart rate monitor, EKG monitor, or other sensor. In the example of FIG. 13C, the garment control unit 1322 includes a controller 1350, such as can comprise the control circuit 112, or can comprise the processor circuit 304, or can comprise another purpose-built controller to selectively actuate an electroadhesive clutch device.

In some embodiments, the garment control unit 1322 may be placed at a location on a front of the support garment for example between the breasts or placed at a location on the back of the support garment for example between the shoulder blades. The modular unit can help provide dynamic support of a user's body as described herein, for example, without integration with or permanent affixation to the support garment (e.g., sewn in or otherwise permanently affixed). The modular unit may include one or more hollow straps (e.g., right hollow strap 1326 and left hollow strap 1324) to selectively couple to the support garment to provide the functionalities as described with respect to FIG. 13A-13B.

Figure 13D:
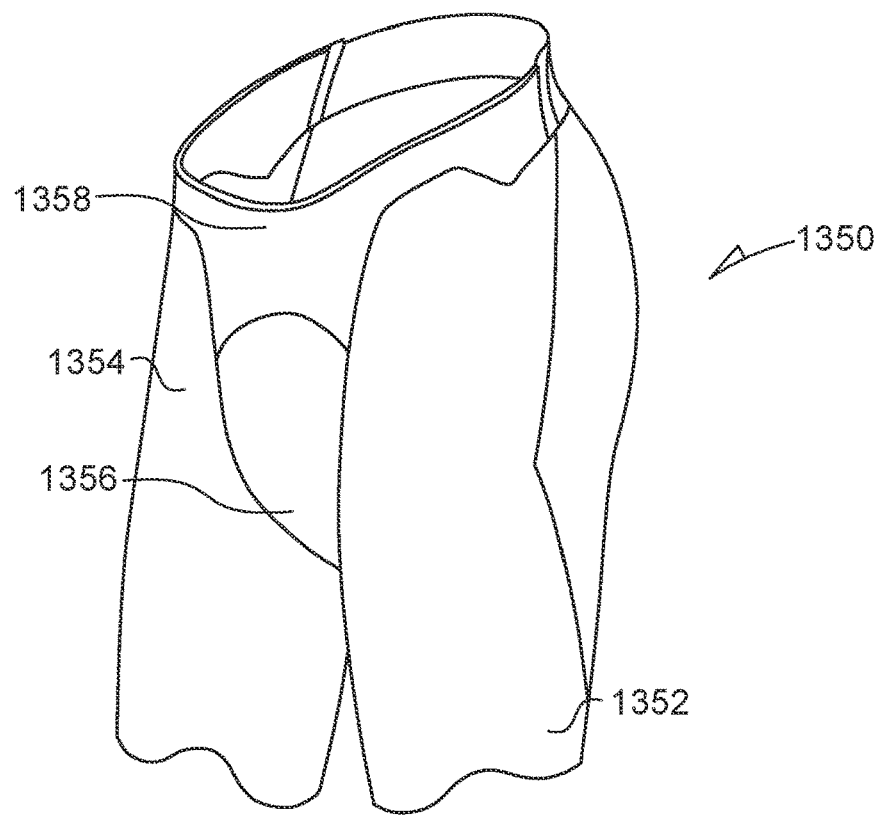
FIGS. 13D and 13E illustrate generally views of different apparel examples.
Figure 13E:
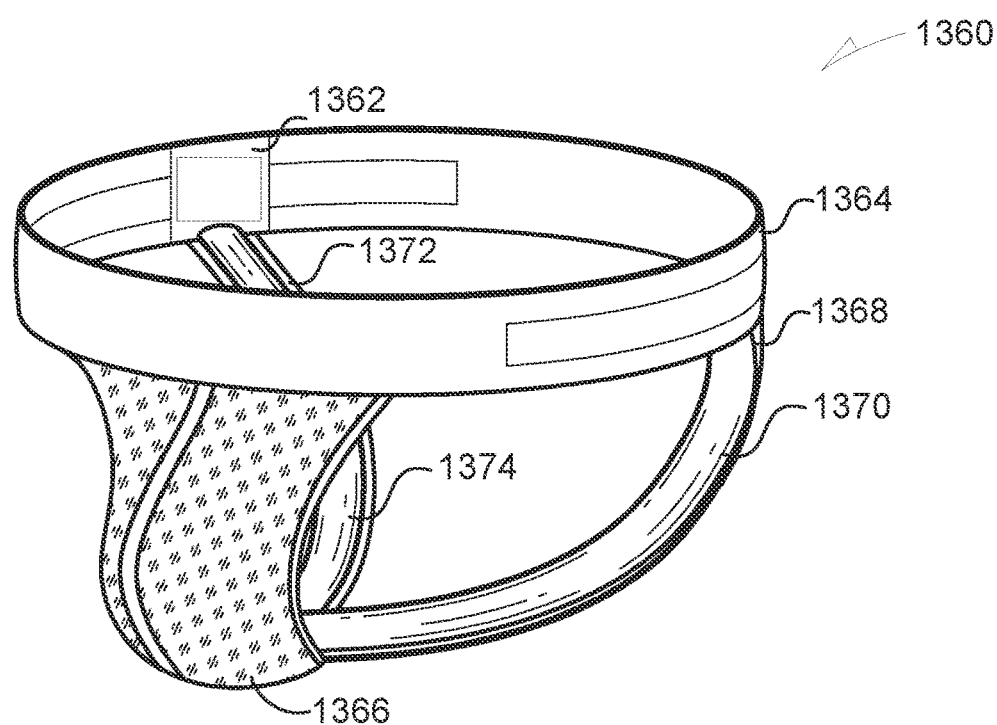

Clutch devices or systems, or modular components thereof, can be provided for use with various other support garments, such as for female or male use, FIG. 13D illustrates generally a front view of a first male support garment 1350. The male support garment 1350 includes a left leg portion 1352, a right leg portion 1354, a cup portion 1356, and a waist band portion 1358, The male support garment 1350 can include a clutch system to selectively restrain or relax various areas of the garment including about the waist, legs, or crotch. FIG. 13E illustrates generally an example of a second male support garment 1360 or jockstrap. In some examples, the first and second male support garments 1350 and 1360 can be used together.

The example of the second male support garment 1360 includes a waist band 1364, a cup portion 1366, a left leg band 1368 having a left hollow strap 1370, and a right leg band 1372 having a right hollow strap 1374. In an example, the second male support garment 1360 can include a garment control circuit 1362 coupled to the waistband 1364. The cup portion 1366 may include various textile layers and a corresponding shell (e.g., plastic cup) to provide support and protection for the penis and testicles of the wearer.

In the example of FIG. 13E, the hollow straps (e.g., left hollow strap 1370 and right hollow strap 1374) can be coupled to or embedded within textile layers of the left leg band 1368 or the right leg band 1372. In some embodiments, the hollow straps, such as can comprise a flexible encasing or tube for an electroadhesive clutch device, can be affixed to a leg band, and can include one or more clutch electrode assemblies. The electrode assemblies can be selectively energized or de-energized to selectively inhibit or allow displacement of the cup portion 1366, The example of the second male support garment 1360 may additionally include an electrical signal generator such as the signal generator 110 to provide one or more signals to the electrode assemblies. In some embodiments, the clutches provided in the right and left hollow straps 1370 and 1374 are configured to work independently to provide a unique fit, or can be configured to work in tandem to selectively inhibit or allow displacement in a coordinated manner.

Figure 14:
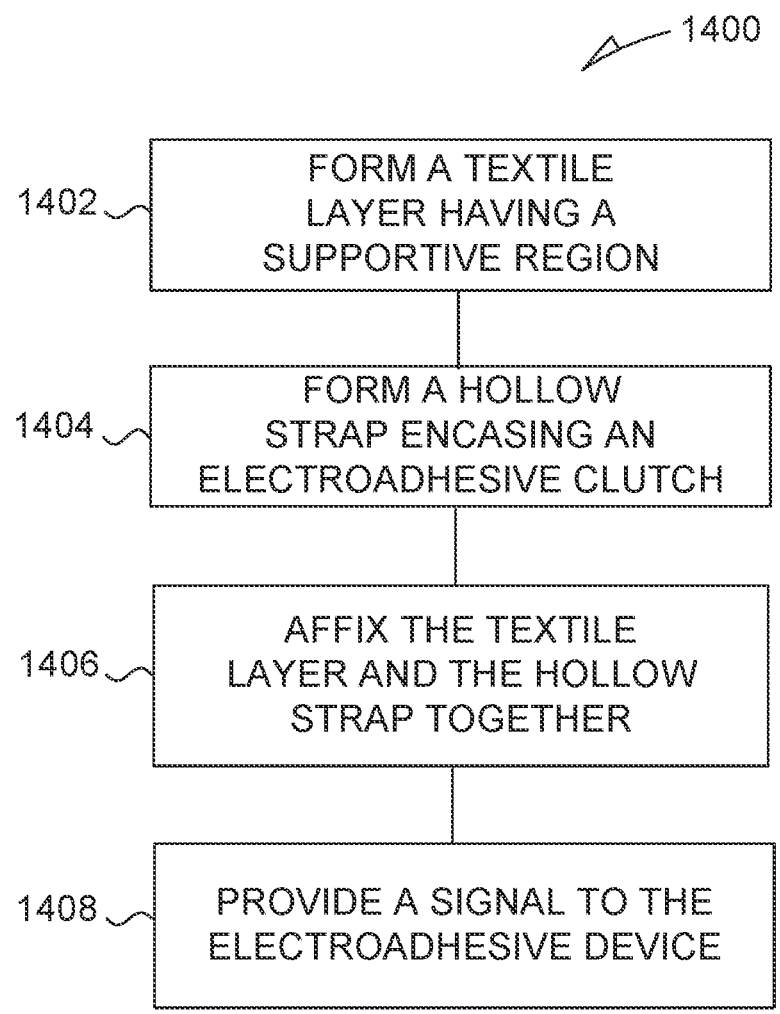
FIG. 14 illustrates generally an example of a support garment assembly and use method.

FIG. 14 illustrates generally an example of a support garment assembly and use method 1400. The support garment can include or use various elements of the first clutch system 200, the electroadhesive system 302, or the second clutch system 400, or other systems or devices discussed herein.

At block 1402, the support garment assembly and use method 1400 includes forming a textile layer for the support garment, such as having a supportive region. The support garment may be a sports bra, an athletic supporter, or another support garment having a supportive region. The supportive region may be a cup of a sports bra or a cup of an athletic supporter. The supportive region can have a defined region molded into a specific shape, or alternatively may be a region made of a flexible or compliant material.

At block 1404, the support garment assembly and use method 1400 includes forming a hollow strap encasing an electroadhesive clutch. The hollow strap may be a flexible encasing produced via the encasing method 1100 from the example of FIG. 11. In an example, the hollow strap can include a first and a second electrode assembly.

At block 1406, the support garment assembly and use method 1400 can include affixing the textile layer and the hollow strap together. The textile layer, such as having a supportive region, can be coupled with the hollow strap to provide selective support to the body part in contact with the supportive region. The straps are contemplated to be within a close distance of the supportive region to provide the maximum supportive ability.

At block 1408, the support garment assembly and use method 1400 can include providing a signal to the electroadhesive device. The signal may be from the electric signal generator indicating the electroadhesive device is to engage, causing the support garment to maintain its shape.

For example, when a user is wearing a sports bra, the material is already pre-selected to provide a close fit to the wearer. However, when a user is running, the material may stretch and move around, ceasing to provide adequate support provided by the close fit alone. The contemplated support garment provides a mechanism that restricts the material from stretching and flexing, providing the user with the close fit support as originally intended.

Figure 15:
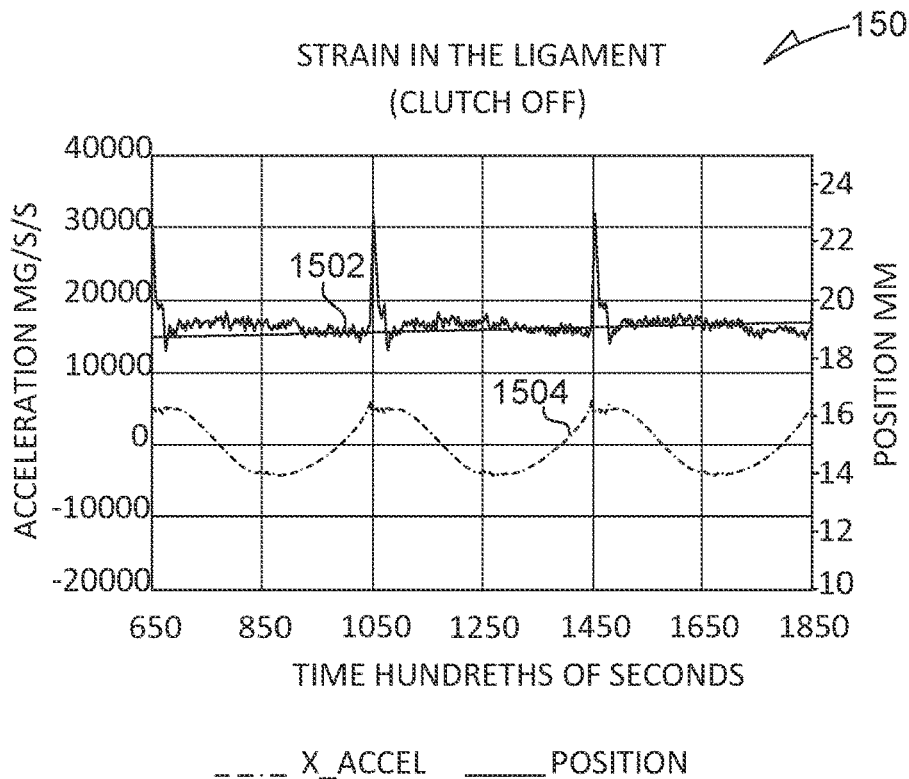
FIG. 15 illustrates generally an example of a first diagram showing tissue displacement and acceleration information.

FIG. 15 includes an example of a first diagram 1500. The first diagram 1500 includes a first position signal 1502 that represents a strain experienced by a runner's connective breast tissue over time, and a first acceleration signal 1504. The first position signal 1502 is based on displacement of the same runner's breast tissue over the same period of time. That is, the first diagram 1500 shows a relationship between a changing position of breast tissue during running with respect to the runner's core or trunk and the corresponding vertical acceleration of the runner's core or trunk.

The present inventor recognized that strain in the ligament of Cooper in breast tissue can be painful or uncomfortable, particularly during periods of repetitive motion such as during running. From the example of FIG. 15, it can be observed that there is a spike in the first position signal 1502 indicating significant strain on the ligament. The timing of maximum strain generally corresponds to an inflection point of the first acceleration signal 1504, such as can represent a lower limit of travel of the tissue, such as can correspond to a rapid change in direction of motion of the trunk.

For example, when a person is running, the natural cadence of the running motion causes the breast tissue to move upward and downward. This motion is repeated for each step while the person is running. This repetitive bouncing motion puts strain in the ligament, specifically the Ligament of Cooper and may cause long term damage and pain. Additionally, over time, the repetitive strain in the ligament may cause the breast to sag.

Figure 16:
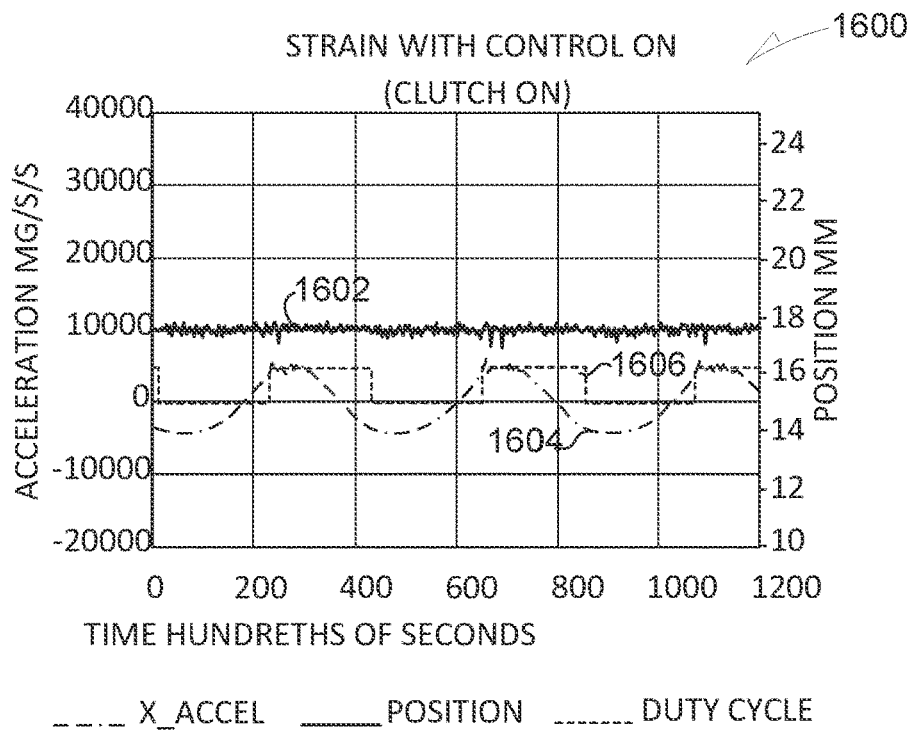
FIG. 16 illustrates generally an example of a second diagram showing tissue displacement and acceleration information.

FIG. 16 shows an example of a second diagram 1600 showing performance of a support garment in accordance with some embodiments. The second diagram 1600 includes a second acceleration signal 1604, a second position signal 1602, and a clutch control signal 1606. In the example, the second acceleration signal 1604 corresponds generally to the first acceleration signal 1504, such as can represent the changing position of the trunk such as during running. The clutch control signal 1606 can represent actuation of a clutch system, such as a clutch system for a bra, such as for the apparel example 1300. The runner represented by the second position signal 1602 can wear the bra from the apparel example 1300.

In the example of FIG. 16, the second position signal 1602 indicates reduced strain as compared to the first position signal 1502 from FIG. 15. The reduction in strain can be attributed to use of a system including an electroadhesive device having at least two electrode assemblies configured to clutch and release. This electroadhesive clutch system can be embedded within articles of apparel such as the apparel example 1300. The article of apparel may selectively clutch and release to reduce strain on the ligament in coordination with motion of the wearer.

For example, a runner can wear a supportive sports bra having electroadhesive systems embedded within the sports bra. When the system recognizes that the person is running, the system signals the electroadhesive clutch to energize and de-energize at an interval corresponding to the person's running pace. On an upward and/or downward acceleration, the clutch can be energized to statically hold the article of apparel in a steady, inelastic position. The electroadhesive clutching provides support for the person while in motion. When the system recognizes that the person is no longer running, the system signals the electroadhesive clutch to turn off or enter a sleep-state, allowing the article of apparel to return to a flexible, compliant, or relaxed state.

Figure 17:
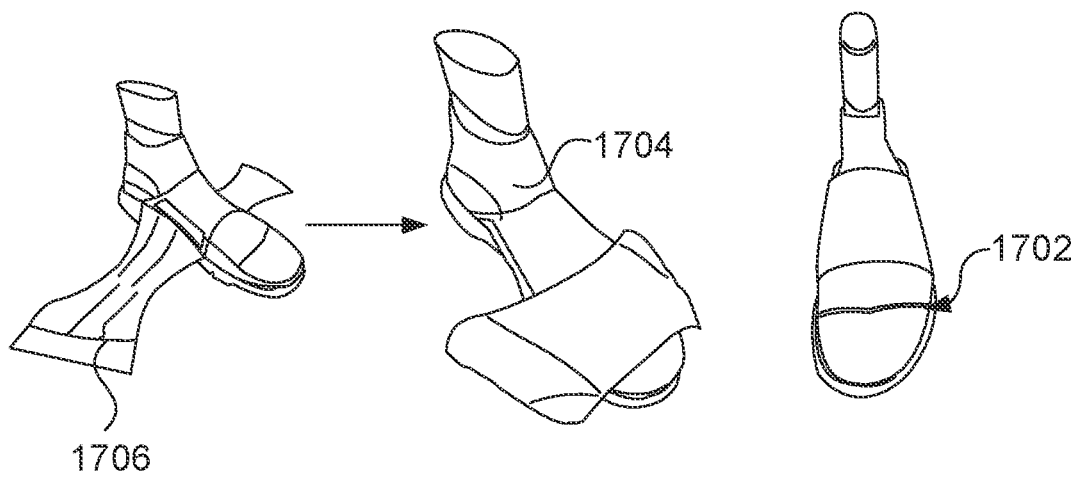
FIG. 17 includes an electroadhesive system configured for use in footwear in accordance with some embodiments.

FIG. 17 includes an electroadhesive system configured for use in footwear in accordance with some embodiments. In an example, an article of footwear 1702 includes a base portion 1704 and footwear strap 1706. In some embodiments, the base portion 1704 is made of a knit material for maximum comfort and flexibility. In some embodiments, the footwear strap 1706 includes an electroadhesive system (e.g., electroadhesive system 302) that allows the footwear strap to be selectively immobilized, static or rigid. In an example, the footwear 1702 can be worn as a casual, stylish footwear option while still having a supportive element provided by the selectively supportive system of the electroadhesive system.

For example, a slip-on sneaker that is comfortable for casual wear but also comfortable for running allows the wearer to wear one sneaker for multiple purposes. As shown in FIG. 17, the footwear 1702 includes a strap portion covering an upper portion of footwear 1702. The strap may include mechanical adhesive systems as well as an electroadhesive system for affixing the strap to the footwear and to further provide support such as when the wearer is running by rigidly encasing the foot on a portion of a stride cycle and relaxing the encasing of the foot on another portion of the stride cycle.

The footwear 1702 can be configured to support multiple modes of activity including a sport mode, a chill mode, or a dynamic mode. The footwear can adjust a level or timing of clutch actuation based on sensed input (e.g., from motion of the foot within the footwear, from an accelerometer reading, or other suitable sensor). A sport mode can provide the wearer with a highest level of support to protect the wearer from jarring contact with the ground. A chill mode can provide a relaxed fit when the user is not in a state of heightened motion. A dynamic mode can provide a hybrid fit between a sport mode and a chill mode. In some embodiments, each mode can be manually selected based on an input from a wearer. In some embodiments, each mode is automatically configured by the footwear or by another sensor that is in or coupled to the electroadhesive system. Other articles of apparel can include electroadhesive systems that can be similarly configured to include or use different modes of activity.

In an example, motion of the footwear 1702 can be sensed from the clutch system itself, such as by monitoring relative movement of the electrodes, or from a motion sensor such as an accelerometer. The motion information can be used to selectively actuate the clutch system for foot support.

Figure 18A:
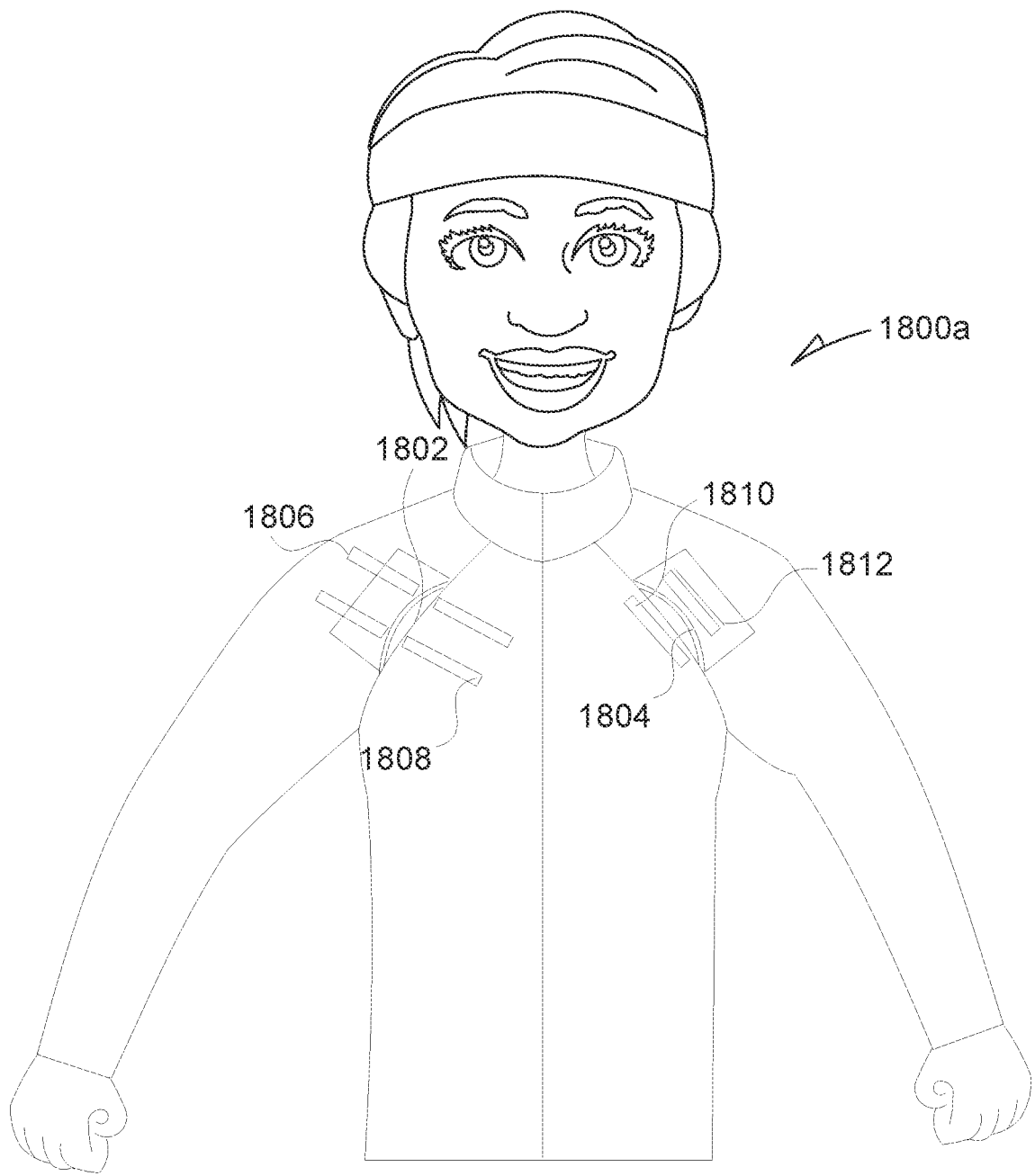
FIG. 18A-18G illustrate generally examples of articles of apparel having one or more apertures controlled by electroadhesive clutches.

FIG. 18A includes an article of apparel such as a first cool down jacket 1800a having one or more apertures coupled to electroadhesive clutch systems in accordance with some embodiments. The first cool down jacket 1800a can include one or more apertures, such as a first aperture 1802 and second aperture 1804. Each of the first aperture 1802 and second aperture 1804 can include or use an electroadhesive system. For example, opposite side portions of the apertures can comprise respective electrodes of a clutch system. When the electrodes are actuated, the apertures can be caused to selectively open or close. That is, electrodes can be coupled to or integrated with respective portions of the cool down jacket 1800 that are on opposite sides of an aperture such that the electrodes can be used to open or close the aperture.

As shown in the first aperture 1802, a first orthogonal clutch devices 1806 and a second orthogonal clutch devices 1808 can be positioned adjacent to an opening provided by the first aperture 1802. In some embodiments, depending on the size of the aperture, a single orthogonal device or multiple orthogonal devices may be used. The orthogonal devices may, each include an electroadhesive system such as the electroadhesive system 302. Each of the devices can be embedded within or coupled to a textile or other material of the first cool down jacket 1800a or can be placed on top of a top layer of the article of apparel for functional and/or aesthetic purposes.

As shown in the example of the second aperture 1804, a first parallel clutch devices 1810 and second parallel clutch devices 1812 can be positioned adjacent to an opening provided by the second aperture 1804. The first parallel clutch devices 1810 and second parallel clutch devices 1812 can be positioned parallel to each other and to a longitudinal direction of second aperture 1804.

Figure 18B:
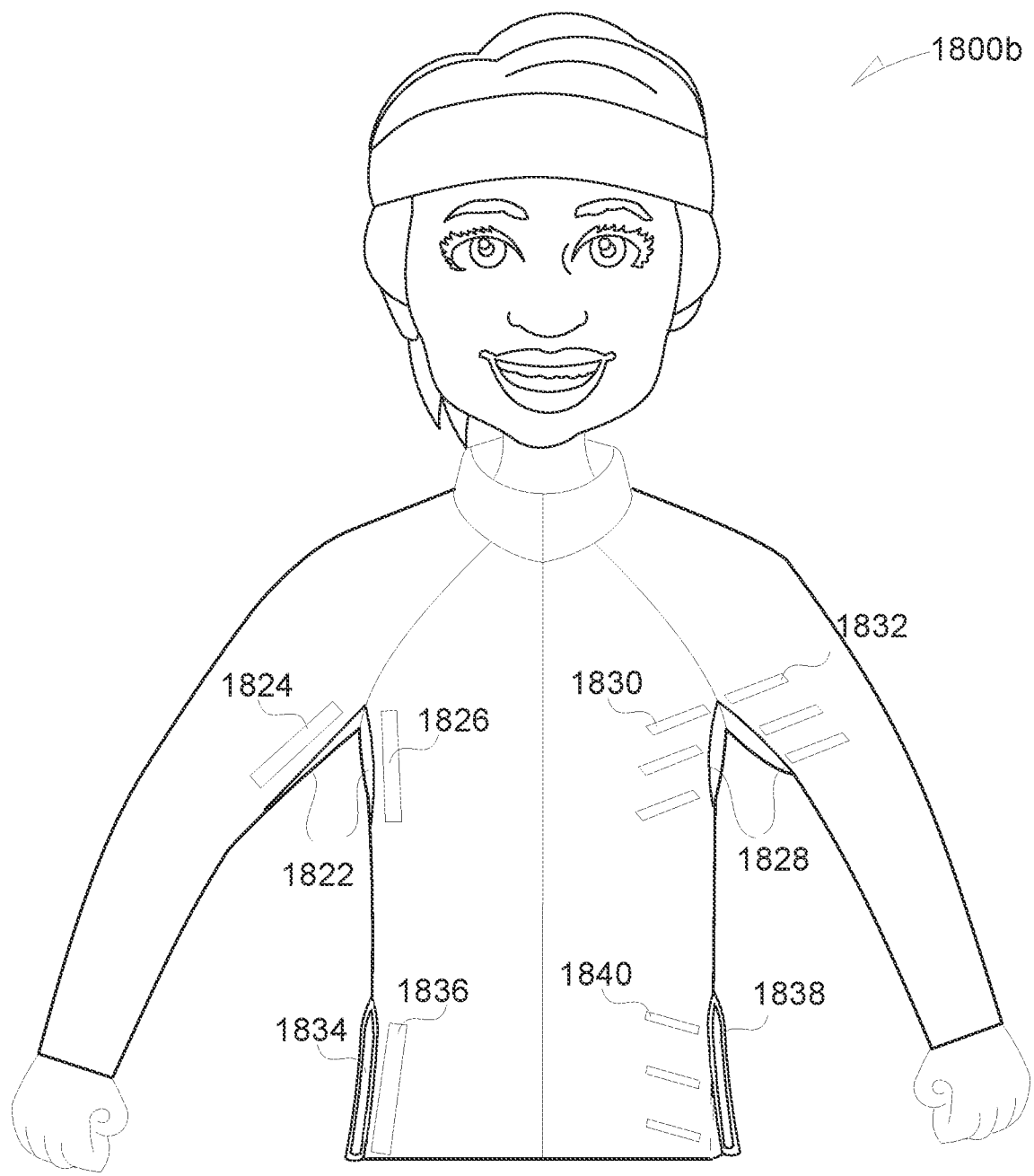

FIG. 18B shows a view of an article of apparel such as a second cool down jacket 1800b in accordance with some embodiments. In the example of FIG. 18B, first and second lateral apertures 1822 and 1828 can extend in respective underarm areas toward a torso area of the cool down jacket 1800b. On a first side of the jacket, oppositely-oriented or orthogonal electrodes 1824 and 1826 of a clutch device can be positioned adjacent to an opening provided by the first lateral aperture 1822. On a second side of the jacket, parallel electrodes 1830 and 1832 can be positioned adjacent to an opening provided by the second lateral aperture 1828. Additional apertures such as torso apertures 1834 and 1838 can be provided with corresponding electrodes of respective clutch devices 1836 and 1840. The electrodes of clutch devices adjacent or proximate to the apertures can be configured to selectively open or close the apertures to thereby allow or inhibit airflow through the apertures and therefore through the article of apparel to the wearer. Control assemblies for the various clutch devices or electrodes can be positioned anywhere on the cool down jacket 1800b, and are not shown in the illustrated example. Conductors to control electrode behavior can be routed through or adjacent to a textile or other material that comprises the jacket.

Figure 18C:
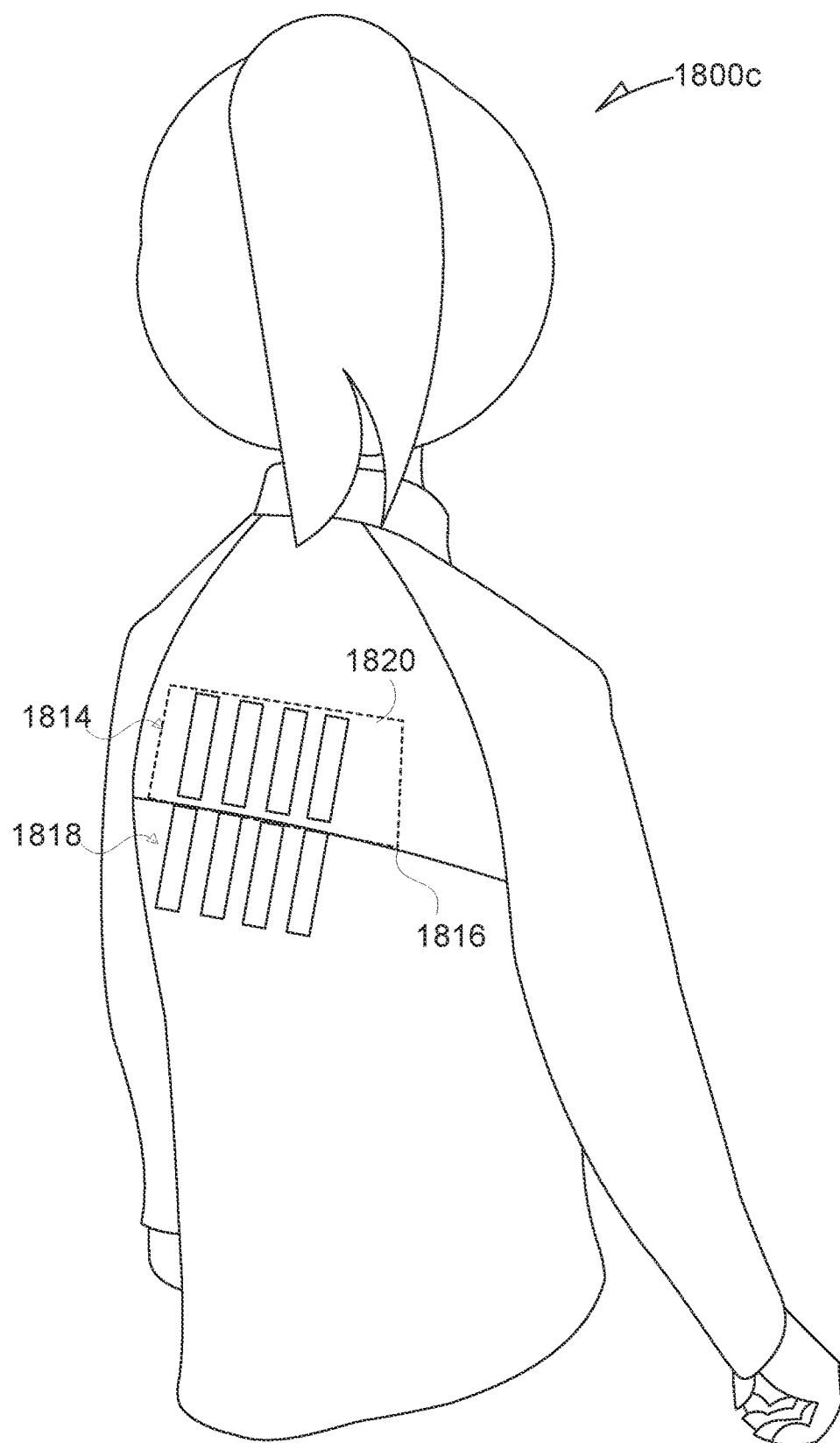

FIG. 18C shows a view of an article of apparel such as a third cool down jacket 1800c in accordance with some embodiments. In the example of FIG. 18C, a lateral aperture 1816 traverses the back side of the cool down jacket 1800 at an upper back portion of the jacket. One or more clutch devices can be coupled adjacent to the aperture. In the example shown, multiple upper electrodes 1814 of one or multiple clutch devices can be positioned orthogonally to the lateral aperture 1816 and multiple lower electrodes 1818 of one or multiple clutch devices can be positioned orthogonally to the lateral aperture 1816. Pairs of the upper and lower electrodes may be configured to clutch in tandem and/or independently.

In an example, the third cool down jacket 1800c includes an embedded temperature sensor, such as the temperature sensor 130, to determine a temperature of the wearer. When the temperature of the wearer is lower than a specified threshold temperature, the various upper and lower electrodes can be energized to close the lateral aperture 1816 or a portion thereof. When the temperature of the wearer is greater than the specified threshold temperature, the upper and lower electrodes can be de-energized to allow the textile materials to relax and allow more airflow through the lateral aperture 1816 to reach the wearer.

In some embodiments, the third cool down jacket 1800c includes a flap 1820 to cover the lateral aperture 1816. The flap 1820 can include a manual affixation mechanism to physically couple the flap over the aperture. Some articles of apparel may include more than one aperture and a corresponding flap or clutch for each aperture.

Figure 18D:
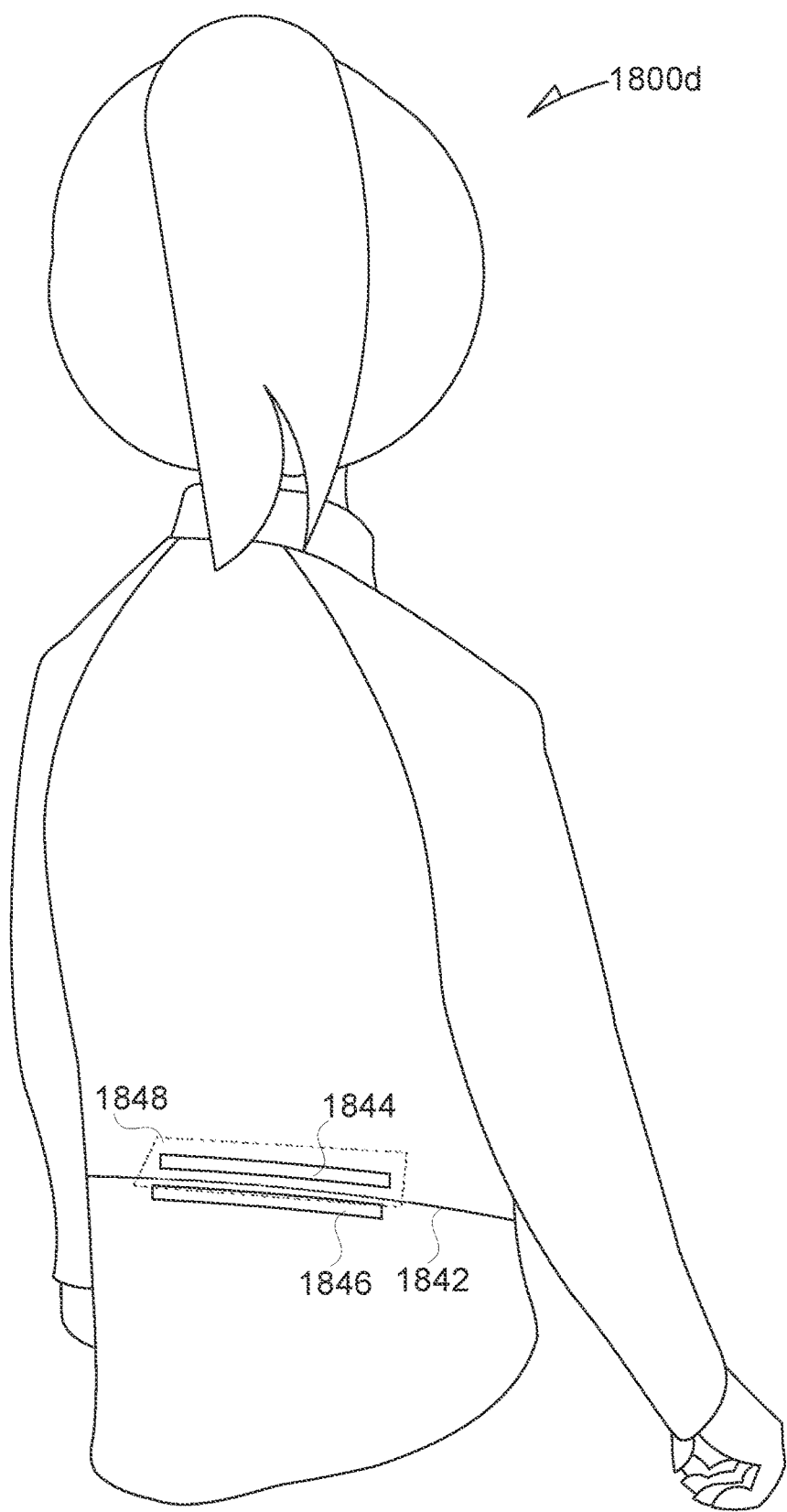

FIG. 18D shows a view of an article of apparel such as a fourth cool down jacket 1800d in accordance with some embodiments. In the example of FIG. 18D, a lateral aperture 1842 traverses the back side of the cool down jacket 1800 at a lower back portion. A clutch can be provided to selectively open and close the lateral aperture 1842. For example, the clutch can include an upper clutch electrode 1844 positioned along a first side of the lateral aperture 1842 and can include a lower clutch electrode 1846 positioned along an opposite second side of the lateral aperture 1842. In other words, the electrodes can comprise elongate electrodes that are provided substantially in parallel with the lateral aperture 1842. The upper and lower clutch electrodes 1844 and 1846 can be selectively energized to close the aperture 1842 or de-energized to open the aperture 1842. The example of the fourth cool down jacket 1800d can include a flap 1848 to cover the clutch. In an example, a combination of orthogonal and parallel placements of the electrodes may be used. Other orientations including acute and obtuse angular positioning with respect to the aperture(s) can similarly be used. Although the examples of FIGS. 18A-18D are presented as different cool down jackets, the various features of the cool down jackets can be used together or combined in various permutations.

Figure 18E:
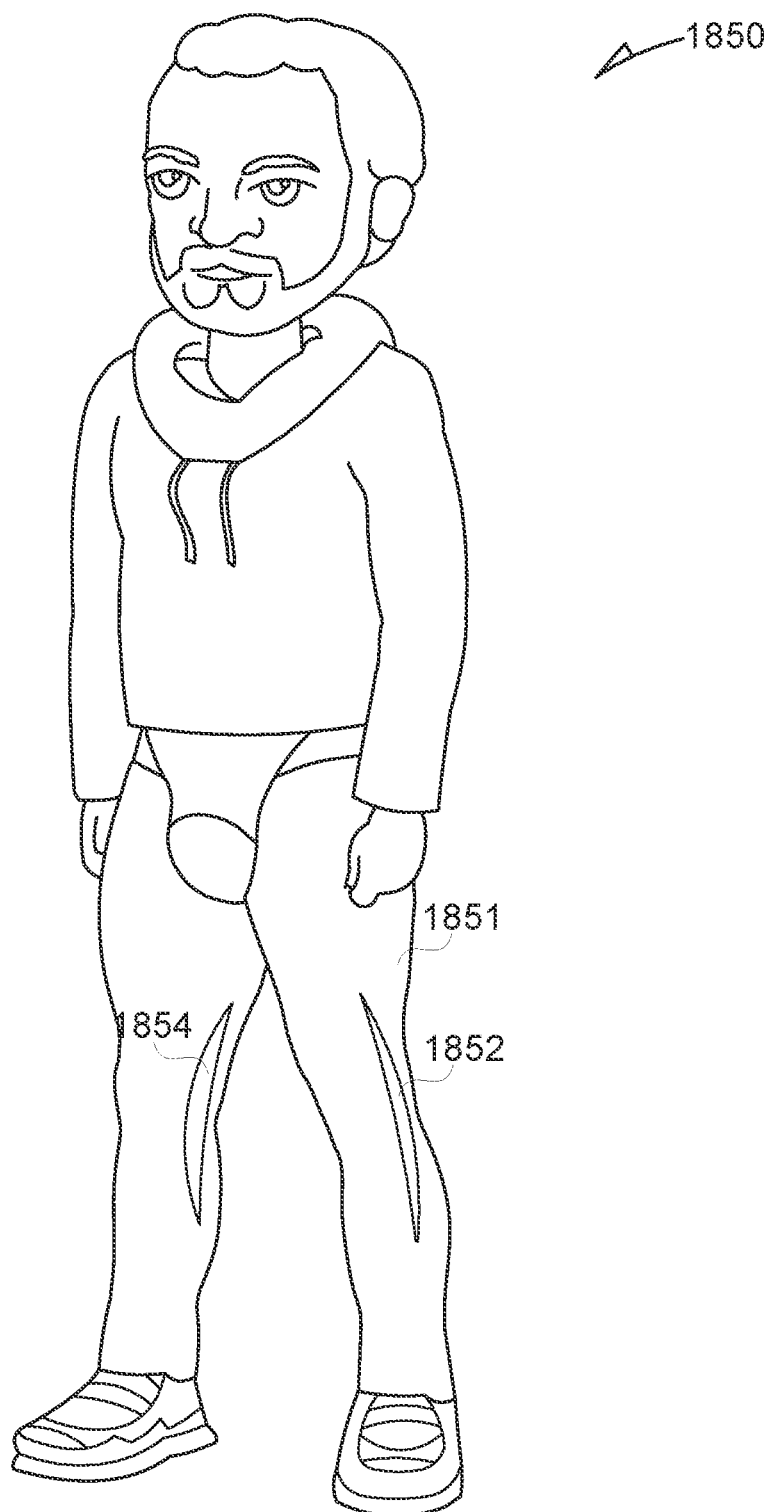
Figure 18F:
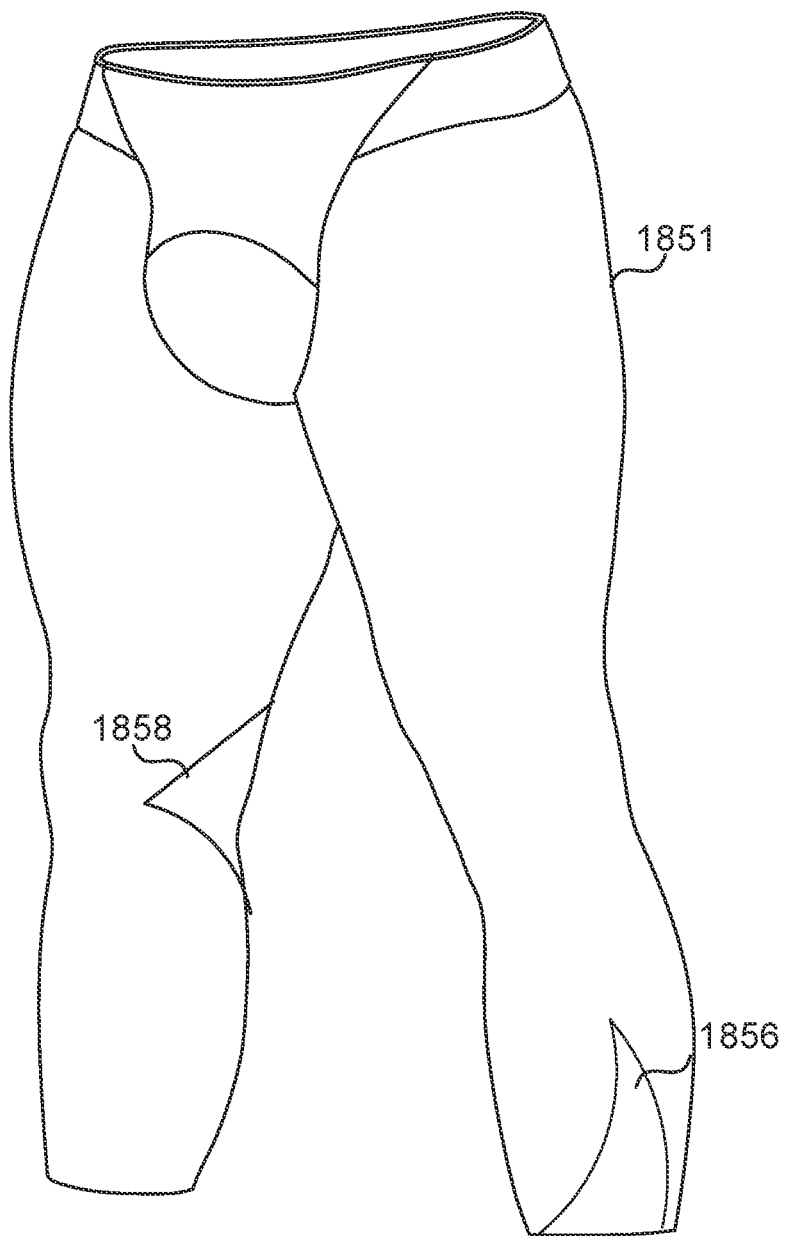
Figure 18G:
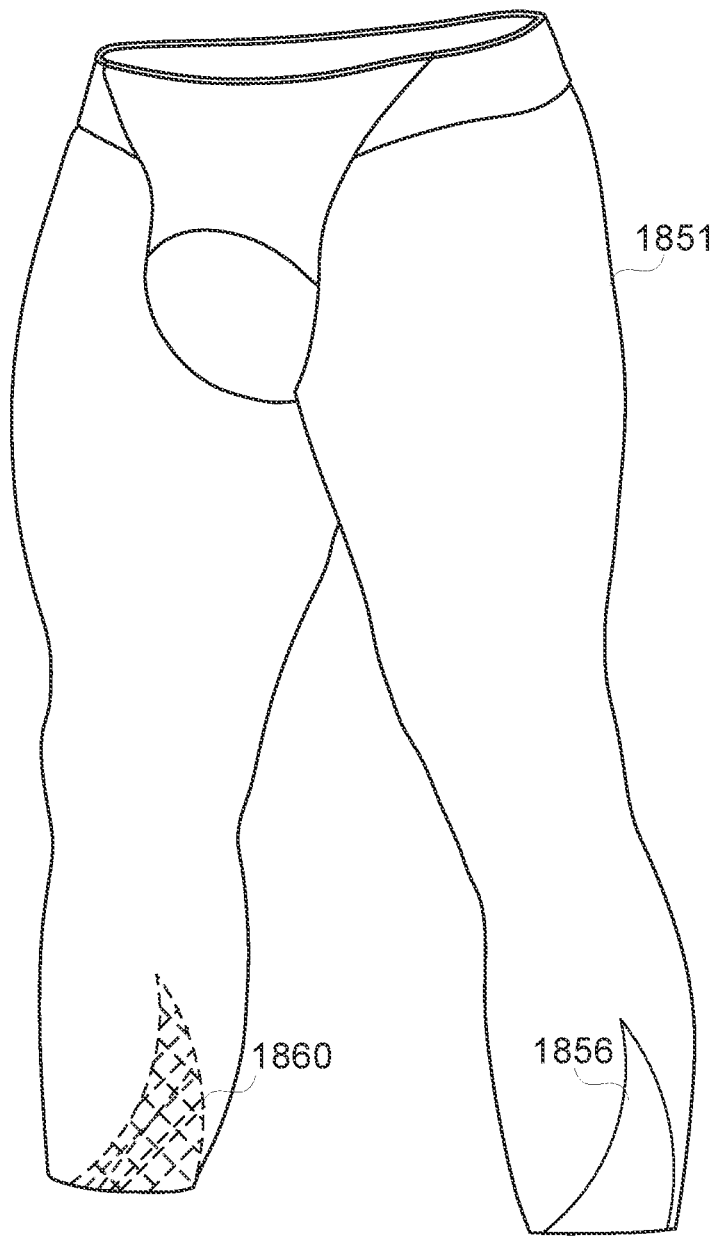

FIG. 18E-G shows an example 1850 that includes an article of apparel such as a pair of cool down pants 1851 in accordance with some embodiments. The article of apparel may be a lower-body apparel item such as a pair of leggings or pants 1851. The leggings or pants 1851 can include a leg panel having an aperture. Side edges or portions of the aperture can be coupled to electrodes of one or more electroadhesive clutch devices to selectively open or close the aperture in the leggings or pants. Possible locations of apertures include at an inner thigh area 1854 or outer thigh area 1852.

As shown in FIG. 18F, the cool down pants 1851 can include a panel having an aperture behind a knee region 1858 and/or at an ankle region 1856. An aperture can be provided at any other location on the pants such as corresponding to a body area that typically produces high amounts of body heat or perspiration. As shown in FIG. 18G, the cool down pants 1851 can include slits at textile seams or pockets, and can include a mesh layer at or under an aperture to provide a flexible, breathable, yet continuous article of apparel as indicated by the mesh paneling at aperture 1860.

The clutch devices or clutch system in articles of apparel discussed herein can be configured to operate in a manner such that clutch electrodes are attracted to each other, or can be configured to disengage or relax. In an example, other features can be included such that clutch electrodes, or portions of garments that include the electrodes, can repel each other. That is, clutch electrodes can comprise a portion of an aperture control mechanism that can be configured to open an aperture (e.g., slit, or pocket) such as to provide selective venting of body heat or to help dissipate perspiration. The aperture can be biased using optional mechanical means such as elastic to achieve a normally open or normally closed configuration in the absence of electrical signal actuation.

Figure 19:
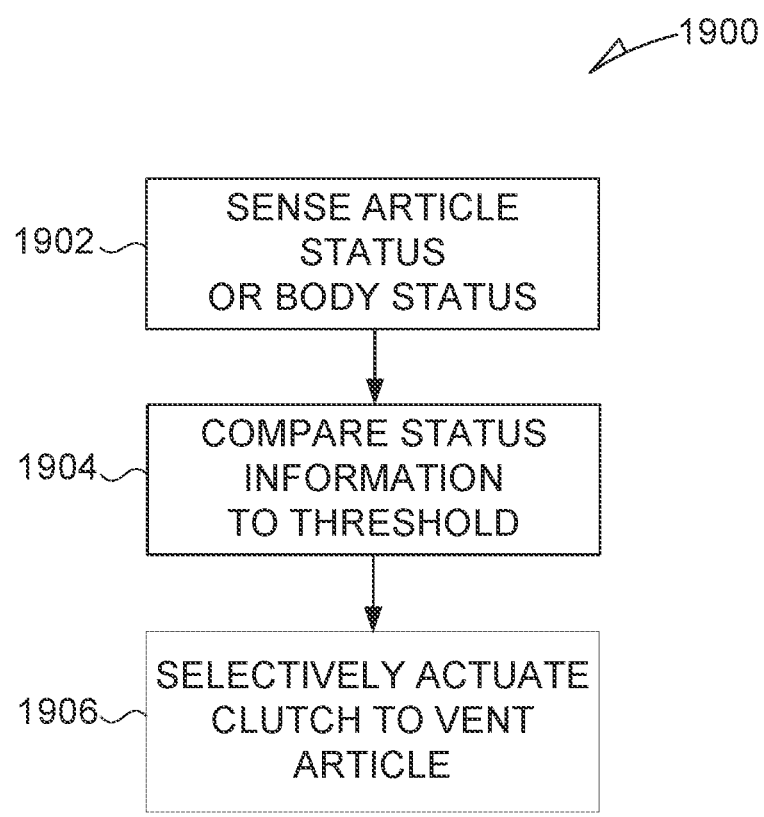
FIG. 19 illustrates generally an example of a ventilation method.

FIG. 19 illustrates generally an example of a ventilation method 1900. The ventilation method 1900 can include or use various elements of the first clutch system 200, the electroadhesive system 302, or the second clutch system 400, or other systems or devices discussed herein, such as to selectively vent an article of apparel.

At block 1902, the ventilation method 1900 can include sensing an article status or a body status, Block 1902 can include, for example, using one of the sensors 120 to sense information about a wearable article or information about a body that is near or wearing the article. In an example, block 1902 can include sensing information about movement of the wearable article, or information about a temperature or moisture content of the wearable article. In an example, block 1902 can include sensing information about an activity level of the wearer of the article, or a temperature of the wearer of the article.

At block 1904, the ventilation method 1900 can include comparing status information, such as about the article or body, to a specified threshold condition. For example, block 1904 can include comparing body temperature information acquired at block 1902 to a threshold body temperature. In another example, block 1904 can include comparing motion information acquired at block 1902 to a threshold motion condition.

At block 1906, the ventilation method 1900 can include selectively actuating a clutch to vent an article of apparel. For example, block 1906 can include actuating one or more of the clutch devices in the cool down jacket 1800 based on the article status or body status information sensed at block 1902.

In an example, the ventilation method 1900 can be applied to various different articles including, but not limited to, shorts, leggings, pants, athletic supporter; sweatpants, or other article of apparel with a ventilation system. In an example, the ventilation method 1900 can include coordinating ventilation among multiple different articles or devices, such as based on one or more inputs. For example, vents in a jacket and vents in pants can be actuated together, such as in response to the same information from a body temperature sensor. Articles of apparel that can include or use a ventilation system are not limited to but include apparel articles configured to be worn over high temperature regions of a body including armpits, chest, and back, or over body portions that are prone to perspire.

Figure 20A:
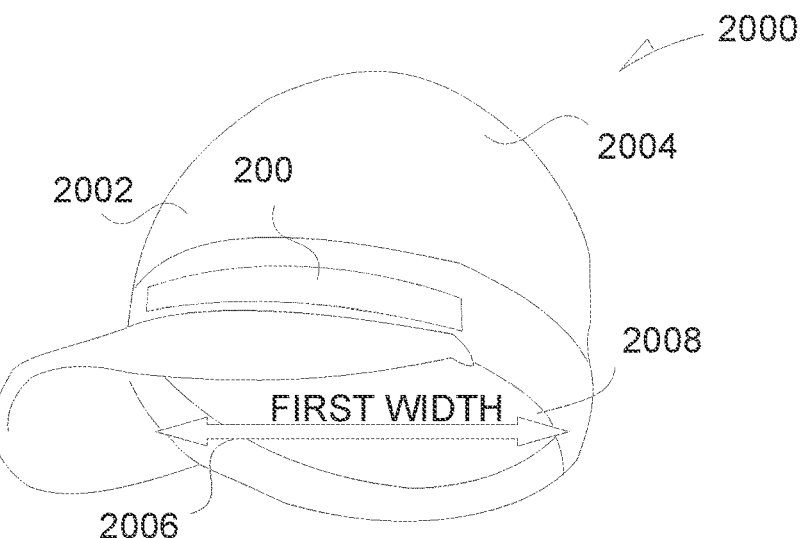
FIG. 20A and FIG. 20B show examples of an article of apparel in relaxed and stretched configurations, respectively.
Figure 20B:
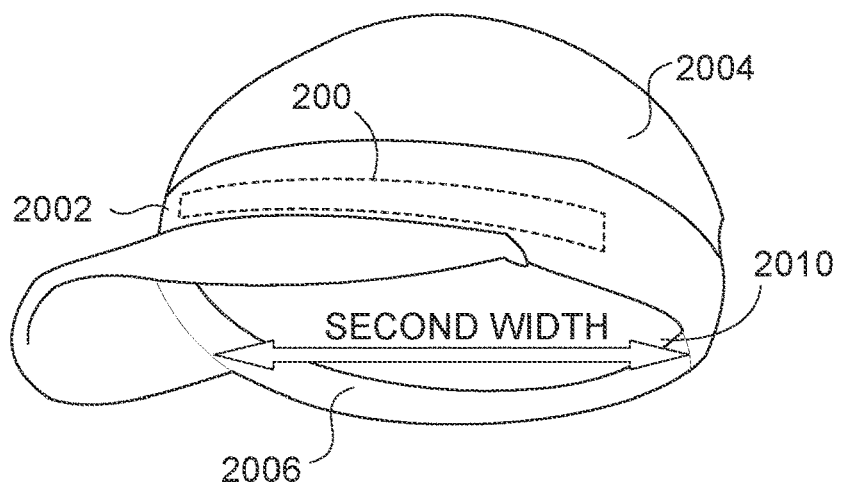
Figure 20C:
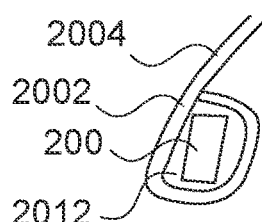
FIG. 20C illustrates generally a cross-section view of a portion of an article of apparel with a clutch system.

FIG. 20A and FIG. 20B show examples 2000 of a hat 2002 in relaxed and stretched configurations, respectively. FIG. 20C is a detailed side cutaway of a portion of the hat 2002 to illustrate positioning of the first clutch system 200 with respect to the rest of the hat 2002. While the first clutch system 200 is described, it is to be recognized that any clutch system described herein may be incorporated in addition or alternatively.

The hat 2002 is formed from a textile 2004, such as knit, woven, canvas, or other fabric or material that may be utilized as a hat. The textile 2004 and the hat 2002 more generally forms an opening 2006 sized to admit the head of a wearer and cover the top of the wearer's head. Because of the securing the first clutch system 200 (obscured) proximate the opening, the ability of the wearer to increase the size of the opening 2006 may be constrained. The first clutch system may be sewn, fastened, or otherwise affixed to the textile 2004 such that the operation of the first clutch system 200 as disclosed herein is able to inhibit the stretching of the textile 2004 as disclosed herein.

The first clutch system 200 is illustrated as extending around some but not all of the circumference of the opening 2006. However, it is to be recognized and understood that the first clutch system 200 may extend around a complete circumference of the opening 2006. Moreover, while only one first clutch system 200 is illustrated, it is to be recognized and understood that multiple first clutch systems 200 may be included in the hat 2002. The additional first clutch assemblies 200 may be around other portions of the opening 2006 or may be positioned at other locations around the hat 2002 to selectively inhibit the elasticity or stretchability of those locations consistent with the principles disclosed herein.

The textile 2004 may be elastic or otherwise able to stretch in one or more dimensions, allowing the size of the opening 2006 to increase from a first width 2008 to a second width 2010 larger than the first width 2008. It is noted that for the purposes of this illustration that only two widths are illustrated, but it is to be recognized and understood that the width of the opening 2006 may be increased or decreased across a range of widths, up to the capacity of the textile 2004 to stretch without breaking. As such, the first width 2008 and second width 2010 are presented for the purposes of illustration and not limitation.

The operation of the first clutch system 200 may inhibit the ability of a wearer to increase the size of the opening 2006 from the first width 2008 to the second width 2010. For example, when the processor circuit 304 causes the signal generator 306 to energize the first and second electrode assemblies 202, 208, the first clutch system 200 is inhibited from expanding and, consequently, the opening 2006 is not able to increase from the first width 2008 to the second width 2010. It is noted that because of the operation of the first clutch system 200, the hat 2002 may not be inhibited from relaxing from the second width 2010 back to the first width 2008 when the signal generator 306 is energizing the first and second electrode assemblies 202, 208. Consequently, the first clutch system 200 may be configured to set a maximum width for the opening 2006 but not necessarily a minimum width of the opening 2006.

As shown in FIG. 20C, the textile 2004 of the hat 2002 may form a cavity 2012 in which the first clutch system 200, or one or more components thereof, is positioned. Alternatively, the first clutch system 200 may be secured to a side of the textile 2004 or may be secured between layers of the textile 2004 or according to any suitable configuration or mechanism.

The first clutch system 200 may operate according to the same control systems described herein, Thus, one or more sensors may detect an orientation or use of the hat 2002 and engage or disengage the first clutch system 200 depending on the circumstance of use of the hat 2002.

Figure 21A:
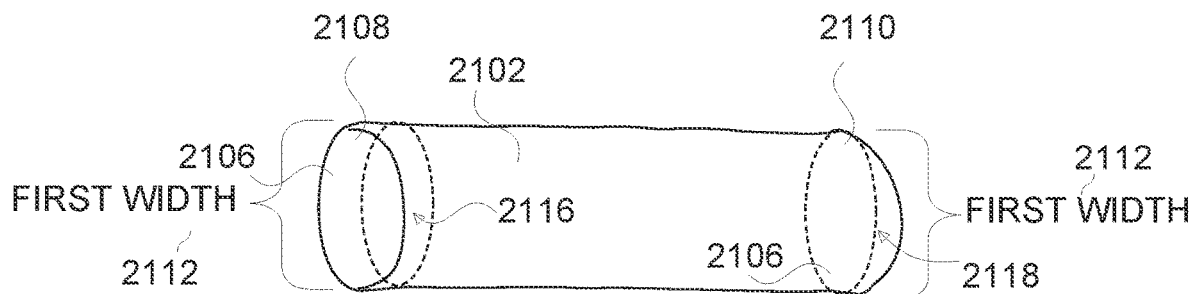
FIG. 21A, FIG. 21B, and FIG. 21C illustrate examples of a clutch system used in or with sleeves of an article of apparel.
Figure 21B:
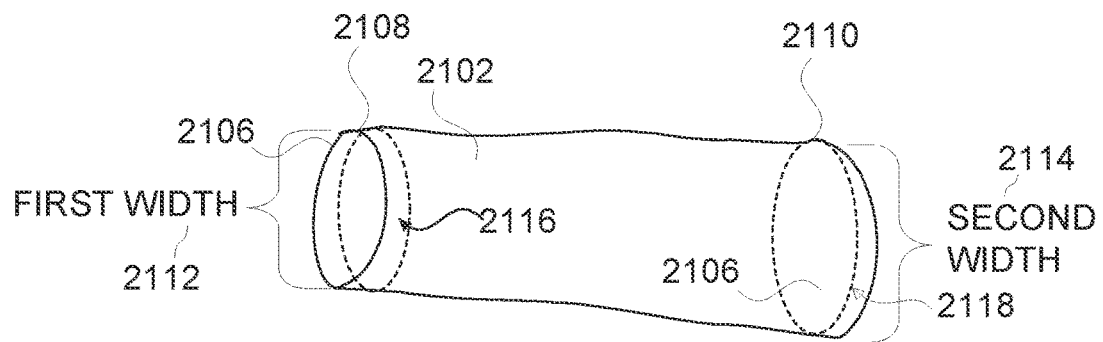
Figure 21C:
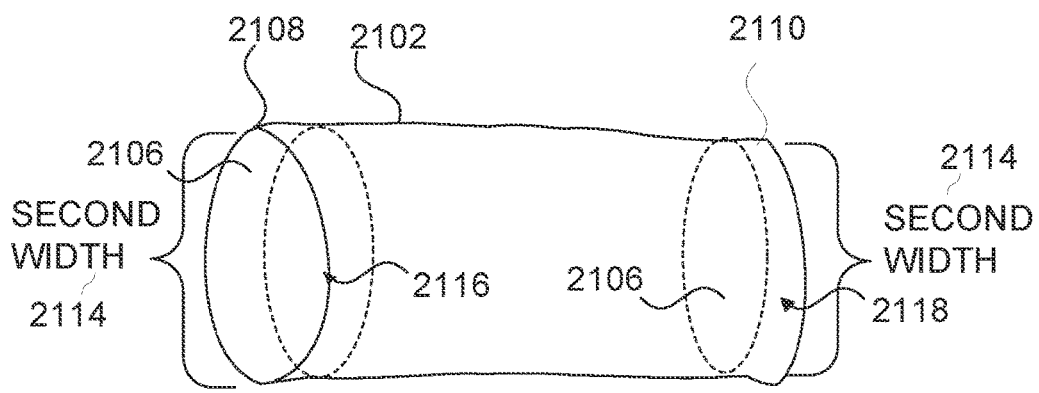

FIG. 21A-FIG. 21C illustrate the incorporation of the first clutch system 200 into a sleeve 2102, in an example embodiment. While the sleeve 2102 is presented as a single wearable article, the principles disclosed here may apply to any wearable article that incorporates a sleeve or other aperture or opening, such as at neck, waist, or arm apertures in a shirt or jacket, waist or ankle or other leg opening apertures in pants, or any other suitable wearable article. The sleeve 2102 is provided to illustrate the operation of a system with multiple first clutch systems 200A, 200B operating together. The sleeve 2102 can be formed, from a textile or other material that is elastic or stretchable and formed into a generally tubular shape with openings 2106 at a first end 2108 and a second end 2110 opposite the first end.

The sleeve 2102 includes a first example clutch system 2116 and a second example clutch system 2118 located around the openings 2106 proximate the first end 2108 and the second end 2110, respectively. The first example clutch system 2116 and the second example clutch system 2118 may be independently controllable to allow the opening 2106 proximate the first end 2108 and the second end 2110 to be independently expandable or not expandable in the same manner as the opening 2006 of the hat 2002. Consequently, the sleeve 2102 may be enabled to have a first width 2112 or a second width 2114 at either or both of the first end 2108 and the second end 2110. Consequently, as illustrated in FIG. 21B, if the first example clutch system 2116 is active but the second example clutch system 2118 is not active, then the opening 2106 proximate the first end 2108 is held at the first width 2112 while the opening 2106 proximate the second end 2110 is allowed to expend to the second width 2114. If the first example clutch system 2116 is deactivated then the opening 2106 proximate the first end 2108 is allowed to expand to the second width 2114 as well, as illustrated in FIG. 21C, FIG. 21A illustrates the sleeve 2102 in a relaxed state with the opening 2106 proximate both the first and second ends at the first width 2112.

Figure 22A:
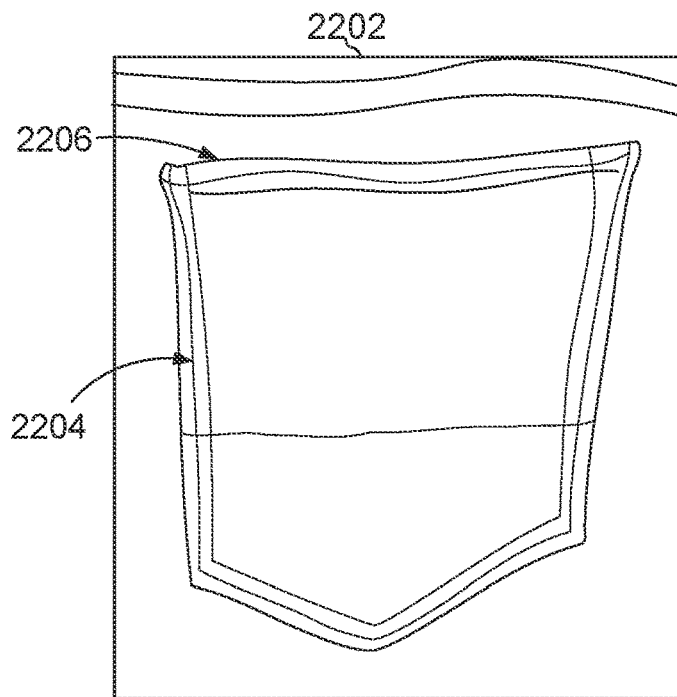
FIG. 22A illustrates generally an example of an article of apparel that includes a pocket with access that can be controlled by an electroadhesive clutch device.
Figure 22B:
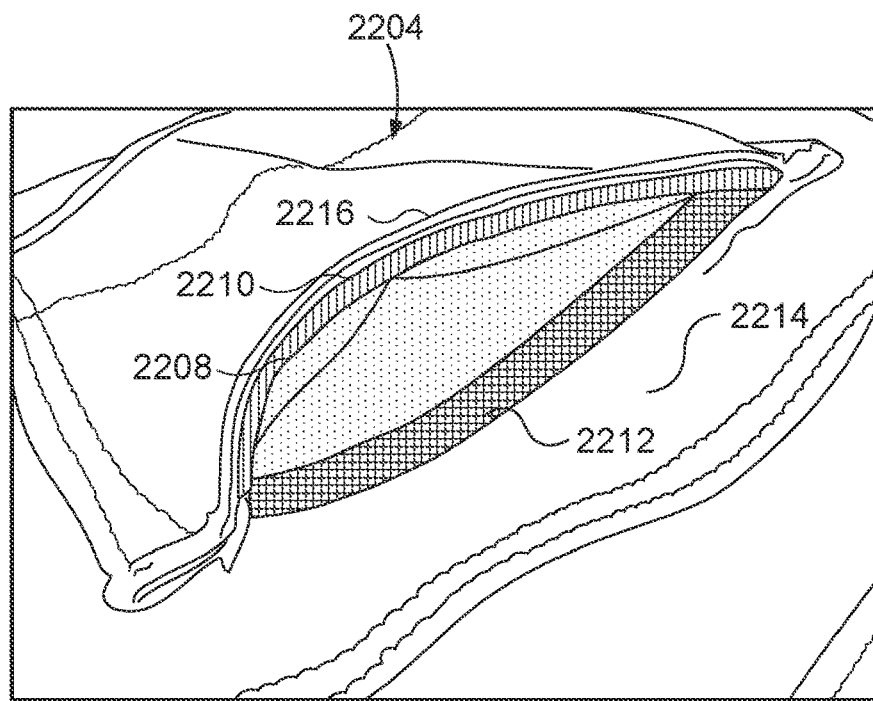
FIG. 22B illustrates generally a view of an open pocket showing an electrode configuration for use with an electroadhesive clutch device.

FIG. 22A and FIG. 22B illustrate generally an apparel example 2202 that includes a pocket assembly 2204 with a pocket opening 2206 that can be controlled by an electroadhesive clutch device, or pocket clutch. FIG. 22A illustrates generally a top view of the apparel example 2202 and FIG. 22B illustrates generally a view of the pocket assembly 2204 in a partially open configuration. Various portions of a clutch device are visible in the example of FIG. 22B, and the clutch device can control access to an interior portion of the pocket assembly 2204.

In the example of FIG. 22B, the pocket assembly 2204 is partially open, with a pocket edge 2216 positioned away from an apparel fabric 2214 or base portion of the pocket assembly 2204. When the pocket assembly 2204 is open, objects can be readily inserted into or removed from an interior area 2208 of the pocket assembly 2204. The pocket assembly 2204 can include an exterior clutch electrode 2210 provided adjacent to the pocket edge 2216, and the pocket assembly 2204 can include an interior clutch electrode 2212 provided at or on the apparel fabric 2214. When the pocket assembly 2204 is closed, such as due to a mechanical or elastic bias or due to actuation of an electroadhesive force between the electrodes, the exterior clutch electrode 2210 and the interior clutch electrode 2212 can be substantially aligned and adjacent to each other. For example, in the top view of FIG. 22A and when the pocket assembly 2204 is closed, the electrodes can be concealed by the textile or fabric portions of the apparel example 2202.

In an example, an aperture control mechanism can be configured to operate such that the textile areas corresponding to the electrodes of the clutch repel each other to thereby open an aperture (e.g., a slit, or pocket). The aperture can be biased toward an open or closed configuration using mechanical means such as elastic such that, when in a repel mode, the aperture can take the opposite configuration. In an example, the pocket assembly 2204, such as including the exterior clutch electrode 2210 and interior clutch electrode 2212 that comprise a clutch device at an opening of the pocket, can be biased toward an open or relaxed pocket configuration, and can optionally include using mechanical means such as elastic. When the electrodes of the pocket clutch are energized using attractive signals (e.g., signals having opposite polarity), the pocket opening 2206 of the pocket assembly 2204 can be effectively sealed shut. That is, when energized, a user would have to overcome the electrostatic force developed between the electrodes in order to insert or remove an object from the interior area 2208 of the pocket. When the aperture control mechanism of the pocket is configured to repel, the pocket opening 2206 of the pocket assembly 2204 can be forced into an open configuration.

In an example, the pocket clutch can include or use the first clutch system 200, or can comprise a portion of the adaptive support system 100, or components thereof. The pocket clutch, which can control access to the interior area 2208 of the pocket assembly 2204 via an aperture, can optionally be controlled automatically using information from a sensor, such as including one or more of the sensors 120 from the example of the adaptive support system 100. For example, the pocket clutch can be actuated to seal or shut a pocket when the accelerometer 124 detects motion (e.g., motion that meets or exceeds a specified activity level threshold) or detects a particular orientation (e.g., an orientation or position that could cause objects inside of the pocket to fall out, such as an upside-down or inverted orientation).

In an example, the pocket clutch can be actuated to release the pocket assembly 2204 under specified orientation or motion conditions, or in response to a user command. The aperture or pocket opening 2206 can thus help prevent theft by selectively locking out access unless or until access is permitted by a user with the appropriate control or command. In an example, a user can use a gesture-based locking or unlocking command to control pocket access or clutch behavior, and the gesture command can be detected using one or more of the sensors 120.

In an example, the pocket clutch can include an exposed (or nearly exposed or partially, exposed) electrode portion that is configured to be selectively energized. The exposed electrode can optionally comprise a portion of one of the exterior clutch electrode 2210 or the interior clutch electrode 2212 at or near the clutch at the aperture, such as at the pocket edge 2216, or on an outer-facing surface of the apparel fabric 2214 at or near the pocket opening 2206, or can comprise a separate electrode. The exposed electrode can be configured to deliver a deterrent shock when touched. For example, when the pocket clutch is activated to retain the pocket assembly 2204 in a closed configuration, the exposed electrode portion can augment or enhance theft deterrence by providing a shock to a hand of an unsuspecting pickpocket. The exposed electrode portion can be discharged by a user or can be discharged automatically based on, e.g., a specified sensor signal, to permit pocket access. In an example, a deterrent shock circuit can be provided to drive the exposed electrode. The circuit can include a power source, a capacitor, and optionally a transformer, such as can be configured to generate a relatively large voltage with little current.

Figure 23:
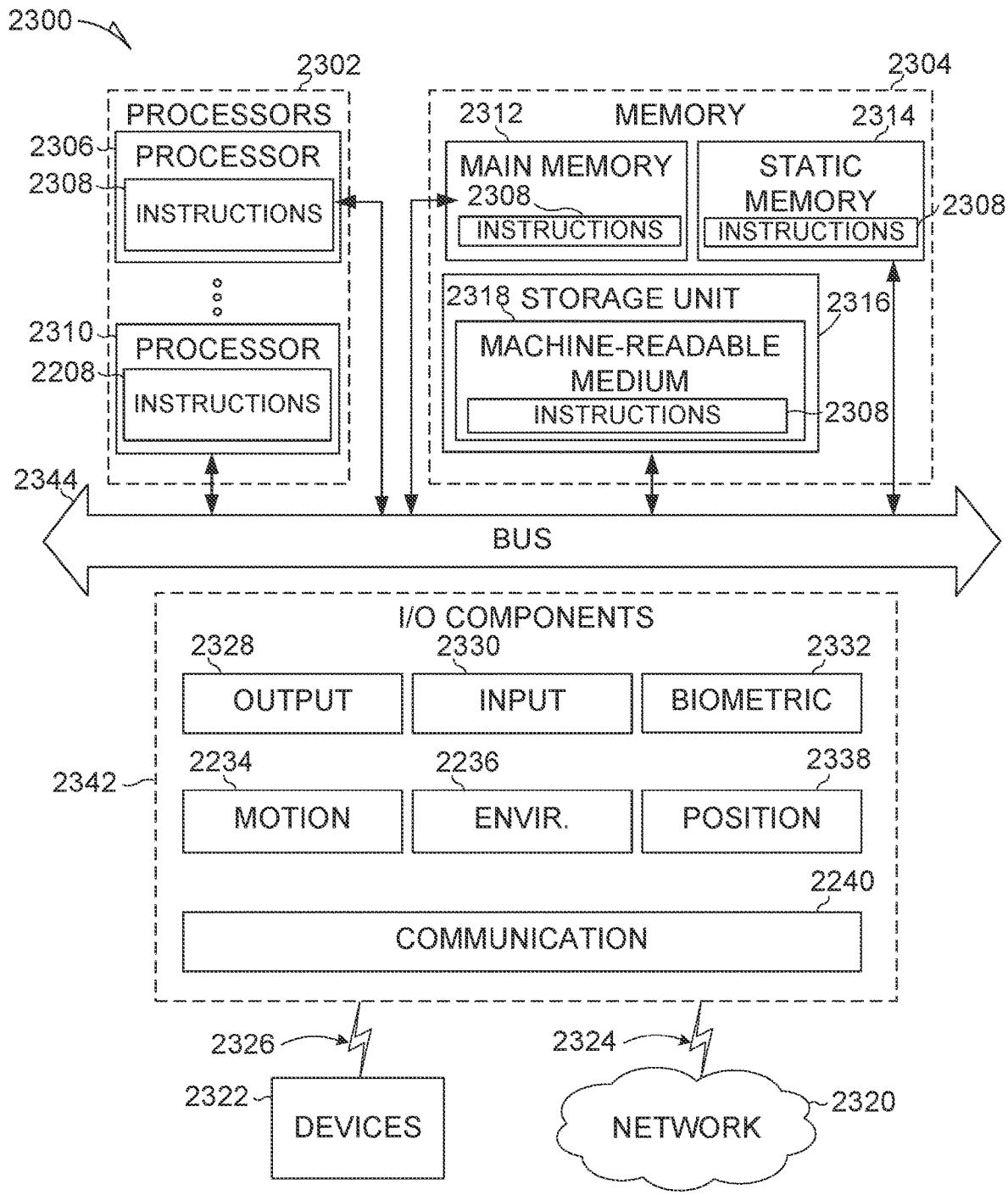
FIG. 23 is a block diagram illustrating an example computing device capable of performing aspects of the various techniques discussed herein.

FIG. 23 is a diagrammatic representation of a machine 2300 within which instructions 2308 (e.g., software, a program, an application, and applet, an app, or other executable code) for causing the machine 2300 to perform any one or more of the methodologies discussed herein may be executed. For example, the instructions 2308 may cause the machine 2300 to execute any one or more of the methods described herein, such as to control a clutch system. The instructions 2308 transform the general, non-programmed machine 2300 into a particular machine 2300 programmed to carry out the described and illustrated functions in the manner described. The machine 2300 may operate as a standalone device or may be coupled (e.g., networked) to other machines, such as to coordinate actions or actuation of multiple different clutch devices or clutch systems. In a networked deployment, the machine 2300 may operate in the capacity of a server machine or a client machine in a server-client network environment, or as a peer machine in a peer-to-peer (or distributed) network environment. The machine 2300 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 2308, sequentially or otherwise, that specify actions to be taken by the machine 2300. Further, while only a single machine 2300 is illustrated, the term "machine" shall also be taken to include a collection of machines that individually or jointly execute the instructions 2308 to perform any one or more of the methodologies discussed herein.

The machine 2300 may include processors 2302, memory 2304, and I/O components 2342, which may be configured to communicate with each other via a bus 2344. In an example embodiment, the processors 2302 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an ASIC, a Radio-Frequency Integrated Circuit (RFIC), another processor, or any suitable combination thereof) may include, for example, a processor 2306 and a processor 2310 that execute the instructions 2308. The term "processor" is intended to include multi-core processors that may comprise two or more independent processors (sometimes referred to as "cores") that may execute instructions contemporaneously. Although FIG. 23 shows multiple processors 2302, the machine 2300 may include a single processor with a single core, a single processor with multiple cores (e.g., a multi-core processor), multiple processors with a single core, multiple processors with multiples cores, or any combination thereof.

The memory 2304 includes a main memory 2312, a static memory 2314, and a storage unit 2316, both accessible to the processors 2302 via the bus 2344. The main memory 2304, the static memory 2314, and storage unit 2316 store the instructions 2308 embodying any one or more of the methodologies or functions described herein. The instructions 2308 may also reside, completely or partially, within the main memory 2312, within the static memory 2314, within machine-readable medium 2318 within the storage unit 2316, within at least one of the processors 2302 (e.g., within the processor's cache memory), or any suitable combination thereof, during execution thereof by the machine 2300.

The I/O components 2342 may include a wide variety of components to receive input, provide output, produce output, transmit information, exchange information, capture measurements, and so on. The specific I/O components 2342 that are included in a particular machine will depend on the type of machine. For example, portable machines such as mobile phones may include a touch input device or other such input mechanisms, while a headless server machine will likely not include such a touch input device. It will be appreciated that the I/O components 2342 may include many other components that are not shown in FIG. 23. In various example embodiments, the I/O components 2342 may include output components 2328 and input components 2330. The output components 2328 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators such as the signal generator 110 or signal generator 306, and so forth. The input components 2330 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 2342 may include the sensors 120 such as can comprise one or more of biometric components 2332, motion components 2334, environmental components 2336, or position components 2338, among a wide array of other components. For example, the biometric components 2332 include components to detect expressions (e.g., hand expressions, facial expressions, vocal expressions, body gestures, or eye tracking), measure biosignals (e.g., blood pressure, heart rate, body temperature, perspiration, muscle oxygenation, or brain waves), identify a person (e.g., voice identification, retinal identification, facial identification, fingerprint identification, or electroencephalogram-based identification), and the like. The motion components 2334 include acceleration sensor components (e.g., accelerometer), gravitation sensor components, rotation sensor components (e.g., gyroscope), and so forth. The environmental components 2336 include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 2338 include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 2342 further include communication components 2340 operable to couple the machine 2300 to a network 2320 or devices 2322 via a coupling 2324 and a coupling 2326, respectively. For example, the communication components 2340 may include a network interface component or another suitable device to interface with the network 2320. In further examples, the communication components 2340 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 2322 may be another machine or any of a wide variety of peripheral devices e.g., a peripheral device coupled via a USB).

Moreover, the communication components 2340 may detect identifiers or include components operable to detect identifiers. For example, the communication components 2340 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes and other optical codes), or acoustic detection components (e.g., microphones to identify tagged audio signals). In addition, a variety of information may be derived via the communication components 2340, such as location via Internet Protocol (IP) geolocation, location via Wi-Fi® signal triangulation, location via detecting an NFC beacon signal that may indicate a particular location, and so forth.

The various memories (e.g., memory 2304, main memory 2312, static memory 2314, and/or memory of the processors 2302) and/or storage unit 2316 may store one or more sets of instructions and data structures (e.g., software) embodying or used by any one or more of the methodologies or functions described herein. These instructions (e.g., the instructions 2308), when executed by processors 2302, cause various operations to implement the disclosed embodiments.

The instructions 2308 may be transmitted or received over the network 2320, using a transmission medium, via a network interface device (e.g., a network interface component included in the communication components 2340) and using any one of a number of well-known transfer protocols (e.g., hypertext transfer protocol (HTTP)). Similarly, the instructions 2308 may be transmitted or received using a transmission medium via the coupling 2326 (e.g., a peer-to-peer coupling) to the devices 2322.

Various aspects of the present disclosure can help provide a solution to the activewear or apparel-related or clutch system problems identified herein. For example, various aspects of the present disclosure are directed to flexible and stretchable water-proof encapsulation for actuator integration into apparel.

In an example, Aspect 1 can include or use subject matter such as an article of apparel that can include or use an electroadhesive clutch device comprising an elongate encasing forming a watertight enclosure, a first electrode assembly positioned within the watertight enclosure, and a second electrode assembly, positioned within the watertight enclosure, the second electrode distinct from the first electrode, and at least partially overlapping and configured to slide relative to the first electrode, an electrical signal generator configured to provide first and second signals to the first and second electrode assemblies, respectively, wherein the first electrode assembly can be configured to slide laterally relative to the second electrode assembly when the first and second signals are not applied and remain static relative to the second electrode assembly when the first and second signals are applied, and a textile material to which the elongate flexible encasing can be attached at least at a first end of the elongate flexible encasing, wherein actuation of the clutch device is configured to selectively cause a portion of the article of apparel to be immobilized (e.g., remain static or in a fixed configuration or orientation) or to be mobilized (e.g., to be movable or flexible or otherwise capable of movement of at least a portion of the clutch device or the apparel or the encasing).

Aspect 2 can include, or can optionally be combined with Aspect 1 to include, the elongate encasing as a flexible encasing that is made of or comprises an elastic material.

Aspect 3 can include, or can optionally be combined with any one or more of Aspects 1 or 2 to include, a lateral portion of the encasing including a ribbed texture.

Aspect 4 can include, or can optionally be combined with Aspect 3 to include, the ribbed texture comprising rubber.

Aspect 5 can include, or can optionally be combined with any one or more of Aspects 1-4 to include, a water repellant finish on an outer-facing surface of the encasing.

Aspect 6 can include, or can optionally be combined with any one or more of Aspects 1-5 to include, the first electrode assembly of the electroadhesive clutch substantially fixed relative to a first end of the elongate flexible encasing, the second electrode assembly of the electroadhesive clutch substantially fixed relative to a second end of the elongate flexible encasing, and a middle section of the elongate encasing is configured to move relative to the first and second electrode assemblies.

Aspect 7 can include, or can optionally be combined with any one or more of Aspects 1-6 to include, the elongate encasing forming an airtight fit around the first and second electrode assemblies.

Aspect 8 can include, or can optionally be combined with any one or more of Aspects 1-7 to include, an accelerometer provided inside or within the encasing, the accelerometer configured to measure motion of a body to which the clutch device can be coupled and the electrical signal generator can be configured to generate a signal based on the measured motion.

Aspect 9 can include, or can optionally be combined with Aspect 8 to include, the accelerometer configured to measure a magnitude of acceleration of at least a portion of the clutch device, and the electrical signal generator can be configured to generate a signal with a magnitude and/or frequency characteristic based at least in part on the magnitude of acceleration.

Aspect 10 can include, or can optionally be combined with any one or more of Aspects 1-9 to include, a light source configured to provide light to illuminate at least a portion of the elongate encasing.

Aspect 11 can include, or can optionally be combined with Aspect 10 to include, a brightness of the light provided by the light source based on a characteristic of at least one of the first and second signals provided to the electrode assemblies.

Aspect 12 can include, or can optionally be combined with any of the preceding aspects or examples to include, a method comprising assembling an electroadhesive clutch device, the device comprising an elongate flexible encasing forming an enclosure, a first electrode assembly positioned in the enclosure, a second electrode assembly positioned in the enclosure, the second electrode distinct from the first electrode, and at least partially overlapping and configured to slide relative to the first electrode, and an electrical signal generator configured to provide first and second signals to the first and second electrode assemblies, respectively, wherein the first electrode assembly can be configured to slide laterally relative to the second electrode assembly when the first and second signals are not applied and to remain static relative to the second electrode assembly when the first and second signals are applied. The method of Aspect 12 can include securing a textile material to at least a first end of the elongate flexible encasing of the electroadhesive clutch device, the elongate flexible encasing allowing the textile material to selectively remain static or become flexible.

Aspect 13 can include, or can optionally be combined with Aspect 12 to include, the elongate flexible encasing comprising a watertight elastic material configured to provide an enclosure for the clutch device.

Aspect 14 can include, or can optionally be combined with any one or more of Aspects 12 or 13 to include, a lateral portion of the encasing having a ribbed texture.

Aspect 15 can include, or can optionally be combined with any one or more of Aspects 12-14 to include, the ribbed texture having or including a rubberized material.

Aspect 16 can include, or can optionally be combined with any one or more of Aspects 12-15 to include, a water repellant finish on an outer-facing surface of the encasing.

Aspect 17 can include, or can optionally be combined with any one or more of Aspects 12-16 to include, the first electrode assembly of the electroadhesive clutch substantially fixed relative to a first end of the elongate flexible encasing, the second electrode assembly of the electroadhesive clutch substantially fixed relative to a second end of the elongate flexible encasing, and a middle section of the elongate flexible encasing configured to move relative to the first and second electrode assemblies.

Aspect 18 can include, or can optionally be combined with any one or more of Aspects 12-17 to include, the elongate flexible encasing forming an airtight fit around the first and second electrode assemblies.

Aspect 19 can include, or can optionally be combined with any one or more of Aspects 12-18 to include, an accelerometer in or coupled to the encasing, the accelerometer configured to measure motion of a body to which the clutch device is or can be coupled, and the electrical signal generator can be configured to generate a signal based on the measured motion.

Aspect 20 can include, or can optionally be combined with Aspect 19 to include, the accelerometer configured to measure a magnitude of acceleration of at least a portion of the clutch device and the electrical signal generator can be configured to generate a signal with a magnitude and/or frequency characteristic based at least in part on the magnitude of acceleration.

Aspect 21 can include, or can optionally be combined with any of the preceding aspects or examples to include, an electroadhesive clutch device for an article of apparel, the device comprising an elongate flexible encasing forming a watertight enclosure, a first electrode assembly positioned within the watertight enclosure, a second electrode assembly, positioned within the watertight enclosure, the second electrode distinct from the first electrode, and at least partially overlapping and configured to slide relative to the first electrode, and an electrical signal generator configured to provide first and second signals to the first and second electrode assemblies, respectively, wherein the first electrode assembly can be configured to slide laterally relative to the second electrode assembly when the first and second signals are not applied and the first electrode assembly is configured to be substantially immobilized (e.g., remain in a static or non-moving position) relative to the second electrode assembly when the first and second signals are applied.

Aspect 22 can include, or can optionally be combined with Aspect 21 to include, an accelerometer positioned within the elongate flexible encasing, the accelerometer configured to measure motion of a body to which the clutch device can be coupled and the electrical signal generator can be configured to generate a signal based on the measured motion.

Aspect 23 can include, or can optionally be combined with any one or more of Aspects 21 or 22 to include, an illumination or light source configured to provide light to illuminate at least a portion of the elongate flexible encasing or a component therein.

Aspect 24 can include, or can optionally be combined with Aspect 23 to include, a driver for the light source, wherein the driver can be configured to control a magnitude or amount of the light provided by the light source based on a magnitude of at least one of the first and second signals provided by the electrical signal generator.

Various aspects of the present disclosure are directed to systems and methods for minimizing accumulation of bulk charge in an electro-adhesive actuator. For example, Aspect 25 can include, or can optionally be combined with any of the preceding aspects or examples to include, an electroadhesive clutch device comprising a first electrode assembly comprising a first conductive portion that can be at least partially covered by a first dielectric insulator, a second electrode assembly comprising a second conductive portion that can be at least partially covered by a second dielectric insulator, and an electrical signal generator configured to provide first and second signals to the first and second conductive portions of the electrode assemblies, respectively, wherein the first and second signals comprise respective opposite-polarity portions of an alternating current (AC) signal. In Aspect 25, the first and second electrode assemblies can be at least partially overlapping and configured to slide relative to each other at their respective surfaces that comprise the first and second dielectric insulators.

Aspect 26 can include, or can optionally be combined with any one or more of Aspects 25-17 to include, at least one of the first and second electrode assemblies configured to move linearly relative to the other.

Aspect 27 can include, or can optionally be combined with any one or more of Aspects 25 or 26 to include, the electrical signal generator configured to generate the AC signal as a pulse-width modulated signal with a duty cycle of about 50%.

Aspect 28 can include, or can optionally be combined with any one or more of Aspects 25-27 to include, the electrical signal generator configured to generate the AC signal as a pulse-width modulated signal having an average duty cycle of about 50%.

Aspect 29 can include, or can optionally be combined with any one or more of Aspects 25-28 to include, the AC signal having a frequency of at least about 10 Hz.

Aspect 30 can include, or can optionally be combined with Aspect 29 to include, the AC signal having a frequency that can be less than about 50 Hz.

Aspect 31 can include, or can optionally be combined with any one or more of Aspects 25-30 to include, an accelerometer configured to measure motion of a body to which the clutch device can be coupled, and the signal generator can be configured to generate the AC signal based on the measured motion.

Aspect 32 can include, or can optionally be combined with any one or more of Aspects 25-31 to include, an accelerometer configured to measure motion of the clutch device, and the signal generator can be configured to generate the AC signal based on the measured motion.

Aspect 33 can include, or can optionally be combined with Aspect 32 to include, the accelerometer configured to measure a magnitude of an acceleration of at least a portion of the clutch device, and the signal generator can be configured to generate the AC signal with a magnitude and/or frequency characteristic that depends on the measured magnitude of the acceleration.

Aspect 34 can include, or can optionally be combined with Aspect 32 to include, the accelerometer configured to measure a frequency of a change in acceleration of at least a portion of the clutch device, and the signal generator can be configured to generate the AC signal with a magnitude and/or frequency characteristic that depends on the measured frequency of the change in acceleration.

Aspect 35 can include, or can optionally be combined with any one or more of Aspects 25-34 to include, a processor circuit configured to control the signal generator to generate the AC signal based on information from an accelerometer about an acceleration of the clutch device or about an acceleration of a body with which the clutch device can be coupled.

Aspect 36 can include, or can optionally be combined with Aspect 35 to include, the accelerometer, and the processor circuit can be configured to receive an acceleration-indicating signal from the accelerometer, identify an oscillatory motion based on the acceleration-indicating signal from the accelerometer, and control the signal generator based on the oscillatory motion as-identified.

Aspect 37 can include, or can optionally be combined with Aspect 36 to include, the processor circuit configured to identify a magnitude or frequency characteristic of the oscillatory motion and, in response, update a magnitude characteristic of the AC signal to thereby update a shear force resistance characteristic of the clutch device.

Aspect 38 can include, or can optionally be combined with any one or more of Aspects 25-37 to include, a processor circuit configured to receive a clutch force indication and, in response, control the electrical signal generator to update a frequency or magnitude characteristic of the AC signal based on the clutch force indication.

Aspect 39 can include, or can optionally be combined with Aspect 38 to include, a displacement sensor configured to provide the clutch force indication based on information about a relative displacement of the first and second electrode assemblies.

Aspect 40 can include, or can optionally be combined with any of the preceding aspects or examples to include, a wearable garment with a controllably expandable and contractible portion, the wearable garment comprising a clutch device coupled to the expandable and contractible portion, the clutch device including a substantially planar first conductive portion that can be at least partially covered by a first dielectric insulator and a substantially planar second conductive portion that can be at least partially covered by a second dielectric insulator, and an electrical signal generator configured to provide first and second signals to the first and second conductive portions of the clutch device, respectively, wherein the first and second signals comprise an alternating current (AC) clutch control signal. In Aspect 40, the first and second conductive portions of the clutch device can be at least partially overlapping at respective surfaces that comprise the first and second dielectric insulators.

Aspect 41 can include, or can optionally be combined with Aspect 40 to include, a sensor configured to sense motion or an orientation of the wearable garment. In Aspect 40, the electrical signal generator can be configured to update a frequency or magnitude characteristic of the AC clutch control signal based on a sensor signal from the sensor, and the sensor signal can include information about the sensed motion or orientation of the wearable garment.

Aspect 42 can include, or can optionally be combined with any one or more of Aspects 40 or 41 to include, a displacement sensor configured to measure a change in a dimension of the expandable and contractible portion, and the electrical signal generator can be configured to update a frequency or magnitude characteristic of the AC clutch control signal based on measured change in the dimension of the expandable and contractible portion.

Aspect 43 can include, or can optionally be combined with any one or more of Aspects 40-42 to include, the electrical signal generator configured to generate the AC clutch control signal as a pulse-width modulated signal with a duty cycle of about 50%.

Aspect 44 can include, or can optionally be combined with Aspect 43 to include, the AC clutch control signal having a frequency of at least about 10 Hz and less than about 50 Hz.

Aspect 45 can include, or can optionally be combined with any of the preceding aspects or examples to include an electroadhesive clutch device comprising a first electrode assembly comprising a planar first conductive portion, a second electrode assembly comprising a planar second conductive portion, a first dielectric member provided between the first and second conductive portions, an electrical signal generator configured to provide first and second signals to the first and second conductive portions of the electrode assemblies, respectively, wherein the first and second signals comprise respective opposite-polarity portions of an alternating current (AC) clutch control signal, and the first and second electrode assemblies can be at least partially overlapping at along surfaces that comprise the first and second conductive portions.

Aspect 46 can include, or can optionally be combined with Aspect 45 to include, a device housing, wherein the first electrode assembly can be substantially fixed relative to the device housing, and wherein the second electrode assembly can be configured to move relative to the device housing and the first electrode assembly.

Aspect 47 can include, or can optionally be combined with any one or more of Aspects 45 or 46 to include, the first dielectric member coupled to the first conductive portion and provided between the first and second conductive portions of the device.

Aspect 48 can include, or can optionally be combined with Aspect 47 to include, a second dielectric member coupled to the second conductive portion and provided between the first dielectric member and the second conductive portion of the second electrode assembly.

Aspect 49 can include, or can optionally be combined with any one or more of Aspects 45-48 to include, the electrical signal generator configured to generate the AC clutch control signal as a pulse-width modulated signal with an average duty cycle of about 50%.

Aspect 50 can include, or can optionally be combined with Aspect 49 to include, the AC clutch control signal having a frequency of at least about 10 Hz and less than about 50 Hz.

Aspect 51 can include, or can optionally be combined with any one or more of Aspects 45-50 to include, an accelerometer configured to measure motion of the clutch device, and the signal generator can be configured to generate the AC clutch control signal based on the measured motion.

Various aspects of the present disclosure are directed to minimizing wear in electroadhesive actuators. For example, Aspect 52 can include, or can optionally be combined with any of the preceding aspects or examples to include, an adaptive wearable article, comprising a textile forming an opening configured to admit a body part of a wearer, and an electroadhesive clutch secured to the textile and extending around at least a portion of the opening. In Aspect 52, the electroadhesive clutch can include a first electrode assembly comprising a first conductive member and a first polymeric substrate applied to the first conductive member and having a stiffness greater than a stiffness of the first conductive member, and a second electrode assembly comprising a second conductive member overlaying in part the first conductive member, the second electrode assembly comprising a second conductive member, and a second polymeric substrate applied to the second conductive member, the second polymeric substrate having a stiffness greater than a stiffness of the second conductive member. In this example, the first and second conductive members can be proximate one another with the first and second polymeric substrates distal with respect to one another. Aspect 52 can include or use an electrical signal generator configured to provide first and second signals to the first and second conductive members of the electrode assemblies, respectively, wherein the first electrode assembly can be configured to slide laterally relative to the second electrode assembly when the first and second signals are not applied and remain static relative to the second electrode assembly when the first and second signals are applied. In Aspect 52, the electroadhesive clutch can be configured to inhibit increasing a size of the opening when the first and second signals are applied to the first and second electrode assemblies and the opening can be enabled to increase in size when the first and second signals are not applied.

Aspect 53 can include, or can optionally be combined with Aspect 52 to include, the electroadhesive clutch further comprising a waterproof encasing within which the first and second electrode assemblies are positioned.

Aspect 54 can include, or can optionally be combined with Aspect 53 to include, the waterproof encasing as an elastic waterproof encasing configured to return the first and second electrode assemblies to a relaxed position when force can be not placed on the elastic waterproof encasing.

Aspect 55 can include, or can optionally be combined with any one or more of Aspects 52-54 to include, the first polymeric substrate applied to the first conductive member with a first adhesive layer and the second polymeric substrate applied to the second conductive member with a second adhesive layer.

Aspect 56 can include, or can optionally be combined with Aspect 55 to include, the first and second polymeric substrates are polyolefin foam.

Aspect 57 can include, or can optionally be combined with Aspect 56 to include, the first and second polymeric substrates having a thickness of approximately 0.25 millimeters.

Aspect 58 can include, or can optionally be combined with any one or more of Aspects 52-57 to include, the electroadhesive clutch comprising a controller, operatively coupled to the electrical signal generator, and configured to cause the electrical signal generator to apply the first and second signals based on an input as received.

Aspect 59 can include, or can optionally be combined with Aspect 58 to include, the electroadhesive clutch comprising a sensor, operatively coupled to the controller, configured to output a sensor signal based on a detected condition of the adaptive article of apparel and the controller configured to receive the sensor signal as the input.

Aspect 60 can include, or can optionally be combined with Aspect 59 to include, the sensor as being at least one of an accelerometer, a gyro, or a pressure sensor.

Aspect 61 can include, or can optionally be combined with any one or more of Aspects 52-17 to include, the electroadhesive clutch further comprising a user input, operatively coupled to the controller, configured to receive a command from a user and output a signal indicative of the command that can be received as the input by the controller.

Aspect 62 can include, or can optionally be combined with any of the preceding aspects or examples to include, a method of making an adaptive wearable article, comprising forming a textile to include an opening configured to admit a body part of a wearer, and securing an electroadhesive clutch to the textile and extending around at least a portion of the opening. In an example, the electroadhesive clutch includes a first electrode assembly comprising a first conductive member, and a first polymeric substrate applied to the first conductive member and having a stiffness greater than a stiffness of the first conductive member, and a second electrode assembly comprising a second conductive member overlaying in part the first conductive member, the second electrode assembly comprising a second conductive member, and a second polymeric substrate applied to the second conductive member, the second polymeric substrate having a stiffness greater than a stiffness of the second conductive member, wherein the first and second conductive members are proximate one another with the first and second polymeric substrates distal with respect to one another. Aspect 62 can include an electrical signal generator configured to provide first and second signals to the first and second conductive members of the electrode assemblies, respectively, wherein the first electrode assembly can be configured to slide laterally relative to the second electrode assembly when the first and second signals are not applied and remain static relative to the second electrode assembly when the first and second signals are applied, and the electroadhesive clutch can be configured to inhibit increasing a size of the opening when the first and second signals are applied to the first and second electrode assemblies and the opening can be permitted or enabled to increase in size when the first and second signals are not applied.

Aspect 63 can include, or can optionally be combined with Aspect 62 to include, the electroadhesive clutch further comprising a waterproof encasing within which the first and second electrode assemblies are positioned.

Aspect 64 can include, or can optionally be combined with Aspect 63 to include, the waterproof encasing as an elastic waterproof encasing configured to return the first and second electrode assemblies to a relaxed position when force can be not placed on the elastic waterproof encasing.

Aspect 65 can include, or can optionally be combined with any one or more of Aspects 62-64 to include, the first polymeric substrate applied to the first conductive member with a first adhesive layer and the second polymeric substrate can be applied to the second conductive member with a second adhesive layer.

Aspect 66 can include, or can optionally be combined with Aspect 65 to include, the first and second polymeric substrates as including polyolefin foam.

Aspect 67 can include, or can optionally be combined with Aspect 66 to include, the first and second polymeric substrates having a thickness of approximately 0.25 millimeters.

Aspect 68 can include, or can optionally be combined with any one or more of Aspects 62-67 to include, the electroadhesive clutch comprising a controller, operatively coupled to the electrical signal generator, and configured to cause the electrical signal generator to apply the first and second signals based on an input as received.

Aspect 69 can include, or can optionally be combined with Aspect 68 to include, the electroadhesive clutch further comprising a sensor, operatively coupled to the controller, configured to output a sensor signal based on a detected condition of the adaptive article of apparel and the controller configured to receive the sensor signal as the input.

Aspect 70 can include, or can optionally be combined with Aspect 62 to include, the sensor being at least one of an accelerometer, a gyro, or a pressure sensor.

Aspect 71 can include, or can optionally be combined with any one or more of Aspects 62-70 to include, the electroadhesive clutch comprising a user input, operatively coupled to the controller, configured to receive a command from a user and output a signal indicative of the command that can be received as the input by the controller.

Various aspects of the present disclosure are directed to electroadhesive systems for use in apparel. For example, Aspect 72 can include, or can optionally be combined with any of the preceding aspects or examples to include, a support garment for a wearer, comprising a textile layer forming a supportive region configured to adjustably inhibit displacement of a body part of the wearer positioned proximate the supportive region, and a hollow strap affixed to a portion of the textile layer. In Aspect 72, the hollow strap encases an electroadhesive clutch device having a first electrode assembly, a second electrode assembly distinct from the first electrode assembly at least partially overlapping and configured to slide laterally relative to the first electrode assembly and an electrical signal generator to provide one or more signals to the first and second electrode assemblies. In Aspect 72, the electroadhesive clutch device can be configured to selectively adjust an amount by which the support garment allows displacement of the body part proximate the supportive region.

Aspect 73 can include, or can optionally be combined with Aspect 72 to include the support garment as a sports bra and the supportive region as a cup of the sports bra.

Aspect 74 can include, or can optionally be combined with Aspect 73 to include the hollow strap comprising a first hollow strap, the electroadhesive clutch as a first electroadhesive clutch, and the cup as a first cup, and the support garment can include a second hollow strap affixed to a second portion of the textile layer forming a second supportive region, the second hollow strap encasing a second electroadhesive clutch device and the second supportive region as a second cup of the sports bra.

Aspect 75 can include, or can optionally be combined with Aspect 74 to include, each of the first and second hollow straps being individually controllable to selectively clutch or tighten and relax or disengage.

Aspect 76 can include, or can optionally be combined with Aspect 74 to include a signal generator, the signal generator configured to provide one or more electrical signals to the first and second electroadhesive clutches.

Aspect 77 can include, or can optionally be combined with Aspect 76 to include, the first clutch and the second clutch selectively adjusting an amount by which the support garment allows displacement of the body part at substantially the same time as each other.

Aspect 78 can include, or can optionally be combined with any one or more of Aspects 72-77 to include, the support garment as an athletic supporter, wherein the hollow strap can be a right hollow strap affixed to a right side of the textile layer forming the supportive region, the support garment can further include a left hollow strap affixed to a left side of the textile layer forming the supportive region, and the right and left hollow straps can be configured to selectively inhibit displacement of the body part of the wearer.

Aspect 79 can include, or can optionally be combined with Aspect 78 to include, a displacement sensor for each of the first and second hollow straps, configured to measure a change in the strap when the strap tightens and/or relaxes.

Aspect 80 can include, or can optionally be combined with any one or more of Aspects 72-79 to include, the first and second electrode assemblies partially overlapping at their respective surfaces.

Aspect 81 can include, or can optionally be combined with any one or more of Aspects 72-80 to include, a signal generator configured to provide one or more signals to the electroadhesive clutch to selectively clutch or tighten and relax.

Aspect 82 can include, or can optionally be combined with any one or more of Aspects 72-81 to include, an accelerometer configured to measure motion of the electroadhesive clutch and generate one or more signals based on the measured motion.

Aspect 83 can include, or can optionally be combined with Aspect 82 to include, the support garment configured to tighten when the wearer can be at an acceleration rate higher than a threshold and relax when the wearer can be at an acceleration rate lower than the threshold. That is, Aspect 83 can include the clutch device configured to immobilize the first and second electrode assemblies when the motion as-measured indicates the wearer exceeds a threshold acceleration and is otherwise configured to allow motion of one or both of the first and second electrode assemblies.

Aspect 84 can include, or can optionally be combined with any one or more of Aspects 72-83 to include, the first and second hollow straps as waterproof encasings.

Aspect 85 can include, or can optionally be combined with any of the preceding aspects or examples to include, a method, comprising forming a textile layer of a support garment having a supportive region, and forming a hollow strap to be affixed to a portion of the textile layer, the hollow strap encasing an electroadhesive clutch device having a substantially planar first conductive portion and a substantially planar second conductive portion, the electroadhesive clutch device selectively inhibiting or allowing motion of the supportive region relative to a body portion of a wearer of the textile layer.

Aspect 86 can include, or can optionally be combined with Aspect 85 to include, the support garment as a sports bra and the supportive region as a cup of the sports bra.

Aspect 87 can include, or can optionally be combined with Aspect 86 to include, the hollow strap as a first hollow strap and the electroadhesive clutch as a first electroadhesive clutch, and the support garment can include a second hollow strap affixed to a second portion of the textile layer, the second hollow strap encasing a second electroadhesive clutch device having a substantially planar first conductive portion and a substantially planar second conductive portion.

Aspect 88 can include, or can optionally be combined with Aspect 87 to include, a signal generator, the signal generator configured to provide one or more electrical signals to the first and second electroadhesive clutches.

Aspect 89 can include, or can optionally be combined with Aspect 88 to include, the first clutch and the second clutch configured to selectively tighten and relax at substantially, concurrently, that is, at the same time as each other. That is, the first and second clutch devices can be configured to actuate or disengage substantially concurrently.

Aspect 90 can include, or can optionally be combined with any one or more of Aspects 85-89 to include, the support garment as an athletic supporter, the hollow strap as a right hollow strap affixed to a right side of the textile layer forming the supportive region, and the support garment can further comprise a left hollow strap affixed to a left side of the textile layer forming the supportive region, the right and left hollow straps configured to selectively inhibit displacement of the body part of the wearer.

Aspect 91 can include, or can optionally be combined with any one or more of Aspects 85-90 to include, an accelerometer configured to measure an acceleration rate of the electroadhesive clutch and the support garment can be configured to tighten when the wearer is at an acceleration rate higher than a threshold and to relax when the wearer is at an acceleration rate lower than the threshold. In other words, Aspect 91 can include measuring an acceleration of the body portion, and the electroadhesive clutch device can be configured to actuate when the acceleration as-measured is greater than a threshold acceleration and is otherwise configured to disengage.

Aspect 92 can include, or can optionally be combined with any one or more of Aspects 85-91 to include, actuating an electroluminescent portion of the clutch device in coordination with the selective tightening and relaxing of the supportive region.

Aspect 93 can include, or can optionally be combined with any of the preceding aspects or examples to include, an article of apparel, comprising a modular panel for selectively coupling to a support garment, the modular panel including an electroadhesive clutch device having a first electrode assembly, a second electrode assembly distinct from the first electrode assembly at least partially overlapping and configured to slide laterally relative to the first electrode assembly and an electrical signal generator configured to provide one or more signals to the first and second electrode assemblies, the electroadhesive clutch device configured to selectively adjust an amount by which the support garment allows displacement of the body part proximate the supportive region when coupled to the support garment.

Aspect 94 can include, or can optionally be combined with Aspect 93 to include, the modular panel further comprises an accelerometer configured to measure an acceleration of the electroadhesive clutch, and the clutch device can be configured to actuate based on a relationship between the acceleration as-measured and a specified threshold acceleration.

Aspect 95 can include, or can optionally be combined with any one or more of Aspects 93 or 94 to include, the electroadhesive clutch device comprises an electroluminescent component that can be configured to illuminate in coordination with actuation of the clutch device.

Aspect 96 can include, or can optionally be combined with any of the preceding aspects or examples to include, a modular device for use with an article of apparel, the device comprising an interface configured to mechanically couple with a corresponding interface on the article of apparel, and an electroadhesive clutch device having a first electrode assembly, a second electrode assembly distinct from the first electrode assembly at least partially overlapping and configured to slide laterally relative to the first electrode assembly, and an electrical signal generator configured to provide one or more signals to the first and second electrode assemblies.

Aspect 97 can include, or can optionally be combined with Aspect 96 to include, the interface of the modular device including a hook-and-loop fastener to couple the modular device with the article of apparel.

Aspect 98 can include, or can optionally be combined with any one or more of Aspects 96 or 97 to include, the interface of the modular device including one or more magnetic fasteners to couple the modular device with the article of apparel.

Aspect 99 can include, or can optionally be combined with any one or more of Aspects 96-98 to include, the electroadhesive clutch device configured to selectively control an amount by which the article of apparel allows displacement of a wearer's appendage in a supportive region of the article of apparel when the interface of the modular device is coupled to the corresponding interface on the article of apparel.

Aspect 100 can include, or can optionally be combined with Aspect 99 to include, an accelerometer, and the clutch device can be configured to selectively actuate in response to information from the accelerometer.

Aspect 101 can include, or can optionally be combined with any of the preceding aspects or examples to include, an article of apparel comprising a support portion configured to support an appendage of a user, a band portion, coupled to the support portion and configured to be worn about a waist or a torso of the user, an extensible member coupled to the support portion and to the band portion, and an interface configured to couple a clutch device to the extensible member.

Aspect 102 can include, or can optionally be combined with Aspect 101 to include, the support portion configured to receive and support a chest (e.g., breast tissue) of the user.

Aspect 103 can include, or can optionally be combined with any one or more of Aspects 101 or 102 to include, the support portion configured to receive and support a crotch region (e.g., penis or testicle) of the user.

Aspect 104 can include, or can optionally be combined with any one or more of Aspects 101-103 to include, the extensible member further configured to retract.

Aspect 105 can include, or can optionally be combined with any one or more of Aspects 101-104 to include, the interface comprising a hook portion or a loop portion of a hook-and-loop type fastener.

Various aspects of the present disclosure are directed to apparel fit or form. For example, Aspect 106 can include, or can optionally be combined with any of the preceding aspects or examples to include, an adaptive article of apparel comprising a textile forming an opening configured to admit a body part of a wearer, and an electroadhesive clutch secured to the textile and extending around at least a portion of the opening. The electroadhesive clutch can include a first electrode assembly comprising a first conductive member, a second electrode assembly comprising a second conductive member overlaying in part the first conductive member, and an electrical signal generator configured to provide first and second signals to the first and second conductive members of the electrode assemblies, respectively. Aspect 106, the first electrode assembly can be configured to slide laterally relative to the second electrode assembly when the first and second signals are not applied and remain static relative to the second electrode assembly when the first and second signals are applied. In Aspect 106, the electroadhesive clutch can be configured to inhibit increasing a size of the opening when the first and second signals are applied to the first and second electrode assemblies and the opening can be enabled to increase in size when the first and second signals are not applied. Stated differently, the first electrode assembly can be configured to slide laterally relative to the second electrode assembly when the first and second signals are absent and the first electrode assembly can be configured to be laterally immobilized relative to the second electrode assembly when the first and second signals are applied. The electroadhesive clutch can be used or configured to help inhibit or resist changing a size of the opening when the first and second signals are applied to the first and second electrode assemblies, and a size of the opening can be adjustable when the first and second signals are absent or removed.

Aspect 107 can include, or can optionally be combined with Aspect 106 to include, the electroadhesive clutch comprising a waterproof encasing within which the first and second electrode assemblies are positioned.

Aspect 108 can include, or can optionally be combined with Aspect 107 to include, the waterproof encasing as an elastic waterproof encasing configured to return the first and second electrode assemblies to a relaxed position when force can be not placed on the elastic waterproof encasing.

Aspect 109 can include, or can optionally be combined with any one or more of Aspects 106-108 to include, the textile as a waterproof textile and the textile can be configured to form a watertight seal around the first and second electrode assemblies.

Aspect 110 can include, or can optionally be combined with Aspect 109 to include, the textile as an elastic textile configured to return the first and second electrode assemblies to a relaxed or biased position when force is not placed or exerted on the textile.

Aspect 111 can include, or can optionally be combined with any one or more of Aspects 106-110 to include, the electroadhesive clutch further comprising a controller, operatively coupled to the electrical signal generator, configured to cause the electrical signal generator to apply the first and second signals based on an input as received.

Aspect 112 can include, or can optionally be combined with Aspect 111 to include, the electroadhesive clutch further comprising a sensor, operatively coupled to the controller, configured to output a sensor signal based on a detected condition of the adaptive article of apparel and the controller can be configured to receive the sensor signal as the input.

Aspect 113 can include, or can optionally be combined with Aspect 112 to include, the sensor as at least one of an accelerometer, a gyro, or a pressure sensor.

Aspect 114 can include, or can optionally be combined with any one or more of Aspects 111-113 to include, the electroadhesive clutch further comprising a user input, operatively coupled to the controller, configured to receive a command from a user and output a signal indicative of the command that can be received as the input by the controller.

Aspect 115 can include, or can optionally be combined with any one or more of Aspects 106-114 to include, the adaptive article of apparel as a hat.

Aspect 116 can include, or can optionally be combined with any one or more of Aspects 106-115 to include, the adaptive article of apparel as a sleeve configured to be worn around an arm or leg of the wearer.

Aspect 117 can include, or can optionally be combined with any one or more of Aspects 106-116 to include, the opening comprises an opening or aperture portion of a pocket that is in or coupled to the article of apparel.

Aspect 118 can include, or can optionally be combined with any of the preceding aspects or examples to include a method comprising forming a textile having an opening configured to admit a body part of a wearer, and securing an electroadhesive clutch to the textile, the electroadhesive clutch extending around at least a portion of the opening. In Aspect 118, the electroadhesive clutch can include at least a first electrode assembly comprising a first conductive member, a second electrode assembly comprising a second conductive member overlaying in part the first conductive member, an electrical signal generator configured to provide first and second signals to the first and second conductive members of the electrode assemblies, respectively, wherein the first electrode assembly can be configured to slide laterally relative to the second electrode assembly when the first and second signals are not applied and remain static relative to the second electrode assembly when the first and second signals are applied, and the electroadhesive clutch can be configured to inhibit increasing a size of the opening when the first and second signals are applied to the first and second electrode assemblies and the opening can be enabled to increase in size when the first and second signals are not applied.

Aspect 119 can include, or can optionally be combined with Aspect 118 to include, the electroadhesive clutch further comprising a waterproof encasing within which the first and second electrode assemblies are or can be positioned.

Aspect 120 can include, or can optionally be combined with Aspect 119 to include, the waterproof encasing as an elastic waterproof encasing configured to return the first and second electrode assemblies to a relaxed position when force is disengaged or not placed on the elastic waterproof encasing.

Aspect 121 can include, or can optionally be combined with any one or more of Aspects 118-120 to include, the textile as a waterproof textile and the textile can be configured to form a watertight seal around the first and second electrode assemblies.

Aspect 122 can include, or can optionally be combined with Aspect 121 to include, the textile as an elastic textile configured to return the first and second electrode assemblies to a relaxed position when force is disengaged or not placed on the textile.

Aspect 123 can include, or can optionally be combined with any one or more of Aspects 118-122 to include, the electroadhesive clutch further comprising a controller, operatively coupled to the electrical signal generator, configured to cause the electrical signal generator to apply the first and second signals based on an input as received.

Aspect 124 can include, or can optionally be combined with Aspect 123 to include, the electroadhesive clutch further comprising a sensor, operatively coupled to the controller, configured to output a sensor signal based on a detected condition of the adaptive article of apparel and the controller configured to receive the sensor signal as the input.

Aspect 125 can include, or can optionally be combined with Aspect 124 to include, the sensor as at least one of an accelerometer, a gyroscope, or a pressure sensor.

Aspect 126 can include, or can optionally be combined with any one or more of Aspects 124 or 125 to include, the electroadhesive clutch further comprising a user input, operatively coupled to the controller, configured to receive a command from a user and output a signal indicative of the command that can be received as the input by the controller.

Aspect 127 can include, or can optionally be combined with any of the preceding aspects or examples to include, a garment comprising a garment base layer, a pocket portion at least partially affixed to the garment base layer, the pocket portion including a pocket aperture at a first edge of the pocket portion, and an electroadhesive clutch assembly comprising first and second electrodes, wherein the first electrode can be coupled at or near the pocket aperture at the first edge of the pocket portion, and the second electrode can be coupled to the garment base layer, and wherein the first and second electrodes can be configured to selectively close, and retain in a closed or sealed positioned, the pocket aperture in accordance with actuation of the electroadhesive clutch assembly.

Aspect 128 can include, or can optionally be combined with Aspect 127 to include, a controller for the electroadhesive clutch assembly, and the controller can be configured to provide respective electric signals to the first and second electrodes to thereby control the clutch assembly.

Aspect 129 can include, or can optionally be combined with Aspect 128 to include, an accelerometer, wherein the controller can be configured to provide the respective electric signals to the first and second electrodes based on information from the accelerometer.

Aspect 130 can include, or can optionally be combined with Aspect 129 to include, the accelerometer configured to measure orientation or posture information about a wearer of the garment, and the controller can be configured to provide the respective electric signals to the first and second electrodes based on the orientation or posture information as-measured using the accelerometer.

Aspect 131 can include, or can optionally be combined with Aspect 129 to include, the accelerometer configured to measure activity level information about a wearer of the garment, and the controller can be configured to provide the respective electric signals to the first and second electrodes based on the activity level information as-measured using the accelerometer.

Various aspects of the present disclosure are directed to selectively vented apparel. For example, Aspect 132 can include, or can optionally be combined with any of the preceding aspects or examples to include, an article of apparel, the article comprising an aperture in the article of apparel, an electroadhesive clutch device coupled with or integrated into the article of apparel and configured to selectively open and close the aperture in the article of apparel, and an electric signal generator configured to send, to the clutch device, one or more signals to selectively open and/or close the aperture.

Aspect 133 can include, or can optionally be combined with Aspect 132 to include, the electroadhesive clutch device configured to open the aperture to allow airflow through the flexible aperture. For example, electrodes of the electroadhesive clutch device can be configured to disengage to thereby open the aperture and allow airflow therethrough.

Aspect 134 can include, or can optionally be combined with Aspect 132 or 133 to include, a flap to cover the aperture, the flap coupled to the electroadhesive clutch device and configured to selectively cover and uncover the aperture.

Aspect 135 can include, or can optionally be combined with Aspect 134 to include, a manual affixation mechanism to physically couple the flap over the aperture.

Aspect 136 can include, or can optionally be combined with Aspect 134 to include, the aperture as a first aperture of a plurality of apertures and the flap as a first flap of a plurality of flaps, the first flap corresponding to the first aperture.

Aspect 137 can include, or can optionally be combined with Aspect 136 to include, a temperature sensor coupled to the electroadhesive clutch device, and the flap can be configured to cover the aperture when a wearer of the article has a temperature less than a threshold temperature and to uncover the aperture when the wearer has a temperature greater than the threshold temperature.

Aspect 138 can include, or can optionally be combined with Aspect 136 to include, each aperture of the plurality of apertures having a corresponding flap of the plurality of flaps, and each flap having a corresponding electroadhesive clutch device.

Aspect 139 can include, or can optionally be combined with any one or more of Aspects 132-138 to include, the article as a lower-body apparel item and can include a right leg panel and a left leg panel having an elongated vertical aperture traversing a lower portion of the right and left leg panels.

Aspect 140 can include, or can optionally be combined with any one or more of Aspects 132-139 to include, the aperture being horizontally oriented and extending laterally across the article of apparel.

Aspect 141 can include, or can optionally be combined with any one or more of Aspects 132-140 to include, the article of apparel as an upper-body apparel item including an upper back panel having an elongated horizontal aperture traversing a backside of the upper-body and a corresponding elongated horizontal flap.

Aspect 142 can include, or can optionally be combined with any one or more of Aspects 132-141 to include, a temperature sensor coupled to the electroadhesive clutch device, the electroadhesive clutch device configured to selectively open and close the aperture based on a temperature of a wearer of the article.

Aspect 143 can include, or can optionally be combined with any one or more of Aspects 132-142 to include, the electroadhesive clutch device having a first and a second electrode assembly, the electrical signal generator configured to provide first and second signals to the first and second electrode assemblies, respectively, and the first and second signals are opposite-polarity components of an alternating current clutch control signal.

Aspect 144 can include, or can optionally be combined with any of the preceding aspects or examples to include, a method, comprising forming an aperture in an article of apparel, integrating an electroadhesive clutch device into the article of apparel, the electroadhesive clutch configured to selectively open and close the aperture in the article of apparel, and integrating an electric signal generator into the article of apparel, the electric signal generator configured to send one or more signals to the clutch device to selectively open and/or close the aperture.

Aspect 145 can include, or can optionally be combined with Aspect 144 to include, the electroadhesive clutch device configured for opening the aperture and allowing airflow through the aperture.

Aspect 146 can include, or can optionally be combined with any one or more of Aspects 144 or 145 to include, forming a flap for covering the aperture, the flap coupled to the electroadhesive clutch device and configured for selectively covering and uncovering the aperture.

Aspect 147 can include, or can optionally be combined with Aspect 146 to include, integrating a temperature sensor to be coupled to the electroadhesive clutch device, and the flap configured to cover the aperture when a wearer of the article has a temperature that is less than a threshold temperature and to uncover the aperture when the wearer has a temperature greater than the threshold temperature.

Aspect 148 can include, or can optionally be combined with any one or more of Aspects 144-147 to include, the aperture as horizontally oriented and extending laterally across the article of apparel.

Aspect 149 can include, or can optionally be combined with any one or more of Aspects 144-148 to include, the electroadhesive clutch device having a first and a second electrode assembly, and the electrical signal generator configured to provide first and second signals to the first and second electrode assemblies, respectively, the first and second signals being opposite-polarity portions of an alternating current electroadhesive clutch control signal.

Aspect 150 can include, or can optionally be combined with any one or more of Aspects 144-149 to include, the article as a lower-body apparel item and can include a right leg and a left leg panel having an elongated vertical aperture traversing a lower portion of the right and left leg panels.

Aspect 151 can include, or can optionally be combined with Aspect 146 to include, a manual affixation mechanism to physically couple the flap over the aperture.

Various aspects of the present disclosure are directed to isolation of electroadhesive or electrostatic devices in apparel. For example, Aspect 152 can include, or can optionally be combined with any of the preceding aspects or examples to include, an electrode device for an electroadhesive clutch, the electrode device comprising a planar conductive member, and a housing that encloses at least a portion of the conductive member, wherein the housing can include a flexible polymeric substrate provided adjacent to at least a first surface of the conductive member, and a dielectric member comprising a first portion provided adjacent to an opposite second surface of the conductive member, and a second portion provided adjacent to a first side edge of the conductive member and coupled to the flexible polymeric substrate.

Aspect 153 can include, or can optionally be combined with Aspect 152 to include, the dielectric member comprising a third portion provided adjacent to a second side edge, opposite to the first side edge, of the conductive member and coupled to the flexible polymeric substrate.

Aspect 154 can include, or can optionally be combined with Aspects 152 or 153 to include, the polymeric substrate coupled to the first side edge of the conductive member.

Aspect 155 can include, or can optionally be combined with any one or more of Aspects 152-154 to include, the planar conductive member comprising a metal deposited on the polymeric substrate, and the dielectric member can include a substantially non-electrically-conductive material deposited on the metal.

Aspect 156 can include, or can optionally be combined with any one or more of Aspects 152-155 to include, the dielectric member comprising an elastic dielectric ink having an electrical permittivity that can be greater than the permittivity of air.

Aspect 157 can include, or can optionally be combined with any one or more of Aspects 152-156 to include, a thickness of the dielectric member adjacent to the first surface of the conductive member can be less than about 30 micrometers.

Aspect 158 can include, or can optionally be combined with any one or more of Aspects 152-157 to include, the housing having a conductive pass-through provided in a portion of the polymeric substrate or the dielectric member, and the housing can be configured to hermetically isolate the conductive member.

Aspect 159 can include, or can optionally be combined with any one or more of Aspects 152-158 to include, the dielectric member comprising a flexible dielectric material.

Aspect 160 can include, or can optionally be combined with any one or more of Aspects 152-159 to include, a smoothing agent provided on the dielectric member-side of the housing, wherein the smoothing agent can be configured to reduce a coefficient of friction characteristic of the housing.

Aspect 161 can include, or can optionally be combined with any one or more of Aspects 152-160 to include, the housing and the conductive member as flexible or compliant members.

Aspect 162 can include, or can optionally be combined with any of the preceding aspects or examples to include, an electroadhesive clutch device comprising a first electrode assembly comprising a first conductive portion that can be at least partially covered by a first dielectric insulator, and a second electrode assembly comprising a second conductive portion that can be at least partially covered by a second dielectric insulator, wherein the first and second conductive portions have different widths, and wherein the first and second electrode assemblies can be at least partially overlapping at their respective surfaces that comprise the first and second dielectric insulators, and the first electrode assembly can be movable relative to the second electrode assembly in a length direction of the first conductive portion.

Aspect 163 can include, or can optionally be combined with Aspect 162 to include, a clutch frame, wherein the second electrode assembly can be immobilized relative to the clutch frame, and the first electrode assembly can be movable relative to the clutch frame.

Aspect 164 can include, or can optionally be combined with Aspects 162 or 163 to include, the first and second conductive portions having different surface area characteristics.

Aspect 165 can include, or can optionally be combined with any one or more of Aspects 162-164 to include, a first planar surface of the first conductive portion can be aligned parallel to and overlapping with a second planar surface of the second conductive portion.

Aspect 166 can include, or can optionally be combined with any one or more of Aspects 162-165 to include, the first electrode assembly movable relative to the second electrode assembly in a width direction of the first conductive portion.

Aspect 167 can include, or can optionally be combined with Aspect 166 to include, a clutch frame configured to couple the first and second electrode assemblies such that the conductive portions are parallel and at least partially overlapping.

Aspect 168 can include, or can optionally be combined with Aspect 167 to include, an elastic tensioner coupling the clutch frame and the first electrode assembly, wherein the elastic tensioner can be configured to bias the first and second electrode assemblies into surface contact at the surfaces that comprise the first and second dielectric insulators.

Aspect 169 can include, or can optionally be combined with any one or more of Aspects 162-168 to include, an electrical signal generator configured to provide first and second signals to the first and second conductive portions of the electrode assemblies, respectively, wherein the first and second signals comprise respective portions of an alternating current (AC) clutch control signal, and in response to the first and second signals, an attractive electroadhesive force can be developed between the first and second electrode assemblies.

Aspect 170 can include, or can optionally be combined with any of the preceding aspects or examples to include, an electrode device for an electroadhesive clutch, the electrode device comprising a first substrate, an electrically-conductive first trace disposed on the flexible substrate, the first trace having a height, a width, and a length, and a dielectric member disposed on the conductive trace opposite the substrate, wherein at least a portion of the dielectric member extends over a side edge of the first trace and can be coupled with the flexible substrate.

Aspect 171 can include, or can optionally be combined with Aspect 170 to include, the first substrate comprising a thin-film polymeric substrate.

Aspect 172 can include, or can optionally be combined with Aspects 170 or 171 to include, the dielectric member extending over multiple sides of and encapsulating at least a portion of the first trace against the first substrate.

Aspect 173 can include, or can optionally be combined with Aspect 172 to include, a conductive passthrough that is electrically coupled to an external clutch signal driver and to the first trace, wherein the conductive passthrough provides an electrical signal path through the first substrate or through the dielectric member.

Aspect 174 can include, or can optionally be combined with any one or more of Aspects 170-173 to include, the dielectric member comprising a dielectric ink deposited on the first trace and on a surface of the first substrate.

Aspect 175 can include, or can optionally be combined with any one or more of Aspects 170-174 to include, the dielectric member comprising a dielectric polymer printed on the first trace and on a surface of the first substrate.

Aspect 176 can include, or can optionally be combined with any one or more of Aspects 170-175 to include, a permittivity of the dielectric member can be greater than the permittivity of air.

Aspect 177 can include, or can optionally be combined with any one or more of Aspects 170-176 to include, a permittivity of the dielectric member can be less than the permittivity of air.

Aspect 178 can include, or can optionally be combined with any one or more of Aspects 170-177 to include, a thickness of the dielectric member adjacent to the first trace can be less than about 30 micrometers.

Aspect 179 can include, or can optionally be combined with any one or more of Aspects 170-178 to include, a polymeric smoothing agent provided on the dielectric member opposite the first trace.

Various aspects of the present disclosure are directed to using electroadhesive devices, or components thereof, with textiles and other materials. For example, Aspect 180 can include, or can optionally be combined with any of the preceding aspects or examples to include, a wearable article, comprising a textile configured to be worn by a wearer, and an electroadhesive clutch secured to the textile and comprising a first electrode assembly comprising a first conductive member, a second electrode assembly comprising a second conductive member overlaying in part the first conductive member, an elastic encasing within which the first and second electrode assemblies can be positioned, the elastic encasing forming a first bond with the first conductive member at a first location of the elastic encasing and a second bond with the second conductive member proximate a second location of the elastic encasing different than the first location, and an electrical signal generator configured to provide first and second signals to the first and second conductive members of the electrode assemblies, respectively, wherein the first electrode assembly can be configured to slide laterally relative to the second electrode assembly when the first and second signals are not applied and remain static relative to the second electrode assembly when the first and second signals are applied. In Aspect 180, the electroadhesive clutch can be configured to inhibit increasing a size of the opening when the first and second signals are applied to the first and second electrode assemblies and wherein the opening can be enabled to increase in size when the first and second signals are not applied.

Aspect 181 can include, or can optionally be combined with Aspect 180 to include, the elastic encasing as a waterproof elastic encasing.

Aspect 182 can include, or can optionally be combined with Aspect 181 to include, the elastic waterproof encasing configured to return the first and second electrode assemblies to a relaxed position when force is removed from the elastic waterproof encasing.

Aspect 183 can include, or can optionally be combined with Aspect 182 to include, the elastic waterproof encasing can be formed at least in part from a polymer configured to form the first and second bonds with the first and second conductive members, respectively.

Aspect 184 can include, or can optionally be combined with Aspect 183 to include, the polymer as a thermoplastic polyurethane (TPU).

Aspect 185 can include, or can optionally be combined with Aspect 184 to include, the first conductive portion forms holes proximate the first location into which the first bond can be formed and the second conductive member forms holes proximate the second location into which the second bond can be formed.

Aspect 186 can include, or can optionally be combined with Aspect 185 to include, the first and second conductive members are formed from molar.

Aspect 187 can include, or can optionally be combined with any one or more of Aspects 180-186 to include, the electroadhesive clutch further comprising a controller, operatively coupled to the electrical signal generator, configured to cause the electrical signal generator to apply the first and second signals based on an input as received.

Aspect 188 can include, or can optionally be combined with any one or more of Aspects 180-187 to include, the electroadhesive clutch further comprising a sensor, operatively coupled to the controller, configured to output a sensor signal based on a detected condition of the adaptive article of apparel and the controller can be configured to receive the sensor signal as the input.

Aspect 189 can include, or can optionally be combined with Aspect 188 to include the sensor as at least one of an accelerometer, a gyro, or a pressure sensor.

Aspect 190 can include, or can optionally be combined with any of the preceding aspects or examples to include, a method of making an adaptive article of apparel, comprising forming a textile configured to be worn by a wearer, and securing an electroadhesive clutch to the textile, the electroadhesive clutch comprising a first electrode assembly comprising a first conductive member, a second electrode assembly comprising a second conductive member overlaying in part the first conductive member, an elastic encasing within which the first and second electrode assemblies are positioned, the elastic encasing forming a first bond with the first conductive member at a first location of the elastic encasing and a second bond with the second conductive member proximate a second location of the elastic encasing different than the first location, and an electrical signal generator configured to provide first and second signals to the first and second conductive members of the electrode assemblies, respectively, wherein the first electrode assembly can be configured to slide laterally relative to the second electrode assembly when the first and second signals are not applied and remain static relative to the second electrode assembly when the first and second signals are applied. In Aspect 190, the electroadhesive clutch can be configured to inhibit increasing a size of the opening when the first and second signals are applied to the first and second electrode assemblies and the opening can be enabled to increase in size when the first and second signals are not applied.

Aspect 191 can include, or can optionally be combined with Aspect 190 to include, the elastic encasing as a waterproof elastic encasing.

Aspect 192 can include, or can optionally be combined with Aspect 191 to include, the elastic waterproof encasing configured to return the first and second electrode assemblies to a relaxed position when force is removed from the elastic waterproof encasing.

Aspect 193 can include, or can optionally be combined with Aspect 192 to include, the elastic waterproof encasing formed at least in part from a polymer configured to form the first and second bonds with the first and second conductive members, respectively.

Aspect 194 can include, or can optionally be combined with Aspect 193 to include, the polymer as a thermoplastic polyurethane (TPU).

Aspect 195 can include, or can optionally be combined with Aspect 194 to include, the first conductive portion forms holes proximate the first location into which the first bond can be formed and the second conductive member forms holes proximate the second location into which the second bond can be formed.

Aspect 196 can include, or can optionally be combined with Aspect 195 to include, the first and second conductive members formed from or comprising mylar.

Aspect 197 can include, or can optionally be combined with any one or more of Aspects 190-196 to include, the electroadhesive clutch further comprising a controller, operatively coupled to the electrical signal generator, configured to cause the electrical signal generator to apply the first and second signals based on an input as received.

Aspect 198 can include, or can optionally be combined with Aspect 197 to include, the electroadhesive clutch further comprising a sensor, operatively coupled to the controller, and configured to output a sensor signal based on a detected condition of the adaptive article of apparel and the controller can be configured to receive the sensor signal as the input.

Aspect 199 can include, or can optionally be combined with Aspect 198 to include, the sensor as at least one of an accelerometer, a gyro, or a pressure sensor.

Each of these non-limiting Aspects can stand on its own, or can be combined in various permutations or combinations with one or more of the other Aspects, examples, or features discussed elsewhere herein.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B"

includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel" or "perpendicular" or "round" or "square," among others, are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible Computer-Readable Media, such as during execution or at other times. Examples of these tangible Computer-Readable Media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim, Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A wearable article, comprising:
a material formed to be worn on a body of a wearer;
an electrode device, positioned on the material such that a portion of the electroadhesive device may contact a body part of a wearer of the wearable article, the electrode device configured to operate as part of an electroadhesive clutch, the electrode device comprising:
a planar conductive member configured to electrically engage with a remote conductive member of the electroadhesive clutch to permit or inhibit a first portion of the material to move relative to a second portion of the material; and
a housing that encloses at least a portion of the conductive member and provides electrical isolation between the planar conductive member and the body part of the wearer, wherein the housing includes:
a flexible polymeric substrate provided adjacent to at least a first surface of the conductive member; and
a dielectric member comprising a first portion provided adjacent to an opposite second surface of the conductive member, and a second portion provided adjacent to a first side edge of the conductive member and coupled to the flexible polymeric substrate.

2. The wearable article of claim 1, wherein the dielectric member comprises a third portion provided adjacent to a second side edge, opposite to the first side edge, of the conductive member and coupled to the flexible polymeric substrate.

3. The wearable article of claim 1, wherein the polymeric substrate is coupled to the first side edge of the conductive member.

4. The wearable article of claim 1, wherein the planar conductive member comprises a metal deposited on the polymeric substrate, and wherein the dielectric member comprises a substantially non-electrically-conductive material deposited on the metal.

5. The wearable article of claim 1, wherein the dielectric member comprises an elastic dielectric ink having an electrical permittivity that is greater than the permittivity of air.

6. The wearable article of claim 1, wherein a thickness of the dielectric member adjacent to the first surface of the conductive member is less than about 30 micrometers.

7. The wearable article of claim 1, wherein the housing includes a conductive pass-through provided in a portion of the polymeric substrate or the dielectric member, and wherein the housing is configured to hermetically isolate the conductive member.

8. The wearable article of claim 1, wherein the dielectric member comprises a flexible dielectric material.

9. The wearable article of claim 1, further comprising a smoothing agent provided on the dielectric member-side of the housing, wherein the smoothing agent is configured to reduce a coefficient of friction characteristic of the housing.

10. The wearable article of claim 1, wherein the housing and the conductive member are flexible.

11. A wearable article, comprising:
a material formed to be worn on a body of a wearer; and
an electrode device, positioned on the material such that a portion of the electroadhesive device may contact a body part of a wearer of the wearable article, the electrode device configured to operate as part of an electroadhesive clutch, the electrode device comprising:
a flexible substrate;
an electrically-conductive first trace disposed on the flexible substrate and configured to electrically engage with a remote conductive member of the electroadhesive clutch to permit or inhibit a first portion of the material to move relative to a second portion of the material, the first trace having a height, a width, and a length; and
- a dielectric member disposed on the conductive trace opposite the flexible substrate, wherein at least a portion of the dielectric member extends over a side edge of the first trace and is coupled with the flexible substrate and provides electrical isolation between the first trace and the body part of the wearer.

12. The wearable article of claim 11, wherein the flexible substrate comprises a thin-film polymeric substrate.

13. The wearable article of claim 11, wherein the dielectric member extends over multiple sides of and encapsulates at least a portion of the first trace against the flexible substrate.

14. The wearable article of claim 13, further comprising a conductive passthrough electrically coupled to an external clutch signal driver and to the first trace, wherein the conductive passthrough provides an electrical signal path through the flexible substrate or through the dielectric member.

15. The wearable article of claim 11, wherein the dielectric member comprises a dielectric ink deposited on the first trace and on a surface of the flexible substrate.

16. The wearable article of claim 11, wherein the dielectric member comprises a dielectric polymer printed on the first trace and on a surface of the flexible substrate.

17. The wearable article of claim 11, wherein a permittivity of the dielectric member is greater than the permittivity of air.

18. The wearable article of claim 11, wherein a permittivity of the dielectric member is less than the permittivity of air.

19. The wearable article of claim 11, wherein a thickness of the dielectric member adjacent to the first trace is less than about 30 micrometers.

20. The wearable article of claim 11, further comprising a polymeric smoothing agent provided on the dielectric member opposite the first trace.

* * * * *